(12) United States Patent
Tsukamoto et al.

(10) Patent No.: US 10,680,039 B2
(45) Date of Patent: Jun. 9, 2020

(54) DISPLAY DEVICE AND MANUFACTURING METHOD THEREFOR

(71) Applicant: Sharp Kabushiki Kaisha, Sakai, Osaka (JP)

(72) Inventors: Yuto Tsukamoto, Sakai (JP); Seiichi Mitsui, Sakai (JP); Shinichi Kawato, Sakai (JP); Satoshi Inoue, Sakai (JP); Yuhki Kobayashi, Sakai (JP); Takashi Ochi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 43 days.

(21) Appl. No.: 16/095,391

(22) PCT Filed: Apr. 26, 2017

(86) PCT No.: PCT/JP2017/016462
§ 371 (c)(1),
(2) Date: Oct. 22, 2018

(87) PCT Pub. No.: WO2017/191786
PCT Pub. Date: Nov. 9, 2017

(65) Prior Publication Data
US 2019/0081112 A1  Mar. 14, 2019

(30) Foreign Application Priority Data
May 2, 2016  (JP) .................................. 2016-092464

(51) Int. Cl.
H01L 27/32 (2006.01)
H01L 51/52 (2006.01)
(Continued)

(52) U.S. Cl.
CPC ........ *H01L 27/3213* (2013.01); *H01L 27/322* (2013.01); *H01L 27/3218* (2013.01); *H01L 27/3246* (2013.01); *H01L 51/5016* (2013.01); *H01L 51/5036* (2013.01); *H01L 51/5044* (2013.01); *H01L 51/5092* (2013.01); *H01L 51/5218* (2013.01); *H01L 51/5234* (2013.01);
(Continued)

(58) Field of Classification Search
CPC ............. H01L 29/7869; H01L 27/1225; H01L 29/78696; H01L 29/66969; H01L 2251/5338
See application file for complete search history.

(56) References Cited

U.S. PATENT DOCUMENTS

2015/0311250 A1  10/2015  Seo et al.
2018/0226598 A1*  8/2018  Hosoumi ............ H01L 51/5012

FOREIGN PATENT DOCUMENTS

JP  2015-216113 A  12/2015

* cited by examiner

Primary Examiner — Tony Tran
(74) Attorney, Agent, or Firm — Keating & Bennett, LLP

(57) ABSTRACT

A blue fluorescent light-emitting layer is provided in common for first and second subpixels, a green fluorescent light-emitting layer is provided in common for second and third subpixels, and a red light-emitting layer is provided in common for the second and fourth subpixels. In the second subpixel, an opposing surface distance is less than or equal to a Förster radius, and at least of the blue fluorescent light-emitting layer and the green fluorescent light-emitting layer are layered with the red light-emitting layer with a separation layer interposed therebetween.

14 Claims, 29 Drawing Sheets

(51) Int. Cl.
*H05B 33/14* (2006.01)
*H01L 51/50* (2006.01)
*H01L 51/56* (2006.01)
*H01L 51/00* (2006.01)

(52) U.S. Cl.
CPC ...... *H01L 51/5253* (2013.01); *H01L 51/5265* (2013.01); *H01L 51/56* (2013.01); *H05B 33/145* (2013.01); *H01L 27/3216* (2013.01); *H01L 27/3244* (2013.01); *H01L 51/0067* (2013.01); *H01L 51/0072* (2013.01); *H01L 51/0085* (2013.01); *H01L 51/5056* (2013.01); *H01L 51/5072* (2013.01); *H01L 51/5096* (2013.01); *H01L 2251/533* (2013.01); *H01L 2251/5315* (2013.01); *H01L 2251/558* (2013.01)

FIG. 14A  FÖRSTER TRANSFER
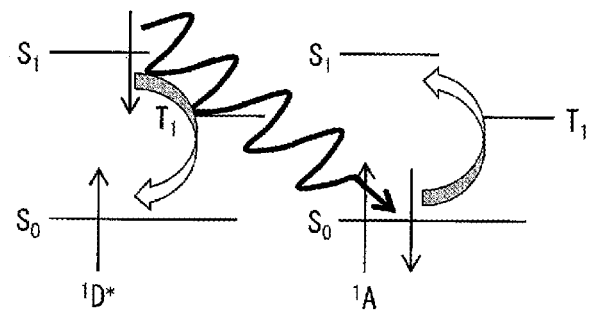
FIG. 14B  DEXTER TRANSFER
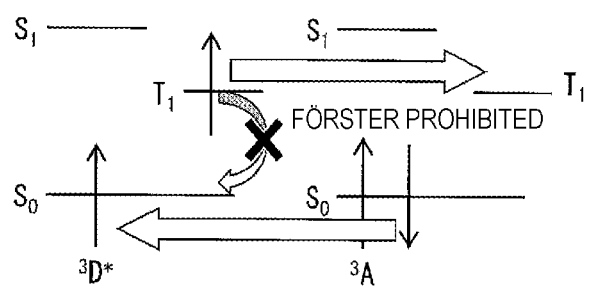
FIG. 14C  REVERSE INTERSYSTEM CROSSING
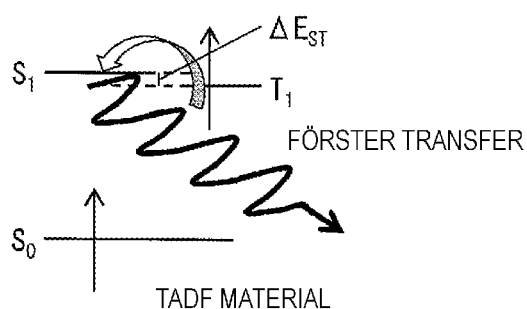

DISPLAY DEVICE AND MANUFACTURING METHOD THEREFOR

TECHNICAL FIELD

The disclosure relates to a display device and to a manufacturing method therefor.

BACKGROUND ART

In recent years, a self-luminous display device using a light emitting element (EL element) employing an electroluminescence (hereinafter referred to as "EL") phenomenon has been developed as a display device instead of a liquid crystal display device.

A display device including an EL element can emit light at low voltages. The EL element is a self-luminous element, and therefore has a wide viewing angle and high viewability. Further, the EL element is a thin film-form completely solid element, and is thus garnering attention from the viewpoint of saving space, portability, and the like.

The EL element has a configuration in which a light-emitting layer containing a luminescent material is interposed between a cathode electrode and an anode electrode. The EL element emits light by using the release of light during the deactivation of excitons that are generated by injecting electrons and holes into the light-emitting layer and causing recombination.

The light-emitting layer of an EL element is mainly formed using vapor deposition techniques, such as vacuum vapor deposition. Techniques for forming of a full-color organic EL display device using such vapor deposition can be broadly divided into a white CF (color filter) technique and a separate-patterning technique.

The white CF technique is a technique in which a white light-emitting EL element and a CF layer are combined, and a luminescent color is selected at the subpixel level.

The separate-patterning technique is a technique where separately patterning vapor deposition is carried out for each luminescent color using vapor deposition masks. Generally, subpixels constituted by red (R), green (G), and blue (B) EL elements, arranged on a substrate, are selectively caused to emit light at desired brightnesses using TFTs, and an image is displayed as a result. Banks (partitions) defining light emitting regions in the subpixels are provided between EL elements, and the light-emitting layers of the EL elements are formed in openings of the banks using a vapor deposition mask.

CITATION LIST

Patent Literature

PTL 1: JP 2015-216113 A (published Dec. 3, 2015)

SUMMARY

Technical Problem

The white CF technique has an advantage in that a high-resolution display device can be achieved without requiring a high-resolution vapor deposition mask.

However, with the white CF technique, using a color filter results in energy loss, which is problematic in that a drive voltage is used and more power is consumed. Additionally, this kind of white light-emitting EL element has many layers and requires a color filter, which is a disadvantage in that manufacturing costs are extremely high.

On the other hand, while the separate-patterning technique does provide good light emission efficiency, low voltage driving, and the like, such high-precision patterning is difficult. For example, there is a problem in that colors may bleed to neighboring pixels depending on the precision of the openings in the vapor deposition mask and the distance relationship between the vapor deposition source and the film formed substrate. Furthermore, shadow, where the vapor deposition film ends up thinner than the intended film thickness, can arise depending on the thickness of the vapor deposition mask, the deposition angle, and the like. Thus, with a display device using the separate-patterning technique, there is a problem in that the display quality drops due to color mixing, shadow, and the like caused by deposited materials infiltrating from the direction of neighboring pixels. Particularly, when another color of dopant is deposited on a neighboring pixel, even if only an extremely small amount of the other color of dopant is deposited, that dopant will, depending on the device structure, have a major influence on the EL light-emission spectrum. This can cause the colors to change.

Thus, to achieve a high-resolution display device using the separate-patterning technique, it is necessary to distance the vapor deposition source from the film formed substrate to achieve an acute deposition angle, which means it is necessary to raise the height of the vacuum chamber to accommodate this distancing.

However, manufacturing a vacuum chamber having a raised height is very expensive, and also has a poor material utilization efficiency, which leads to an increase in material costs as well.

Recent years have seen the practical use of pixel arrangements aside from the RGB stripe arrangement, such as the S-Stripe arrangement and the PenTile arrangement, for the purpose of improving the perceived resolution.

However, regardless of the pixel arrangement, it has been necessary in the past to secure a bank width of at least approximately several tens of μm between subpixels, and the resolution of known display devices using the separate-patterning technique effectively peaks at 500 pixels per inch.

With the aim of providing a light-emitting apparatus having productivity and reduced power consumption, PTL 1 discloses a light-emitting apparatus including at least an R subpixel, which includes a light-emitting element that emits red light and an optical element that transmits the red light, a G subpixel, which includes a light-emitting element that emits green light and an optical element that transmits the green light, and a B subpixel, which includes a light-emitting element that emits blue light and an optical element that transmits the blue light. In each light emitting element, a first light-emitting layer containing a first luminescent material having a spectral peak in a wavelength range of from 540 nm to 580 nm, or a second light-emitting layer containing a second luminescent material having a light-emission peak in a wavelength range of from 420 nm to 480 nm, is used in common.

The light-emitting apparatus may further include a Y subpixel which includes a light-emitting element that emits yellow (Y) light and an optical element that transmits the yellow light. The first light-emitting layer is a light-emitting layer constituted by a luminescent material that emits yellow-green, yellow, or orange light, and the second light-emitting layer is a light-emitting layer constituted by a luminescent material that emits purple, blue, or blue-green light.

In PTL 1, the light-emitting elements are used along with optical elements such as color filters, band-pass filters, multilayer film filters, and the like. The resulting optical interference effect and cutting of mixed color light by the optical elements improves the color purity.

However, in PTL 1, a common layer having a luminance peak at an intermediate color in the spectrum between two subpixels is provided as a common layer for the two subpixels. For example, a light-emitting layer having a luminescent color of yellow or orange is provided as the common layer for the G subpixel and the R subpixel. Accordingly, attempting to enhance a desired color using the optical interference effect can nevertheless result in color shifts and lead to a drop in efficiency, and it is difficult to improve the color reproduction of single colors.

In PTL 1, improving the color using an optical element provided on a counter substrate (a sealing substrate) can be considered. However, there is a tradeoff between color and light emitting efficiency. Therefore, like the white CF technique, there is a problem in that both high color purity and low power consumption cannot be achieved at the same time.

Furthermore, there is a gap between the light emitting element and the optical element, which can produce color mixing in light emitted in oblique directions. The light-emitting apparatus of PTL 1 therefore has a problem in terms of light distribution properties as well.

Having been conceived in light of the above-described problems with the related art, an object of the disclosure is to provide a display device, and a manufacturing method therefor, that can reduce a deposition margin for preventing color mixing by making color mixing less likely than in display devices using the known separate-patterning technique, thereby achieving higher resolutions more easily, and that can achieve both high color levels and low power consumption.

Solution to Problem

To solve the above-described problems, a display device according to an aspect of the disclosure includes: a plurality of pixels, each pixel including a first subpixel, a second subpixel, a third subpixel, and a fourth subpixel, herein a first light-emitting layer containing a first fluorescent luminescent material is provided in common for the first subpixel and the second subpixel, a second light-emitting layer containing a second fluorescent luminescent material is provided in common for the second subpixel and the third subpixel, and a third light-emitting layer containing a third luminescent material is provided in common for the second subpixel and the fourth subpixel; an energy level of the second fluorescent luminescent material in a minimum excited singlet state is lower than an energy level of the first fluorescent luminescent material in a minimum excited singlet state and higher than an energy level of the third luminescent material in a minimum excited singlet state; in the second subpixel, a distance between opposing surfaces of the first light-emitting layer and the second light-emitting layer is less than or equal to a Förster radius, and a separation layer that inhibits Förster-type energy transfer is layered between the third light-emitting layer and the light-emitting layer, of the first light-emitting layer and the second light-emitting layer, that is located closer to the third light-emitting layer; in the first subpixel, the first fluorescent luminescent material emits light, and the light emitted from the first fluorescent luminescent material is emitted to the exterior; in the second subpixel and the third subpixel, the second fluorescent luminescent material emits light, and the light emitted from the second fluorescent luminescent material is emitted to the exterior; in the fourth subpixel, the third luminescent material emits light, and the light emitted from the third luminescent material is emitted to the exterior; the first fluorescent luminescent material emits light having a first peak wavelength; the second fluorescent luminescent material emits light having a second peak wavelength longer than the first peak wavelength; and the third luminescent material emits light having a third peak wavelength longer than the second peak wavelength.

To solve the above-described problems, a manufacturing method for a display device according to an aspect of the disclosure is a manufacturing method for a display device, the display device including: a plurality of pixels, each pixel including a first subpixel, a second subpixel, a third subpixel, and a fourth subpixel, wherein in the first subpixel, a first fluorescent luminescent material emits light, and the light emitted from the first fluorescent luminescent material is emitted to the exterior; in the second subpixel and the third subpixel, a second fluorescent luminescent material emits light, and the light emitted from the second fluorescent luminescent material is emitted to the exterior; in the fourth subpixel, a third luminescent material emits light, and the light emitted from the third luminescent material is emitted to the exterior; the first fluorescent luminescent material emits light having a first peak wavelength; the second fluorescent luminescent material emits light having a second peak wavelength longer than the first peak wavelength; and the third luminescent material emits light having a third peak wavelength longer than the second peak wavelength, the method including: a function layer formation step of forming a plurality of function layers in each of the pixels, wherein the function layer formation step includes: a first light-emitting layer formation step of forming a first light-emitting layer containing the first fluorescent luminescent material in common for the first subpixel and the second subpixel; a second light-emitting layer formation step of forming a second light-emitting layer containing the second fluorescent luminescent material in common for the second subpixel and the third subpixel; a third light-emitting layer formation step of forming a third light-emitting layer containing the third luminescent material in common for the second subpixel and the fourth subpixel; and a separation layer formation step of forming a separation layer in the second subpixel so that in the second subpixel, so that in the second subpixel, the separation layer, which inhibits Förster-type energy transfer, is layered between the third light-emitting layer and the light-emitting layer, of the first light-emitting layer and the second light-emitting layer, that is located closer to the third light-emitting layer, and in the function layer formation step: the first light-emitting layer and the second light-emitting layer are formed so that in the second subpixel, a distance between opposing surfaces of the first light-emitting layer and the second light-emitting layer is less than or equal to the Förster radius; and a fluorescent luminescent material having an energy level in a minimum excited singlet state that is lower than an energy level of the first fluorescent luminescent material in a minimum excited singlet state and higher than an energy level of the third luminescent material in a minimum excited singlet state is used for the second fluorescent luminescent material.

Advantageous Effects of Disclosure

According to the above-described aspects of the disclosure, the first light-emitting layer is provided in common for the first subpixel and the second subpixel, the second light-emitting layer is provided in common for the second subpixel and the third subpixel, and the third light-emitting layer is provided in common for the second subpixel and the fourth subpixel. Accordingly, the first light-emitting layer, the second light-emitting layer, and the third light-emitting layer can each be linearly deposited.

Additionally, according to the above-described aspects of the disclosure, in the second subpixel, the first light-emitting layer, the second light-emitting layer, and the third light-emitting layer are layered. Although Förster-type energy transfer occurs from the first light-emitting layer to the second light-emitting layer, no Förster-type energy transfer occurs from the first light-emitting layer and the second light-emitting layer to the third light-emitting layer, and thus only the second fluorescent luminescent material emits light.

In other words, the second fluorescent luminescent material, which is the luminescent material of the second light-emitting layer, has a lower energy level in the minimum excited singlet state than the first fluorescent luminescent material, which is the luminescent material of the first light-emitting layer. Additionally, the distance between opposing surfaces of the first light-emitting layer and the second light-emitting layer is less than or equal to the Förster radius. Accordingly, even if, for example, holes and electrons have recombined in the first light-emitting layer, Förster-type energy transfer enables the second fluorescent luminescent material to emit light at substantially 100%. Additionally, the separation layer is provided between the third light-emitting layer, and the light-emitting layer, of the first light-emitting layer and the second light-emitting layer, that is located on the third light-emitting layer side. Accordingly, energy transfer from the first light-emitting layer and the second light-emitting layer to the third light-emitting layer is inhibited. Color mixing can therefore be suppressed even if the first light-emitting layer, the second light-emitting layer, and the third light-emitting layer are layered in the second subpixel.

Additionally, according to the above-described aspects of the disclosure, the first light-emitting layer, the second light-emitting layer, and the third light-emitting layer can each be linearly deposited, and in the second subpixel, color mixing does not occur easily despite a plurality of light-emitting layers being layered as described above. Accordingly, a deposition margin for preventing color mixing can be made lower than in display devices using a known separate-patterning technique. This makes it possible to realize a higher resolution more easily than in display devices using a known separate-patterning technique.

Additionally, the display device does not require a CF layer or an optical interference effect as with the white CF technique or PTL 1, despite having the above-described layered structure for the light-emitting layers. This makes it possible to avoid a situation where more power is consumed, the light distribution properties worsen, and the like. Therefore, a high color level and low power consumption can be achieved at the same time.

Thus according to the above-described aspects of the disclosure, it is possible to provide a display device that can reduce the deposition margin for preventing color mixing by making color mixing less likely than in display devices using a known separate-patterning technique, thereby achieving higher resolutions more easily, and that can achieve both high color levels and low power consumption.

Thus according to the above-described aspects of the disclosure, it is possible to provide a display device that can reduce the deposition margin for preventing color mixing by making color mixing less likely than in display devices using a known separate-patterning technique, thereby achieving higher resolutions more easily, and that can achieve both high color levels and low power consumption.

BRIEF DESCRIPTION OF DRAWINGS

FIG. 14A is a diagram illustrating Förster transfer, FIG. 14B is a diagram illustrating Dexter transfer, and FIG. 14C is a diagram illustrating a TADF material.

DESCRIPTION OF EMBODIMENTS

Hereinafter, embodiments of the disclosure will be described in detail.

First Embodiment

A description follows regarding one aspect of the disclosure, on the basis of FIGS. 1 to 10.

The following describes an organic EL display device as an example of a display device according to the present embodiment.

Overall Configuration of Organic EL Display Device

Figure 1:
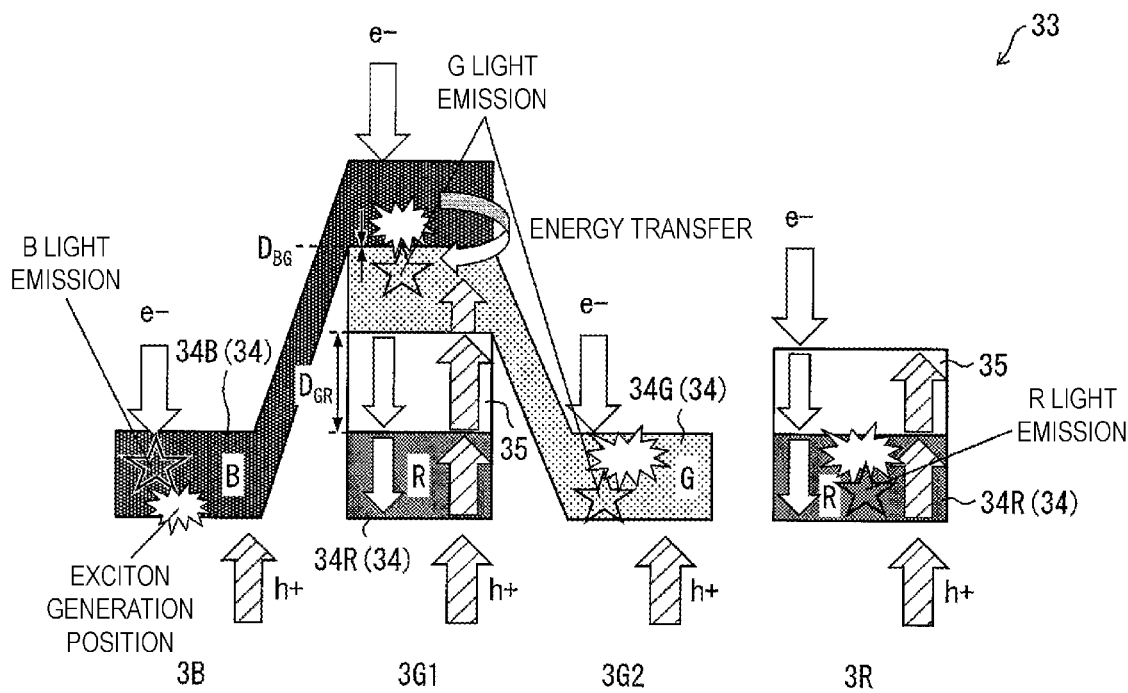
FIG. 1 is a diagram schematically illustrating the principle of light emission by a light-emitting layer unit of an organic EL display device according to a first embodiment of the disclosure.
Figure 2:
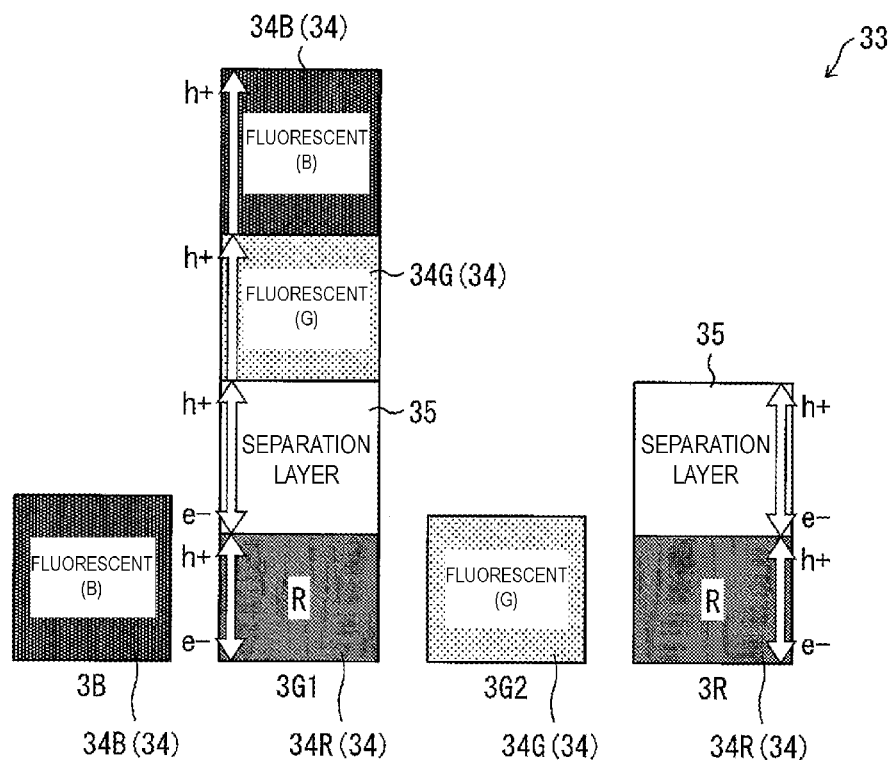
FIG. 2 is a diagram schematically illustrating a layered structure in the light-emitting layer unit of the organic EL display device according to the first embodiment of the disclosure.
Figure 3:
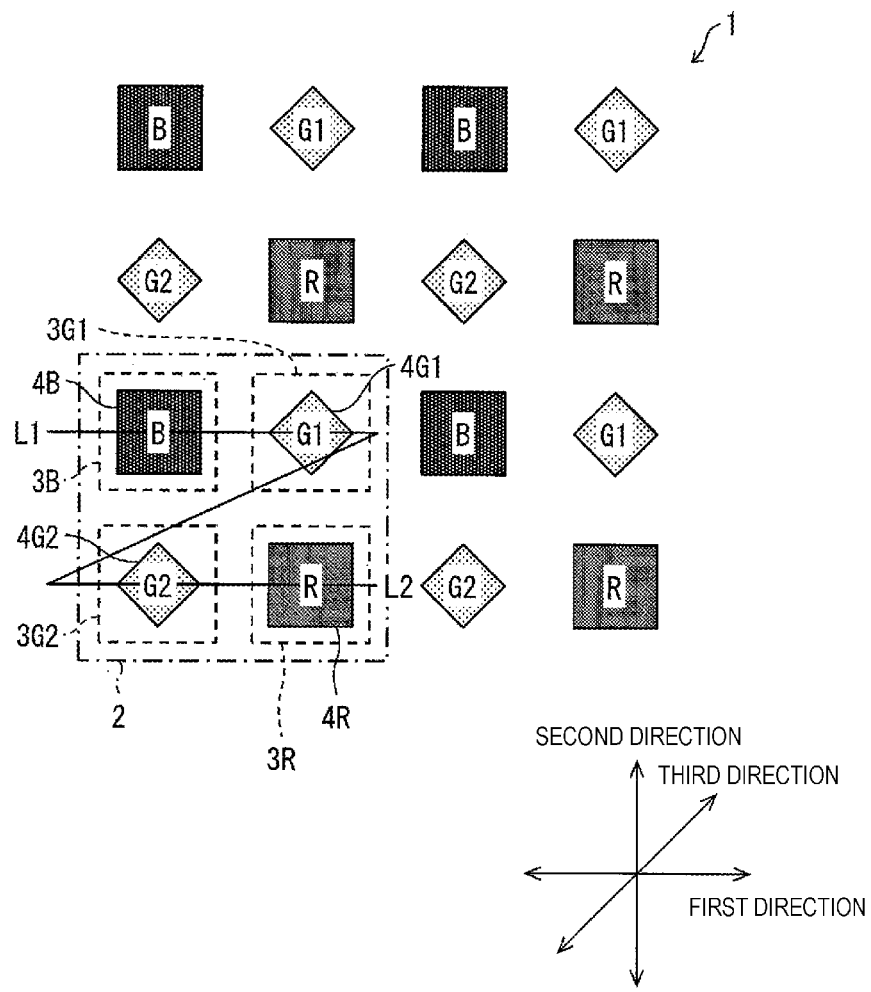
FIG. 3 is a diagram schematically illustrating a pixel arrangement in the organic EL display device according to the first embodiment of the disclosure.
Figure 4:
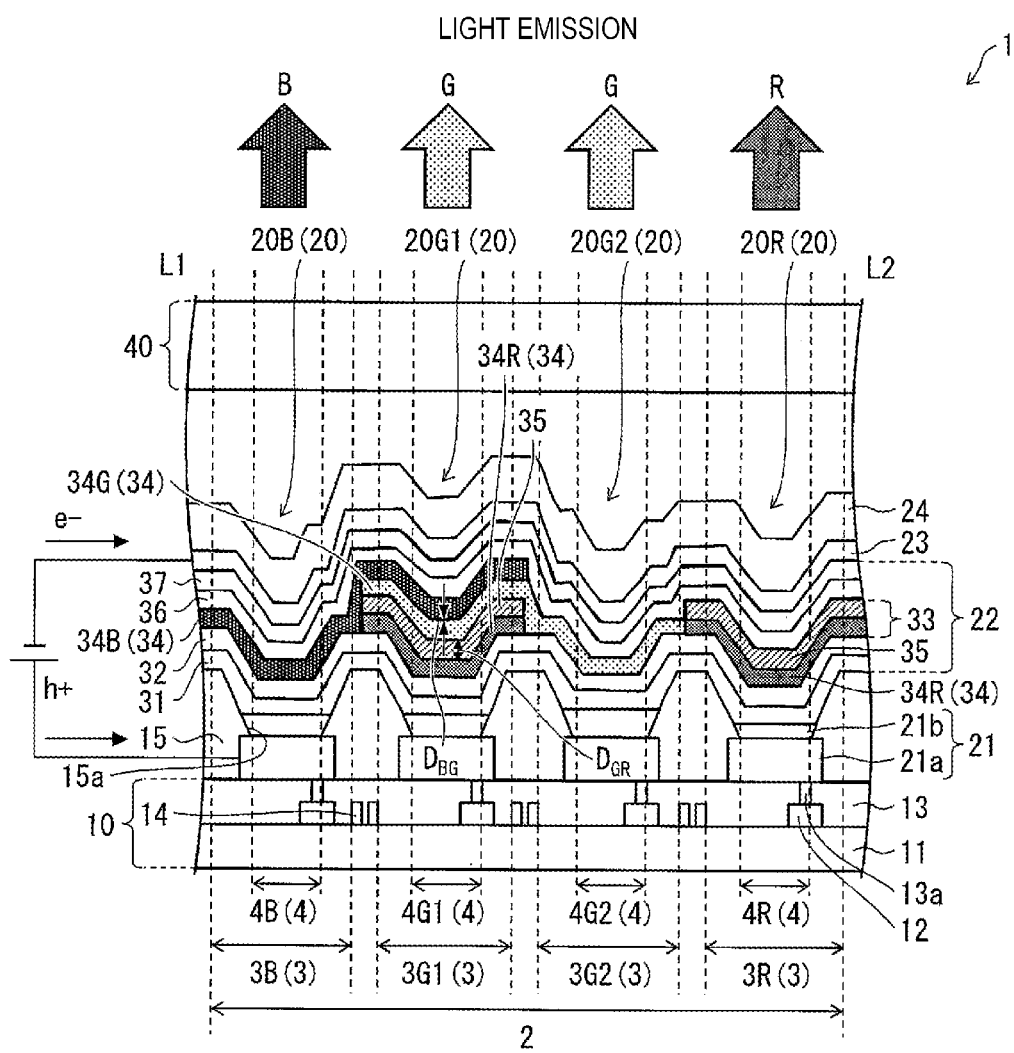
FIG. 4 is a cross-sectional view illustrating an example of the overall configuration of the organic EL display device according to the first embodiment of the disclosure.

FIG. 1 is a diagram schematically illustrating the principle of light emission by a light-emitting layer unit 33 of an organic EL display device 1 according to the present embodiment. FIG. 2 is a diagram schematically illustrating the layered structure of the light-emitting layer unit 33 of the organic EL display device 1 according to the present embodiment. FIG. 3 is a diagram schematically illustrating a pixel arrangement in the organic EL display device 1 according to the present embodiment. FIG. 4 is a cross-sectional view illustrating an example of the overall configuration of the organic EL display device 1 according to the present embodiment. Note that FIG. 4 illustrates an example of the overall configuration of a single pixel area, enclosed within the single dot-single dash line in FIG. 3, and corresponds to a cross-section of the organic EL display device 1 taken along the line L1-L2 indicated in FIG. 3.

As illustrated in FIG. 4, the organic EL display device 1 has a configuration in which, for example, a TFT (Thin Film Transistor) substrate 10 and a sealing substrate 40 are affixed to each other by a sealing member (not shown). A plurality of organic EL elements 20 that emit different colors of light are provided on the TFT substrate 10. Accordingly, the organic EL elements 20 are sealed between the pair of substrates, i.e., the TFT substrate 10 and the sealing substrate 40. A filler layer (not shown), for example, is provided between the TFT substrate 10, on which the organic EL elements 20 are layered, and the sealing substrate 40. The following describes an example in which the TFT substrate 10 is rectangular in shape.

The organic EL display device 1 according to the present embodiment is a top-emitting display device that emits light from the sealing substrate 40 side. This will be described in more detail below.

Configuration of TFT Substrate 10

The TFT substrate 10 is a circuit substrate in which a TFT circuit, which includes TFTs 12, wiring lines 14, and the like, is formed. The TFT substrate 10 includes an insulating substrate 11 (not shown) as a support substrate.

The insulating substrate 11 is not particularly limited as long as it has insulating properties. For example, various types of known insulating substrates, including an inorganic substrate such as a glass substrate or a silica substrate, a plastic substrate formed from polyethylene terephthalate or polyimide resin, or the like, can be used as the insulating substrate 11.

The present embodiment will later describe, as an example, a case where a transparent glass substrate (a transparent substrate) is used as the insulating substrate 11. However, the insulating substrate 11 need not be transparent for the top-emitting organic EL elements 20. Therefore, when the organic EL display device 1 is a top-emitting organic EL display device as in the present embodiment, an insulating substrate that is not transparent (a non-transparent substrate) including a semiconductor substrate such as a silicon wafer, a substrate in which a surface of a metal substrate formed from aluminum (Al) or iron (Fe) is coated with an insulating material such as silicon oxide or an organic insulating material, a substrate in which a surface of a metal substrate formed from Al is subjected to an insulation treatment through an anode oxidation method, or the like, may be used as the insulating substrate 11.

A plurality of the wiring lines 14 are provided on the insulating substrate 11, the wiring lines 14 being constituted by a plurality of gate lines extending in the horizontal direction and a plurality of signal lines extending in the vertical direction and intersecting with the gate lines. The wiring lines 14 and the TFTs 12 are covered by an interlayer insulating film 13. A gate line drive circuit (not shown), which drives the gate lines, is connected to the gate lines, and a signal line drive circuit (not shown), which drives the signal lines, is connected to the signal lines.

Light emitting regions 4 of the organic EL elements 20, which emit red (R), green (G), and blue (B) light, respectively, are provided on the TFT substrate 10, in regions surrounded by the wiring lines 14.

In other words, the region surrounded by the wiring lines 14 is a single subpixel 3 (a dot), and R, G, and B light emitting regions 4 are defined for each subpixel 3.

As illustrated in FIGS. 3 and 4, each of pixels 2 (i.e., each pixel) is constituted by four subpixels, namely subpixels 3B, 3G1, 3G2, and 3R. Organic EL elements 20B, 20G1, 20G2, and 20R, which have corresponding luminescent colors, are provided as the organic EL elements 20 for the subpixels 3B, 3G1, 3G2, and 3R, respectively.

The subpixel 3B (a first subpixel; a blue subpixel), which displays blue serving as a first color, is constituted by the organic EL element 20B, which has a luminescent color of blue, and transmits blue light. The subpixel 3G1 (a second subpixel; a first green subpixel), which displays green serving as a second color, is constituted by the organic EL element 20G1, which has a luminescent color of green, and transmits green light. Likewise, the subpixel 3G2 (a third subpixel; a second green subpixel), which displays green serving as the second color, is constituted by the organic EL element 20G2, which has a luminescent color of green, and transmits green light. The subpixel 3R (a fourth subpixel; a red subpixel), which displays red serving as a third color, is constituted by the organic EL element 20R, which has a luminescent color of red, and transmits red light.

In the present embodiment, the subpixels 3B, 3G1, 3G2, and 3R will be collectively referred to simply as "subpixels 3" where there is no need to distinguish between the subpixels 3B, 3G1, 3G2, and 3R. Likewise, in the present embodiment, the organic EL elements 20B, 20G1, 20G2, and 20R will be collectively referred to simply as "organic EL elements 20" where there is no need to distinguish between the organic EL elements 20B, 20G1, 20G2, and 20R. Furthermore, light emitting regions 4B, 4G1, 4G2, and 4R will be collectively referred to simply as "light emitting regions 4" where there is no need to distinguish between the light emitting regions 4B, 4G1, 4G2, and 4R. Numbers indicating the members collectively referred to in this manner are added as parentheticals in FIG. 4 and the like, e.g., "3B(3)".

A plurality of the TFTs 12, including a TFT serving as a drive transistor supplying drive current to the organic EL element 20, are provided for each of the subpixels 3. The light emission intensity of each subpixel 3 is determined by scanning and selection by the wiring line 14 and the TFT 12. As described above, the organic EL display device 1 selectively causes each organic EL element 20 to emit light at the desired luminance using the TFT 12, thereby displaying an image.

Configuration of Organic EL Element 20

As illustrated in FIG. 4, each organic EL element 20 includes a first electrode 21, an organic EL layer 22, and a second electrode 23. The organic EL layer 22 is interposed between the first electrode 21 and the second electrode 23. In the present embodiment, the layers provided between the first electrode 21 and the second electrode 23 are collectively referred to as the organic EL layer 22. The organic EL layer 22 is an organic layer constituted by at least one function layer, and includes the light-emitting layer unit 33, which in turn includes at least one light-emitting layer 34.

The first electrode 21, the organic EL layer 22, and the second electrode 23 are layered in that order from the TFT substrate 10 side.

The first electrode 21 is formed in an island-like pattern for each subpixel 3, and an end portion of the first electrode 21 is covered by a bank 15 (a partition; an edge cover). The first electrode 21 is connected to the TFT 12 via a contact hole 13a provided in the interlayer insulating film 13.

The bank 15 is an insulating layer, and is constituted by a photosensitive resin, for example. The bank 15 prevents short-circuiting with the second electrode 23 due to increased electrode density, the organic EL layer 22 being thinner, or the like at the end portion of the first electrode 21. The bank 15 also functions as a pixel separation film to prevent current from leaking to adjacent subpixels 3.

An opening 15a is provided in the bank 15, for each subpixel 3. As illustrated in FIG. 4, parts of the first electrode 21 and the organic EL layer 22 exposed by the opening 15a correspond to the light emitting region 4 of each subpixel 3, and the other regions are non-emissive regions.

On the other hand, the second electrode 23 is a common electrode provided in common for the subpixels 3. The second electrode 23 is provided in common for the subpixels 3 in all the pixels 2. However, the present embodiment is not limited thereto, and the second electrode 23 may be provided for each subpixel 3 individually.

A protection layer 24 is provided on the second electrode 23 to cover the second electrode 23. The protection layer 24 protects the second electrode 23, which serves as an upper electrode, and prevents outside oxygen and moisture from infiltrating into each organic EL element 20. Note that the protection layer 24 may be provided in common for all of the organic EL elements 20 so as to cover the second electrode 23 in all of the organic EL elements 20. In the present embodiment, the first electrode 21, the organic EL layer 22, and the second electrode 23, which are formed for each subpixel 3, as well as the protection layer 24 formed as necessary, are collectively referred to as the organic EL element 20.

First Electrode 21 and Second Electrode 23

The first electrode 21 and the second electrode 23 serve as a pair of electrodes, with one functioning as an anode electrode and the other functioning as a cathode electrode.

The anode electrode may function as an electrode for injecting holes (h+) into the light-emitting layer unit 33. The cathode electrode may function as an electrode for injecting electrons (e−) into the light-emitting layer unit 33.

The shape, structure, size, or the like of the anode electrode and the cathode electrode are not particularly limited and can be appropriately selected according to the application and purpose of the organic EL element 20.

The present embodiment will describe an example in which the first electrode 21 is the anode electrode and the second electrode 23 is the cathode electrode, as illustrated in FIG. 4. However, the present embodiment is not limited thereto, and the first electrode 21 may be a cathode electrode and the second electrode 23 may be an anode electrode. The order in which the function layers constituting the light-emitting layer unit 33 are layered, or the carrier transport properties (hole transport properties and electron transport properties), are inverted depending on whether the first electrode 21 is an anode electrode and the second electrode 23 is a cathode electrode, or the first electrode 21 is a cathode electrode and the second electrode 23 is an anode electrode. Likewise, the materials constituting the first electrode 21 and the second electrode 23 are inverted as well.

Electrode materials that can be used as the anode electrode and the cathode electrode are not particularly limited. For example, known electrode materials can be used.

As the anode electrode, for example, metals such as gold (Au), platinum (Pt), and nickel (Ni), transparent electrode materials such as indium tin oxide (ITO), tin oxide ($SnO_2$), indium zinc oxide (IZO), and gallium-added zinc oxide (GZO), or the like can be used.

On the other hand, it is preferable that a material having a small work function be used for the cathode electrode to inject electrons into the light-emitting layer 34. As the cathode electrode, for example, metals such as lithium (Li), calcium (Ca), cerium (Ce), barium (Ba), and aluminum (Al), or alloys such as Ag (silver)-Mg (magnesium) alloy and Al—Li alloy containing these metals, can be used.

The thicknesses of the anode electrode and cathode electrode are not particularly limited, and can be set to the same thicknesses as employed in the past.

Light emitted by the light-emitting layer unit 33 is light emitted from the side on which one of the electrodes, out of the first electrode 21 and the second electrode 23, is located. Preferably, a transparent or semitransparent light-transmissive electrode (a transparent electrode, a semitransparent electrode) employing a light-transmissive electrode material is used as the electrode on the side where light is emitted, and a reflective electrode employing a reflective electrode material, or an electrode having a reflective layer which serves as a reflective electrode, is used as the electrode on the side where light is not emitted.

In other words, a variety of conductive materials can be used for the first electrode 21 and the second electrode 23. However, when the organic EL display device 1 is a top-emitting organic EL display device as described above, it is preferable that the first electrode 21 on the side of the TFT substrate 10, which serves as a support body supporting the organic EL elements 20, be formed from a reflective electrode material, and that the second electrode 23, which is located on the side opposite from the first electrode 21 with the organic EL elements 20 interposed therebetween, be formed from a transparent or semitransparent light-transmissive electrode material.

The first electrode 21 and the second electrode 23 may each have a single layer structure formed from one electrode material, or may each have a layered structure formed from a plurality of electrode materials.

Accordingly, when the organic EL elements 20 are top-emitting organic EL elements as described above, the first electrode 21 may have a layered structure including a reflective electrode 21a (a reflective layer) and a light-transmissive electrode 21b, as illustrated in FIG. 2. In the present embodiment, the first electrode 21 has a configuration in which the reflective electrode 21a and the light-transmissive electrode 21b are layered in that order from the TFT substrate 10 side.

Examples of reflective electrode materials include a black electrode material such as tantalum (Ta) or carbon (C), a reflective metal electrode material such as Al, Ag, gold (Au), Al—Li alloy, Al-neodymium (Nd) alloy, or Al-silicon (Si) alloy.

A transparent electrode material such as those described above, or a semitransparent electrode material such as a thin film of Ag, may be used as the light-transmissive electrode material, for example.

Organic EL Layer 22

As illustrated in FIG. 4, the organic EL layer 22 according to the present embodiment has a configuration in which a hole injection layer 31, a hole transport layer 32, the light-emitting layer unit 33 including the light-emitting layer 34, an electron transport layer 36, and an electron injection layer 37, serving as function layers, are layered in that order from the first electrode 21 side. The hole injection layer 31, the hole transport layer 32, the electron transport layer 36, and the electron injection layer 37 are provided in common for the subpixels 3 in all of the pixels 2.

However, the function layers aside from the light-emitting layer unit 33 are not layers necessary for the organic EL layer 22, and may be formed as appropriate according to required properties of the organic EL element 20. Each of the above-described function layers will be described next.

Light-Emitting Layer Unit 33

As described above, the organic EL layer 22 in each organic EL element 20 is an organic layer constituted by at least one function layer. The light-emitting layer unit 33 in each organic EL element 20 includes at least one light-emitting layer 34, as illustrated in FIGS. 1, 2, and 4.

Of the organic EL elements 20, the organic EL element 20B includes, as the light-emitting layer 34, a blue fluorescent light-emitting layer 34B containing a blue fluorescent luminescent material that emits blue light. The organic EL element 20R includes, as the light-emitting layer 34, a red light-emitting layer 34R containing a red luminescent material that emits red light. The organic EL element 20G2 includes, as the light-emitting layer 34, a green fluorescent light-emitting layer 34G containing a green fluorescent luminescent material that emits green light. The organic EL element 20G2 includes, as the light-emitting layers 34, the red light-emitting layer 34R, the green fluorescent light-emitting layer 34G, and the blue fluorescent light-emitting layer 34B. In other words, while each of the organic EL elements 20B, 20G2, and 20R is provided with only one light-emitting layer 34, the organic EL element 20G1 is provided with each of the light-emitting layers 34 provided in the organic EL elements 20B, 20G2, and 20R (in other words, the R, G, and B light-emitting layers 34).

The blue fluorescent light-emitting layer 34B is provided in common for the subpixel 3B and the subpixel 3G1. The green fluorescent light-emitting layer 34G is provided in common for the subpixel 3G1 and the subpixel 3G2. The red light-emitting layer 34R is provided in common for the subpixel 3G1 and the subpixel 3R.

As such, in each pixel 2, a plurality of function layers including at least the blue fluorescent light-emitting layer 34B, the green fluorescent light-emitting layer 34G, and the red light-emitting layer 34R are formed between the first electrode 21 and the second electrode, as illustrated in FIG. 4. In each subpixel 3, at least one function layer including at least one of the light-emitting layers 34 among the blue fluorescent light-emitting layer 34B, the green fluorescent light-emitting layer 34G, and the red light-emitting layer 34R, is provided between the first electrode 21 and the second electrode 23.

In the subpixel 3G1, the blue fluorescent light-emitting layer 34B and the green fluorescent light-emitting layer 34G are provided adjacent to each other, whereas a separation layer 35 that inhibits Förster-type energy transfer (Förster transfer) is provided between the green fluorescent light-emitting layer 34G and the red light-emitting layer 34R.

The separation layer 35 does not contain a luminescent material, is constituted by at least one function layer aside from the light-emitting layer, and has a thickness exceeding the Förster radius. Preferably, the separation layer 35 is at least 15 nm thick.

"Förster radius" refers to the distance between adjacent light-emitting layers 34 at which Förster transfer can arise (specifically, the distance between opposing surfaces of adjacent light-emitting layers 34 that are closest to each other). The Förster radius is higher when there is a large amount of overlap between the PL (photoluminescence) emission spectrum of the luminescent material contained in one of the adjacent light-emitting layers 34 and the absorption spectrum of the luminescent material contained in the other of the light-emitting layers 34, and the Förster radius is lower when there is a small amount of such overlap.

The Förster radius is said to typically be approximately from 1 to 10 nm. As such, Förster transfer will not arise as long as the distance between the opposing surfaces of light-emitting layers 34 adjacent to each other is kept greater than 10 nm.

However, making the distance between adjacent light-emitting layers 34 at least 15 nm ensures that Förster transfer will not arise between the adjacent light-emitting layers 34 even if the PL (photoluminescence) emission spectrum and the absorption spectrum of the luminescent materials in the adjacent light-emitting layers 34 overlap perfectly. It is therefore preferable that the distance between opposing surfaces of the green fluorescent light-emitting layer 34G and the red light-emitting layer 34R (an opposing surface distance $D_{GR}$), i.e., a distance between the surface of the green fluorescent light-emitting layer 34G located furthest on the red light-emitting layer 34R side (a lower surface of the green fluorescent light-emitting layer 34G, in the present embodiment) and the surface of the red light-emitting layer 34R located furthest on the green fluorescent light-emitting layer 34G side (an upper surface of the red light-emitting layer 34R, in the present embodiment), be greater than or equal to 15 nm. For this reason, preferably, the separation layer 35 is at least 15 nm thick.

Like the red light-emitting layer 34R, the separation layer 35 is provided in common for the subpixel 3G1 and the subpixel 3R. Note that the thickness of the separation layer 35 may be set to any thickness capable of inhibiting Förster transfer, and is not limited to a thickness exceeding the Förster radius. An increase in the thickness of the separation layer 35 will result in a corresponding increase in the thickness of the organic EL display device 1, and thus from the standpoint of keeping the organic EL display device 1 small, achieving low voltages for the elements, and the like, a thickness of less than or equal to 50 nm is preferable, and a thickness of less than or equal to 30 nm is more preferable.

As such, part of the separation layer 35 is interposed between the green fluorescent light-emitting layer 34G and the red light-emitting layer 34R in the subpixel 3G1, and another part is layered adjacent to the red light-emitting layer 34R in the subpixel 3R.

In each embodiment, a layered body constituted by the light-emitting layer 34 and an intermediate layer including function layers, aside from the light-emitting layer 34, that are at least partially interposed between a plurality of light-emitting layers 34, is referred to as the light-emitting layer unit 33. Note that the intermediate layer is the separation layer 35 in the organic EL display device 1 according to the present embodiment.

In the organic EL display device 1 according to the present embodiment, the light-emitting layers 34 and the separation layer 35 constituting the light-emitting layer unit 33 in the pixel 2 are layered in the following order, from the first electrode 21 side, as illustrated in FIGS. 1, 2, and 4: the red light-emitting layer 34R, the separation layer 35, the green fluorescent light-emitting layer 34G, and the blue fluorescent light-emitting layer 34B.

The light-emitting layer unit 33 is constituted by the blue fluorescent light-emitting layer 34B in the subpixel 3B, and in the subpixel 3G1, has a layered structure in which the red light-emitting layer 34R, the separation layer 35, the green fluorescent light-emitting layer 34G, and the blue fluorescent light-emitting layer 34B are layered in that order from the first electrode 21 side. In the subpixel 3G2, the light-emitting layer unit 33 is constituted by the green fluorescent light-emitting layer 34G, and in the subpixel 3R, has a layered structure in which the red light-emitting layer 34R and the separation layer 35 are layered in that order from the first electrode 21 side.

Figure 5:
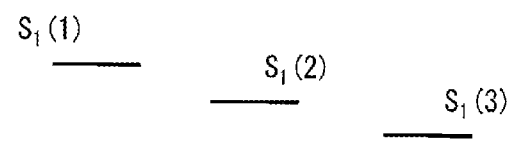
FIG. 5 is a diagram illustrating a relationship between energy levels of a blue fluorescent luminescent material, a green fluorescent luminescent material, and a red luminescent material, in minimum excited singlet states.

FIG. 5 is a diagram illustrating a relationship between energy levels of the blue fluorescent luminescent material, the green fluorescent luminescent material, and the red luminescent material, in minimum excited singlet states (denoted as "$S_1$ levels" hereinafter). In FIG. 5, $S_1(1)$ indicates the $S_1$ level of the blue fluorescent luminescent material, which is a first fluorescent luminescent material; $S_1(2)$ indicates the $S_1$ level of the green fluorescent luminescent material, which is a second fluorescent luminescent material; and $S_1(3)$ indicates the $S_1$ level of the red luminescent material, which is a third luminescent material. Note that $S_1$ indicates a ground state in FIG. 5.

As illustrated in FIG. 5, the energy level of the green fluorescent luminescent material in the minimum excited singlet state ($S_1(2)$) is lower than the $S_1$ level of the blue fluorescent luminescent material ($S_1(1)$) and is higher than the $S_1$ level of the red luminescent material ($S_1(3)$).

Figure 6:
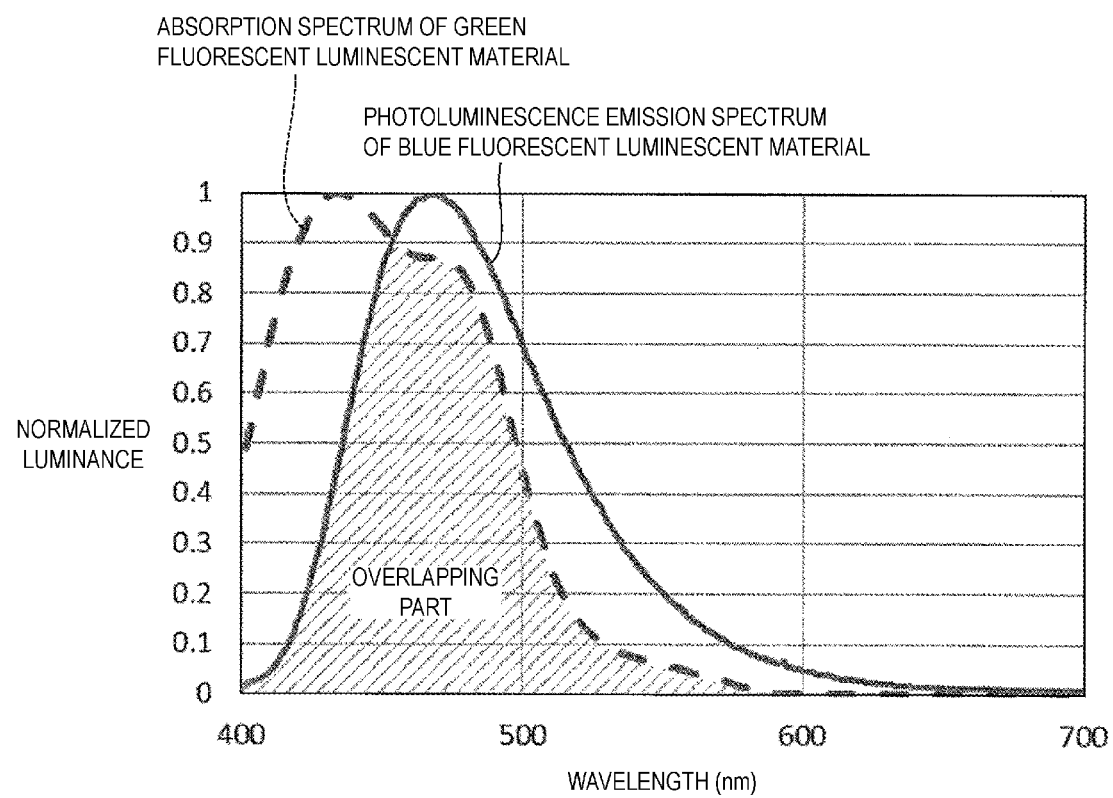
FIG. 6 is a graph illustrating an example of a photoluminescence emission spectrum of the blue fluorescent luminescent material, and an absorption spectrum of the green fluorescent luminescent material, used in the first embodiment of the disclosure.

FIG. 6 is a graph illustrating an example of the PL (photoluminescence) emission spectrum of the blue fluorescent luminescent material and the absorption spectrum of the green fluorescent luminescent material used in the present embodiment.

Note that FIG. 6 indicates the PL emission spectrum of 2,5,8,11-tetra-tert-butylperylene (TBPe), used in Example 1 (described later), as the PL emission spectrum of the blue fluorescent luminescent material, and indicates the absorption spectrum of 2,3-(2-benzothiazolyl)-7-(diethylamino) coumarin (coumarin 6), used in Example 1 (described later), as the absorption spectrum of the green fluorescent luminescent material.

Figure 7:
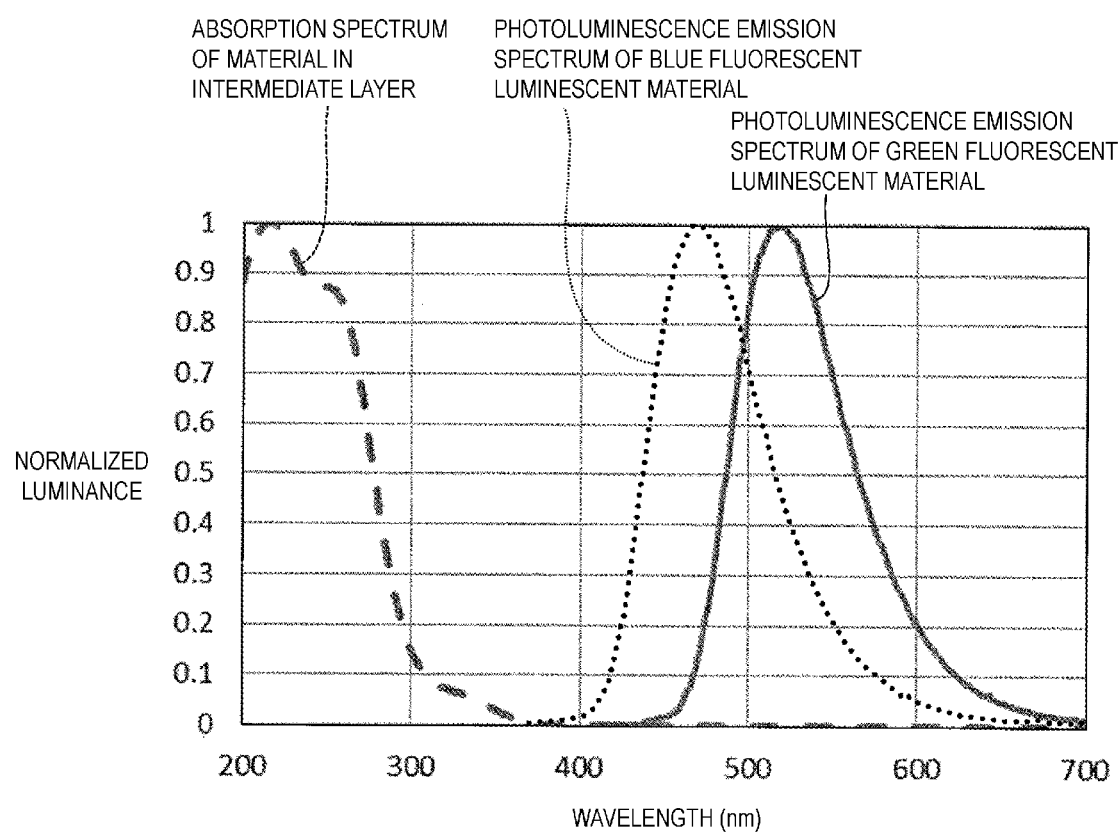
FIG. 7 is a graph illustrating an example of an absorption spectrum of a material of a separation layer, a photoluminescence emission spectrum of the green fluorescent luminescent material, and a photoluminescence emission spectrum of the blue fluorescent luminescent material, used in the first embodiment of the disclosure.

FIG. 7 is a graph illustrating an example of the absorption spectrum of the material of the separation layer 35, the PL emission spectrum of the green fluorescent luminescent material, and the PL emission spectrum of the blue fluorescent luminescent material, used in the present embodiment.

Note that FIG. 7 indicates the absorption spectrum of 4,4'-bis (9-carbazoyl)-biphenyl (CBP), used in Example 1 (described later), as the absorption spectrum of the material of the separation layer 35. FIG. 7 also illustrates the PL emission spectrum of coumarin 6, described above used in Example 1 (described later), as the PL emission spectrum of the green fluorescent luminescent material; and the PL emission spectrum of TBPe, used in Example 1 (described later) and illustrated in FIG. 6, as the PL emission spectrum of the blue fluorescent luminescent material.

As illustrated in FIG. 6, preferably, the PL emission spectrum of the blue fluorescent luminescent material and the absorption spectrum of the green fluorescent luminescent material partially overlap. Furthermore, as illustrated in FIG. 7, it is preferable that no overlap be present between the following: the absorption spectrum of an intermediate later adjacent to the red light-emitting layer 34R (a first intermediate layer), or in other words, of all the materials contained in the intermediate layer provided between the red light-emitting layer 34R and the light-emitting layer adjacent to the red light-emitting layer 34R in the layering direction (the green fluorescent light-emitting layer 34G, in the present embodiment) (in other words, the material of the separation layer 35); and the PL emission spectrum of at least the green fluorescent luminescent material in the green fluorescent light-emitting layer 34G, which is the light-emitting layer adjacent to the stated intermediate layer (i.e., the separation layer 35), among the blue fluorescent light-emitting layer 34B and the green fluorescent light-emitting layer 34G that are the light-emitting layers provided on the opposite side of the intermediate layer from the red light-emitting layer 34R. Additionally, it is preferable that no overlap be present between the absorption spectrum of all the materials contained in the intermediate layer (i.e., the separation layer 35), and the PL emission spectrum of the green fluorescent luminescent material and the PL emission spectrum of the blue fluorescent luminescent material.

Ensuring the PL emission spectrum of the blue fluorescent luminescent material and the absorption spectrum of the green fluorescent luminescent material partially overlap in this manner makes it easy for energy to be transferred from the blue fluorescent luminescent material to the green fluorescent luminescent material.

In the subpixel 3G1, the blue fluorescent light-emitting layer 34B and the green fluorescent light-emitting layer 34G are in direct contact, and thus the distance between opposing surfaces of the blue fluorescent light-emitting layer 34B and the green fluorescent light-emitting layer 34G (an opposing surface distance $D_{BG}$) is less than or equal to the Förster radius.

Thus, in the subpixel 3G1, Förster transfer arises, from the $S_1$ level of the blue fluorescent luminescent material to the $S_1$ level of the green fluorescent luminescent material. In other words, Förster transfer arises from the blue fluorescent light-emitting layer 34B to the green fluorescent light-emitting layer 34G.

Note that in the present embodiment, the distance between opposing surfaces of the blue fluorescent light-emitting layer 34B and the green fluorescent light-emitting layer 34G (the opposing surface distance $D_{BG}$) is a distance between the surface of the blue fluorescent light-emitting layer 34B located furthest on the green fluorescent light-emitting layer 34G side (a lower surface of the blue fluorescent light-emitting layer 34B, in the present embodiment) and the surface of the green fluorescent light-emitting layer 34G located furthest on the blue fluorescent light-emitting layer 34B side (an upper surface of the green fluorescent light-emitting layer 34G, in the present embodiment).

On the other hand, ensuring no overlap is present between the absorption spectrum of all the materials contained in the intermediate layer (the first intermediate layer; the separation layer 35) and the PL emission spectrum of at least the green fluorescent luminescent material in the green fluorescent light-emitting layer 34G, which among the blue fluorescent light-emitting layer 34B and the green fluorescent light-emitting layer 34G is the light-emitting layer adjacent to the separation layer 35, makes it difficult for energy transfer to occur from the blue fluorescent luminescent material and the green fluorescent luminescent material to the material contained in the intermediate layer. Note that ensuring no overlap is present between the absorption spectrum of all the materials contained in the intermediate layer (the first intermediate layer; the separation layer 35), and the PL emission spectrum of the green fluorescent luminescent material and the PL emission spectrum of the blue fluorescent luminescent material, makes it even more difficult for energy transfer to occur from the green fluorescent luminescent material and the blue fluorescent luminescent material to the material contained in the intermediate layer.

The separation layer 35 has a thickness exceeding the Förster radius, and thus the opposing surface distance $D_{GR}$ in the subpixel 3G1 is greater than the Förster radius.

Thus, in the subpixel 3G1, Förster-type energy transfer does not arise from the green fluorescent light-emitting layer 34G to the red light-emitting layer 34R through the separation layer 35. Of course, the separation layer 35 is provided between the green fluorescent light-emitting layer 34G and the red light-emitting layer 34R, and the green fluorescent light-emitting layer 34G and the red light-emitting layer 34R are not in contact with each other, which means that Dexter-type energy transfer does not occur as well.

Each of the light-emitting layers 34 may be formed from a two-component system including a host material for transporting holes and electrons and a luminescent dopant (guest) material serving as a luminescent material and emitting light, or may be formed from a luminescent material alone.

Of the materials (components) of the light-emitting layer 34, either the host material or the luminescent material may have the greater content percentage.

The host material is a material into which holes and electrons can be injected, and has a function of causing the luminescent material to emit light by holes and electrons being transported and recombining within the molecules of the material. When using a host material, the luminescent material is dispersed uniformly throughout the host material.

When using a host material, an organic compound having a higher value for the $S_1$ level, the energy level in a minimum excited triplet state (denoted as "$T_1$ level" hereinafter), or both, than that of the luminescent material, is used for the host material. Accordingly, the host material can trap the energy of the luminescent material in the luminescent material, which makes it possible to improve the light emission efficiency of the luminescent material.

To improve the efficiency of the luminescent colors to be displayed by the subpixels 3 having the layered structure described in the present embodiment, it is desirable that the material in the green fluorescent light-emitting layer 34G having the highest content percentage and the material in the blue fluorescent light-emitting layer 34B having the highest content percentage, and desirably both materials, be hole transporting materials with extremely low electron mobility, as indicated by the arrows in FIGS. 1 and 2 that represent the movement of holes ($h^+$) and electrons ($e^-$). Additionally, it is desirable that the separation layer 35 exhibit bipolar transport properties, where both the hole transport properties and the electron transport properties are high, for the separation layer 35 as a whole. Accordingly, the material contained in the separation layer 35 may be a material exhibiting bipolar transport properties alone, such as a bipolar transporting material. Alternatively, two or more types of a material that alone exhibits hole transport properties in which the hole mobility is higher than the electron mobility, or a material that alone exhibits electron transport properties in which the electron mobility is higher than the hole mobility, may be used in combination so as to exhibit bipolar transport properties as the separation layer 35. Furthermore, it is desirable that the material in the red light-emitting layer 34R having the highest combination ratio be a bipolar transporting material, as indicated in FIGS. 1 and 2. However, this material may be a hole transporting material.

Hole transporting materials such as 4,4'-bis [N-phenyl-N-(3"-methylphenyl) amino] biphenyl (TPD), 9,10-di (2-naphthyl) anthracene (ADN), 1,3-bis (carbazol-9-yl) benzene (mCP), 3,3'-di (9H-carbazol-9-yl) biphenyl (mCBP), and the like can be given as examples of host materials having hole transport properties. Electron transporting materials such as 2,9-dimethyl-4,7-diphenyl-1,10-phenanthroline (BCP), bis [(2-diphenylphosphoryl) phenyl] ether (DPEPO), 4,4'-Bis (2,2-diphenylvinyl)-1,1'-biphenyl (DPVBi), 2,2', 2"-(1,3,5-benztrile)-tris (1-phenyl-benzimidazolyl) (TPBi), bis (2-methyl-8-quinolinolate)-4-(phenylphenolate) aluminum (BAlq), and the like can be given as examples of host materials having electron transport properties. A bipolar transporting material such as 4,4'-bis (9-carbazoyl)-biphenyl (CBP) can be given as an example of a host material having bipolar transport properties.

The luminescent materials in the blue fluorescent light-emitting layer 34B and the green fluorescent light-emitting layer 34G are both fluorescent luminescent materials.

A fluorescent luminescent material that emits blue light, such as 2,5,8,11-tetra-tert-butylperylene (TBPe), bis [4-(9, 9-dimethyl-9,10-dihydroacridine) phenyl] sulfone (DMAC-DPS), perylene, 4,5-bis (carbazol-9-yl)-1,2-dicyanobenzene (2CzPN), or the like can be used as the blue fluorescent luminescent material.

3-(2-benzothiazolyl)-7-(diethylamino) coumarin (coumarin 6), 8-hydroxyquinoline aluminum (Alq 3), 1,2,3,5-tetrakis (carbazol-9-yl)-4,6-dicyano benzene (4CzIPN), 1,2, 3,4-tetrakis (carbazol-9-yl)-5,6-dicyanobenzene (4CzPN), PXZ-DPS indicated in the following formula, and the like can be given.

[Formula 1]

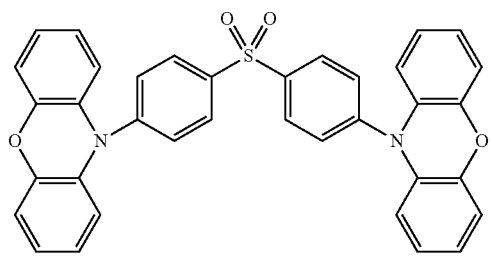

These materials can be given as examples of green fluorescent luminescent.

The red luminescent material may be a phosphorescent luminescent material or a fluorescent luminescent material, as long as the luminescent color is red. However, because the red light-emitting layer 34R does not use energy transfer, a phosphorescent luminescent material or a TADF (Thermally Activated Delayed Fluorescence) material has a high light emission efficiency and is therefore desirable.

The TADF material is a material in which a minimum excited singlet state can be generated through reverse intersystem crossing from a minimum excited triplet state by thermal activation, and is a delayed fluorescent material in which the energy difference $\Delta E_{ST}$ between the $S_1$ level and the $T_1$ level is extremely small. When a delayed fluorescent material in which the energy difference $\Delta E_{ST}$ between the $S_1$ level and the $T_1$ level is extremely small is used for the luminescent material, reverse intersystem crossing from the $T_1$ level to the $S_1$ level occurs due to thermal energy. Using the delayed fluorescence provided by the TADF material can theoretically enhance the internal quantum efficiency to 100%, even in the case of fluorescent light emission. The lower $\Delta E_{ST}$ is, the easier it is for reverse intersystem crossing to arise from the minimum excited triplet state to the minimum excited singlet state, and reverse intersystem crossing can occur comparatively easily, even at room temperature, if $\Delta E_{ST}$ is less than or equal to 0.3 eV.

Tetraphenyldibenzoperilenthene (DBP), (E)-2-{2-[4-(dimethylamino) styryl]-6-methyl-4H-pyran-4-ylidene} malononitrile (DCM), and the like can be given as examples of red fluorescent luminescent materials. Tris (1-phenylisoquinoline) iridium (III) (Ir(piq)3), bis (2-benzo [b] thiophen-2-yl-pyridine) (acetylacetonate) iridium (III) (Ir (btp) 2 (acac)), and the like can be given as examples of red phosphorescent luminescent materials. Examples of the TADF material that emits red light include PPZ-DPO, indicated by the following formula:

[Formula 2]

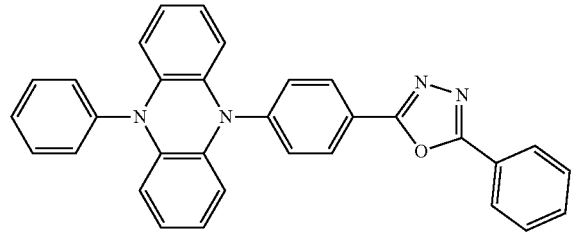

PPZ—DPS, indicated by the following formula:

[Formula 3]

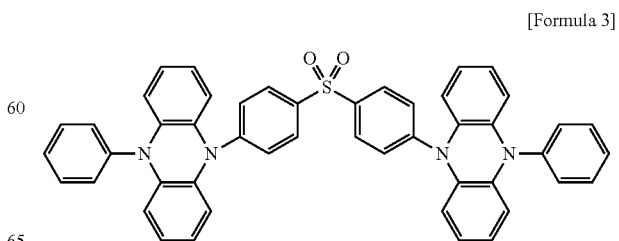

and 4CzTPN-Ph, indicated by the following formula:

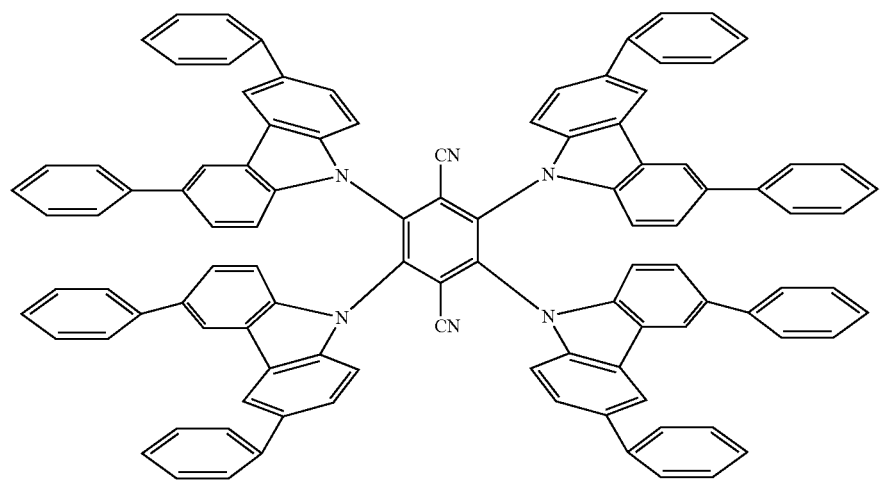

[Formula 4]

These materials can be used.

4,4'-bis (9-carbazoyl)-biphenyl (CBP) or the like, which is one of the above-described bipolar transporting materials, can be given as an example of the separation layer 35.

The thicknesses of the function layers in the light-emitting layer unit 33 are not particularly limited as long as the layers are formed so that the opposing surface distance $D_{GR}$ and the opposing surface distance $D_{BG}$ satisfy the above-described conditions.

However, of the light-emitting layer unit 33, it is preferable that the thickness of the blue fluorescent light-emitting layer 34B be set to less than or equal to 10 nm. Setting the thickness of the blue fluorescent light-emitting layer 34B to less than or equal to 10 nm ensures that the distance, in the subpixel 3G1, from the molecules of the blue fluorescent luminescent material in the blue fluorescent light-emitting layer 34B that are furthest from the green fluorescent light-emitting layer 34G (i.e., the molecules at the surface of the blue fluorescent light-emitting layer 34B on the side opposite from the side on which the green fluorescent light-emitting layer 34G is located, which in the present embodiment are the molecules of the blue fluorescent luminescent material located on the upper surface of the blue fluorescent light-emitting layer 34B) to green fluorescent luminescent material in the green fluorescent light-emitting layer 34G is less than or equal to 10 nm. In other words, the shortest distances from given positions of the blue fluorescent light-emitting layer 34B to the green fluorescent light-emitting layer 34G are all less than or equal to 10 nm. As such, Förster transfer is possible from the molecules at a given location of the blue fluorescent luminescent material to the green fluorescent luminescent material in the subpixel 3G1. Förster transfer is also possible from, for example, molecules of the blue fluorescent luminescent material located at the surface of the blue fluorescent light-emitting layer 34B on the opposite side from the side on which the green fluorescent light-emitting layer 34G is located.

Hole Injection Layer 31 and Hole Transport Layer 32

The hole injection layer 31 includes a material with hole injecting properties, and has a function of increasing the hole injection efficiency to the light-emitting layer 34. The hole injection layer 31 and the hole transport layer 32 may be formed as mutually independent layers, or may be integrated together as a hole injection-cum-transport layer. It is not necessary that both the hole injection layer 31 and the hole transport layer 32 be provided, and only one (e.g., the hole transport layer 32) may be provided.

A known material can be used as the material of the hole injection layer 31, the hole transport layer 32, or the hole injection-cum-transport layer, that is, as a hole injection material or a hole transporting material.

Examples of such a material include linear or heterocyclic conjugated monomers, oligomers, or polymers such as naphthalene, anthracene, azatriphenylene, fluorenone, hydrazone, stilbene, triphenylene, benzine, styrylamine, triphenylamine, porphyrins, triazole, imidazole, oxadiazole, oxazole, polyarylalkane, phenylenediamine, arylamine, and derivatives thereof, a thiophene-based compound, a polysilane-based compound, a vinyl carbazole-based compound, and an aniline-based compound. Specifically, N,N'-di(naphthalen-1-yl)-N,N'-diphenyl-benzidine (α-NPD), 2,3,6,7,10, 11-hexacyano-1,4,5,8,9,12-hexaazatriphenylene (HAT-CN), 1,3-bis(carbazol-9-yl)benzene (mCP), di[4-(N,N-ditolylamino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium (III) tris[N,N'-diphenylbenzimidazol-2-ylidene-C2, C2'] (Ir(dpbic)₃), 4,4',4"-tris-(N-carbazolyl)-triphenylamine (TCTA), 2,2-bis(p-trimellitic oxyphenyl)propanoic anhydride (BTPD), bis[4-(p,p-ditolylamino)phenyl]diphenylsilane (DTASi), or the like is used.

For the hole injection layer 31, the hole transport layer 32, or the hole injection-cum-transport layer, an intrinsic hole injecting material or an intrinsic hole transporting material that is not doped with an impurity may be used. Alternatively, the material may be doped with an impurity to enhance the electrical conductivity.

To achieve highly-efficient light emission, it is desirable that the excitation energy be trapped within the light-emitting layer unit 33, and particularly within the light-emitting layer 34 of the light-emitting layer unit 33. Therefore, it is desirable that as the hole injecting material and the hole transporting material, a material having an $S_1$ level and a $T_1$ level that are excitation levels higher than the $S_1$ level and the $T_1$ level of the luminescent material in the light-emitting layer 34 be used. Therefore, it is more preferable that as the hole injecting material and the hole transporting material, a material having high excitation level and high hole mobility be selected.

Electron Transport Layer 36 and Electron Injection Layer 37

The electron injection layer 37 includes an electron injecting material and has a function of increasing the electron injection efficiency to the light-emitting layer 34.

The electron transport layer 36 includes an electron transporting material and has a function of increasing the electron transport efficiency to the light-emitting layers 34.

The electron injection layer 37 and the electron transport layer 36 may be formed as mutually independent layers, or may be integrated together as an electron injection-cum-transport layer. It is not necessary that both the electron injection layer 37 and the electron transport layer 36 be provided, and only one, e.g., the electron transport layer 36, may be provided. Of course, it is acceptable for neither to be provided as well.

A known material can be used as a material for the electron injection layer 37, the electron transport layer 36, or an electron injection-cum-transport layer, i.e., a material used as the electron injecting material or the electron transporting material.

Examples of the material include quinoline, perylene, phenanthroline, bisstyryl, pyrazine, triazole, oxazole, oxadiazole, fluorenone, and derivatives and metal complexes thereof, and lithium fluoride (LiF).

More specific examples thereof include bis[(2-diphenylphosphoryl)phenyl]ether (DPEPO), 4,7-diphenyl-1,10-phenanthroline (Bphen), 3,3'-bis(9H-carbazole-9-yl)biphenyl (mCBP), 2,9-dimethyl-4,7-diphenyl-1,10-phenanthroline (BCP), 1,3,5-tris(N-phenylbenzoimidazole-2-yl)benzene (TPBI), 3-phenyl-4(1'-naphthyl)-5-phenyl-1,2,4-triazole (TAZ), 1,10-phenanthroline, Alq(tris(8-hydroxyquinoline)aluminum), LiF, and the like.

Protection Layer 24

The protection layer 24 is formed from a transparent insulating material or conductive material. Inorganic insulating materials such as silicon nitride (SiN), silicon oxide (SiO), silicon oxynitride (SiON), and aluminum oxide ($Al_2O_3$), conductive materials such as ITO, and the like can be given as examples of the material of the protection layer 24. Note that the protection layer 24 may have a layered structure including an inorganic insulating layer and an organic insulating layer. A polysiloxane, silicon oxide carbide (SiOC), an acrylate, a polyurea, parylene, a polyimide, a polyamide, and the like can be given as examples of organic insulating materials that can be used as the organic insulating layer.

The thickness of the protection layer 24 is not particularly limited, and may be set as appropriate in accordance with the material so that oxygen, moisture, and the like can be prevented from infiltrating into the organic EL elements 20.

Sealing Substrate 40

An insulating substrate such as a glass substrate or a plastic substrate can be used as the sealing substrate 40. When the organic EL display device 1 is a top-emitting organic EL display device as in the present embodiment, a transparent insulating substrate is used as the sealing substrate 40.

Note that the insulating substrate 11 and the sealing substrate 40 may be flexible insulating films. Using flexible substrates for the insulating substrate 11 and the sealing substrate 40 makes it possible to make the organic EL display device 1 a flexible display or a bendable display.

Note that gap spacers (not shown) may be provided between the TFT substrate 10 and the sealing substrate 40, to prevent the sealing substrate 40 from contacting the TFT substrate 10 and damaging the organic EL elements 20.

Display Method of Organic EL Display Device 1

A display method of the organic EL display device 1 according to the present embodiment will be described next.

As described earlier, the organic EL display device 1 includes a plurality of subpixels 3 in which the organic EL elements 20, which include the light-emitting layers 34 of the respective colors, are provided. A color display is achieved by using the TFTs 12 to selectively cause the organic EL elements 20 in the subpixels 3 to emit light at desired luminances. The emission of light by the subpixels 3 will be described next.

The organic EL display device 1 according to the present embodiment is an active-matrix organic EL display device, and a plurality of the pixels 2 are arranged in a matrix in a display region.

As described above, each pixel 2 includes two types of green subpixels 3 (subpixels 3G), namely the subpixel 3G1 and the subpixel 3G2, and is therefore constituted by four subpixels 3, namely the subpixel 3B, the subpixel 3G1, the subpixel 3G2, and the subpixel 3R.

As illustrated in FIG. 3, the pixels 2 in the display region have a PenTile-type pixel arrangement (PenTile arrangement), in which the subpixel 3G1 is adjacent to the subpixel 3B in a row direction (a first direction) and adjacent to the subpixel 3R in the column direction (i.e., a direction orthogonal to the row direction; a second direction), the subpixel 3G2 is adjacent to the subpixel 3R in the row direction and adjacent to the subpixel 3B in the column direction, and the subpixel 3B is adjacent to the subpixel 3R, and the subpixel 3G1 to the subpixel 3G2, in an oblique direction (a third direction) intersecting with the row direction and the column direction (specifically, intersecting with those directions at an angle of 45 degrees). Accordingly, in the display region, the pixels 2 are arranged such that in the row direction, the subpixel 3B is adjacent to the subpixel 3G1 and the subpixel 3G2 is adjacent to the subpixel 3R, and in the column direction, the subpixel 3B is adjacent to the subpixel 3G2 and the subpixel 3G1 is adjacent to the subpixel 3R. A column constituted by the subpixel 3B and the subpixel 3G1, and a column constituted by the subpixel 3G2 and the subpixel 3R, which are formed along the row direction, are arranged so as to alternate in the column direction. The subpixels 3B and the subpixels 3G1 are arranged in an alternating manner in odd-numbered rows, for example, and the subpixels 3G2 and the subpixels 3R are arranged in an alternating manner in even-numbered rows. Additionally, the subpixels 3B and the subpixels 3G2 are arranged in an alternating manner in odd-numbered rows, for example, and the subpixels 3G1 and the subpixels 3R are arranged in an alternating manner in even-numbered rows.

According to the present embodiment, employing a PenTile type pixel arrangement makes it possible to improve the apparent resolution.

Unlike organic EL display devices having a known PenTile-type pixel arrangement, the subpixel 3G1 and the subpixel 3G2 have different layered structures in the present embodiment, as illustrated in FIGS. 1, 2, and 4.

In the organic EL display device 1 according to the present embodiment, the holes ($h^+$) and electrons ($e^-$) injected into the organic EL layer 22 from the first electrode 21 and the second electrode 23, respectively, as indicated in FIG. 4, recombine and generate excitons in the blue fluorescent light-emitting layer 34B of the subpixel 3B, and recombine and generate excitons in the green fluorescent light-emitting layer 34G of the subpixel 3G2, as indicated in FIG. 1. The generated excitons give off light upon deactivating and returning to a ground state (denoted as "$S_0$" hereinafter). As a result, the subpixel 3B emits blue light, and the subpixel 3G2 emits green light.

Furthermore, as described earlier, a bipolar transporting material, for example, is used for the material having the highest content percentage among the materials in the red light-emitting layer 34R and the separation layer 35. Accordingly, in the subpixel 3R, the holes and electrons injected into the organic EL layer 22 from the first electrode 21 and the second electrode 23, respectively, recombine in the red light-emitting layer 34R and generate excitons, as indicated in FIG. 1.

Additionally, as described earlier, the $S_1$ level of the green fluorescent luminescent material is lower than the $S_1$ level of the blue fluorescent luminescent material, and a hole transporting material is used for at least one of the material in the blue fluorescent light-emitting layer 34B having the highest content percentage and the material in the green fluorescent light-emitting layer 34G having the highest content percentage. A bipolar transporting material, for example is used for the material in the red light-emitting layer 34R and the separation layer 35 having the highest content percentage. The $S_1$ level of the green fluorescent luminescent material is higher than the $S_1$ level of the red luminescent material, but because the separation layer 35 having a thickness exceeding the Förster radius is provided between the green fluorescent light-emitting layer 34G and the red light-emitting layer 34R, no energy moves to the red light-emitting layer 34R.

As such, in the subpixel 3G1, the holes and electrons injected into the organic EL layer 22 from the first electrode 21 and the second electrode 23 recombine and generate excitons in the blue fluorescent light-emitting layer 34B or the green fluorescent light-emitting layer 34G.

As described above, in the present embodiment, a hole transporting material is used for the material of at least one of the material in the blue fluorescent light-emitting layer 34B having the highest content percentage and the material in the green fluorescent light-emitting layer 34G having the highest content percentage. Whether excitons are generated in the blue fluorescent light-emitting layer 34B or in the green fluorescent light-emitting layer 34G is determined by the relationship between the carrier mobility of the material in the blue fluorescent light-emitting layer 34B having the highest content percentage and the carrier mobility of the material in the green fluorescent light-emitting layer 34G having the highest content percentage, as well as the layering order of the blue fluorescent light-emitting layer 34B and the green fluorescent light-emitting layer 34G.

As one example, FIG. 1 illustrates a case where the blue fluorescent light-emitting layer 34B is located further on the cathode electrode side (the second electrode 23 side) than the green fluorescent light-emitting layer 34G, both the material in the blue fluorescent light-emitting layer 34B having the highest content percentage and the material in the green fluorescent light-emitting layer 34G having the highest content percentage are hole transporting material, and excitons are generated in the blue fluorescent light-emitting layer 34B.

When the $S_1$ level of the blue fluorescent light-emitting layer 34B is higher than the $S_1$ level of the green fluorescent light-emitting layer 34G and excitons are generated in the blue fluorescent light-emitting layer 34B, the excitons generated in the blue fluorescent light-emitting layer 34B transfer energy from the blue fluorescent light-emitting layer 34B to the green fluorescent light-emitting layer 34G through Förster transfer between the $S_1$ levels. However, energy transfer to the red light-emitting layer 34R from the blue fluorescent light-emitting layer 34B and the green fluorescent light-emitting layer 34G is inhibited by the separation layer 35, as described above. Accordingly, in the subpixel 3G1, the green fluorescent light-emitting layer 34G emits light at substantially 100% (green light emission). Accordingly, in the present embodiment, color mixing is suppressed in the subpixel 3G1 despite a plurality of light-emitting layers 34 being layered.

Additionally, according to the present embodiment, when forming the blue fluorescent light-emitting layer 34B in common for the subpixel 3B and the subpixel 3G1 through linear deposition (described later), even if the blue fluorescent light-emitting layer 34B has infiltrated into the subpixel 3G2 and the blue fluorescent light-emitting layer 34B has been formed on the green fluorescent light-emitting layer 34G, energy is transferred from the blue fluorescent luminescent material to the green fluorescent luminescent material as described above, and thus blue color mixing will not arise in the subpixel 3G2.

Additionally, according to the present embodiment, when forming the red light-emitting layer 34R in common for the subpixel 3G1 and the subpixel 3R through linear deposition (described later), even if the red light-emitting layer 34R has infiltrated into the subpixel 3B and the red light-emitting layer 34R has been formed under (i.e., on the first electrode 21 side of) the blue fluorescent light-emitting layer 34B, electrons will not reach the red light-emitting layer 34R, and red color mixing will therefore not arise in the subpixel 3B, as long as the material in the blue fluorescent light-emitting layer 34B having the highest content percentage is a hole transporting material. "Linear deposition" refers to deposition in a linear shape rather than in dot shapes.

Likewise, when forming the red light-emitting layer 34R in common for the subpixel 3G1 and the subpixel 3R through linear deposition (described later), even if the red light-emitting layer 34R has infiltrated into the subpixel 3G2 and the red light-emitting layer 34R has been formed under the green fluorescent light-emitting layer 34G, electrons will not reach the red light-emitting layer 34R, and red color mixing will therefore not arise in the subpixel 3G2, as long as the material in the green fluorescent light-emitting layer 34G having the highest content percentage is a hole transporting material.

Thus according to the present embodiment, using a hole transporting material for both the material in the blue fluorescent light-emitting layer 34B having the highest content percentage and the material in the green fluorescent light-emitting layer 34G having the highest content percentage makes it possible to achieve a configuration in which color mixing does not easily arise even if even a minute amount of the red luminescent material infiltrates into another subpixel 3 (i.e., at least one of the subpixel 3B and the subpixel 3G2) when depositing the red light-emitting layer 34R.

In this manner, according to the present embodiment, the number of conditions under which color mixing arises can be reduced by controlling the mobilities of the light-emitting layers 34 and through the Förster transfer effect.

Manufacturing Method for Organic EL Display Device 1

A manufacturing method for the organic EL display device 1 according to the present embodiment will be described next with reference to FIGS. 8 to 10.

Figure 9A:
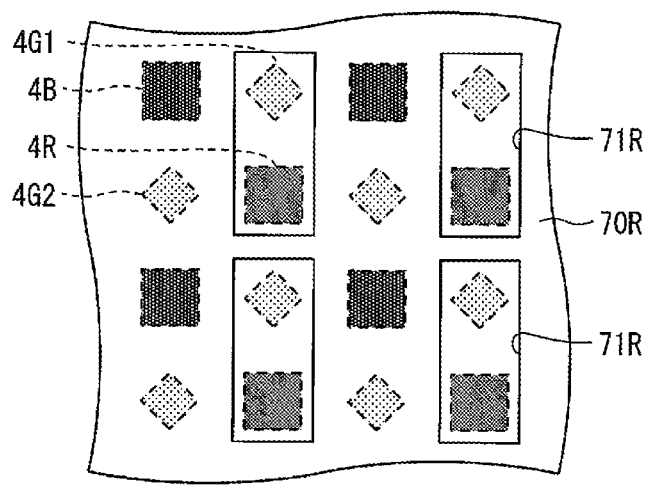
FIGS. 9A to 9C are plan views illustrating processes for producing the light-emitting layer unit in the organic EL display device according to the first embodiment of the disclosure, in the order of those processes.
Figure 9B:
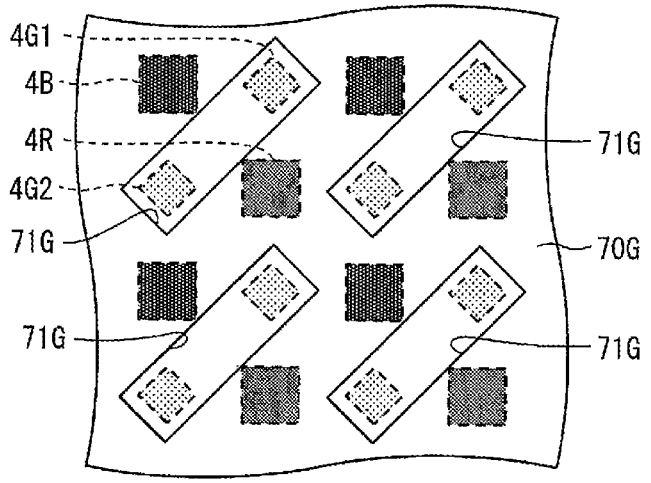
Figure 9C:
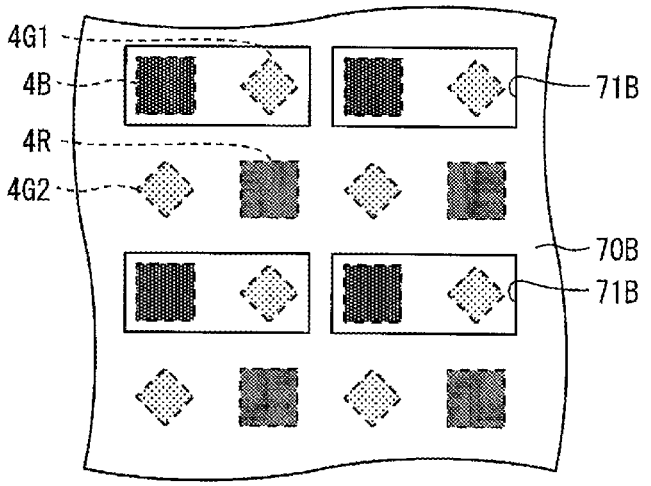

FIGS. 9A to 9C are plan views illustrating processes for producing the light-emitting layer unit 33 in the organic EL display device 1 according to the present embodiment, in the order of those processes. FIG. 10 is a flowchart illustrating the flow of processes for producing main portions of the organic EL display device 1 according to the present embodiment.

Note that in FIGS. 9A to 9C, the same hatching as that indicated in FIG. 3 has been added to the light emitting regions 4 for the purpose of identifying the light emitting region 4B, the light emitting region 4G1, the light emitting region 4G2, and the light emitting region 4R. The actual deposition is carried out through openings 71B, 71R, and 71G in vapor deposition masks 70B, 70R, and 70G, respectively. The light emitting region 4B, the light emitting region 4G1, the light emitting region 4G2, and the light emitting region 4R are positioned within the subpixel 3B, the subpixel 3G1, the subpixel 3G2, and the subpixel 3R, respectively, in that order.

The processes of producing the organic EL display device 1 according to the present embodiment include a TFT substrate preparation process of preparing the above-described TFT substrate 10, an organic EL element preparation process of forming the organic EL elements 20 on the TFT substrate 10, and a sealing process of sealing the organic EL elements 20 prepared in the organic EL element preparation process.

Figure 10:
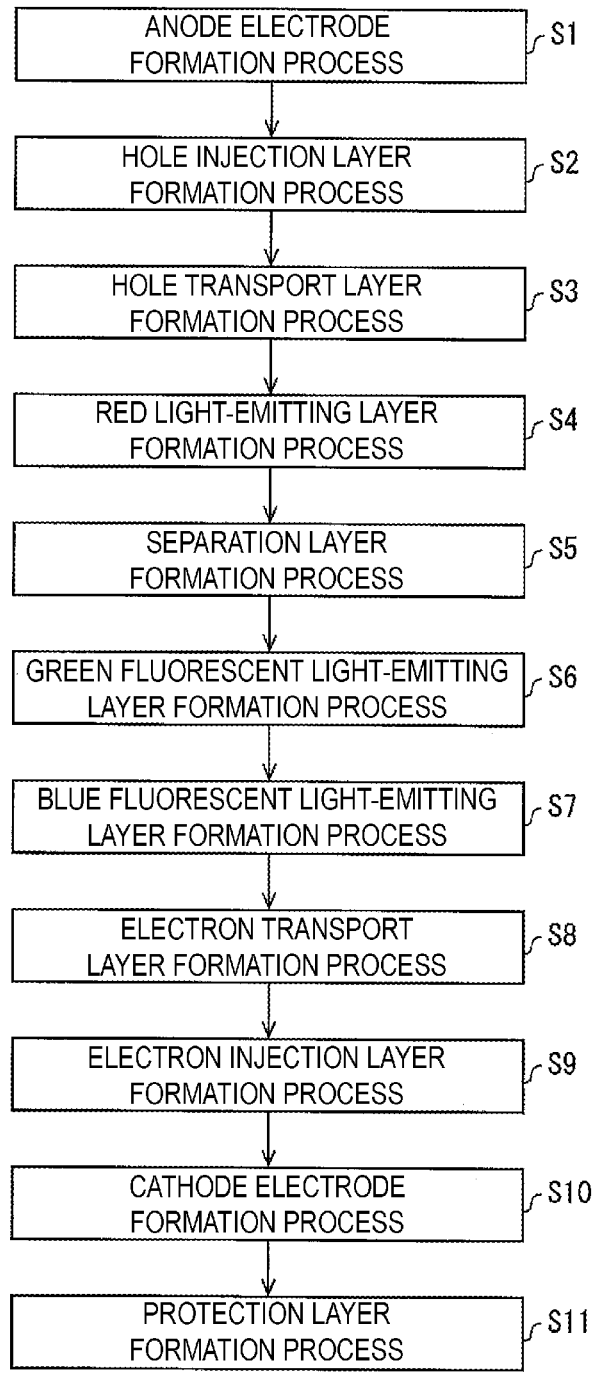
FIG. 10 is a flowchart illustrating the flow of processes for producing main portions of the organic EL display device according to the first embodiment of the disclosure.

As illustrated in FIG. 10, the organic EL element preparation process includes, for example, an anode electrode formation process (S1), a hole injection layer formation process (S2), a hole transport layer formation process (S3), a red light-emitting layer formation process (S4), a separation layer formation process (S5), a green fluorescent light-emitting layer formation process (S6), a blue fluorescent light-emitting layer formation process (S7), an electron transport layer formation process (S8), an electron injection layer formation process (S9), a cathode electrode formation process (S10), and a protection layer formation process (S11). The organic EL element preparation process is carried out in this order, for example, in the present embodiment. Note that the signs in the parentheses indicate step numbers.

Each of the processes indicated above will be described next.

First, in the TFT substrate preparation process, a photosensitive resin is applied, using a known technique, to the insulating substrate 11 in which the TFTs 12, the wiring lines 14, and the like are formed, and is then patterned through a photolithography technique to form the interlayer insulating film 13 on the insulating substrate 11.

An acrylic resin, a polyimide resin, or the like can be used as the interlayer insulating film 13, for example. As long as steps produced by the TFTs 12 can be compensated for, the film thickness of the interlayer insulating film 13 is not particularly limited.

Next, the contact hole 13a for electrically connecting the first electrode 21, serving as the anode electrode, to the TFT 12, is formed in the interlayer insulating film 13. The TFT substrate 10 is prepared as a result.

Next, the organic EL elements 20 are formed on the TFT substrate 10 formed in this manner (the organic EL element preparation process).

In the organic EL element preparation process, first, the first electrode 21 is formed on the TFT substrate 10 as the anode electrode (S1).

The anode electrode formation process (S1) according to the present embodiment includes a reflective electrode formation process of forming the reflective electrode 21a on the TFT substrate 10, and a light-transmissive electrode formation process of forming the light-transmissive electrode 21b on the reflective electrode 21a.

Accordingly, in the anode electrode formation process (S1), first, a reflective electrode material is patterned and formed at a prescribed thickness on the TFT substrate 10 as the reflective electrode 21a of the first electrode 21.

The reflective electrode 21a may, for example, be patterned by forming a reflective electrode material as a film through sputtering or the like, using photolithography to form a resist pattern (not shown) for each subpixel 3, etching the layer constituted by the reflective electrode material using the resist patterns as a mask, and then separating the resist pattern on a subpixel 3-by-subpixel 3 basis through peeling and cleaning. Alternatively, a pattern film may be formed through a printing method, vapor deposition using a vapor deposition mask, or the like. For example, vacuum vapor deposition, CVD (chemical vapor deposition), plasma CVD, or the like can be used as the vapor deposition method.

Next, a light-transmissive electrode material is patterned and formed at a prescribed thickness on the reflective electrode 21a as the light-transmissive electrode 21b of the first electrode 21.

It is desirable that the distance between the reflective electrode 21a and the second electrode 23 serving as the cathode electrode be set to a distance that strengthens the intensity of the peak wavelengths of light in the wavelength ranges of the colors of light emitted from the respective subpixels 3.

Figure 8:
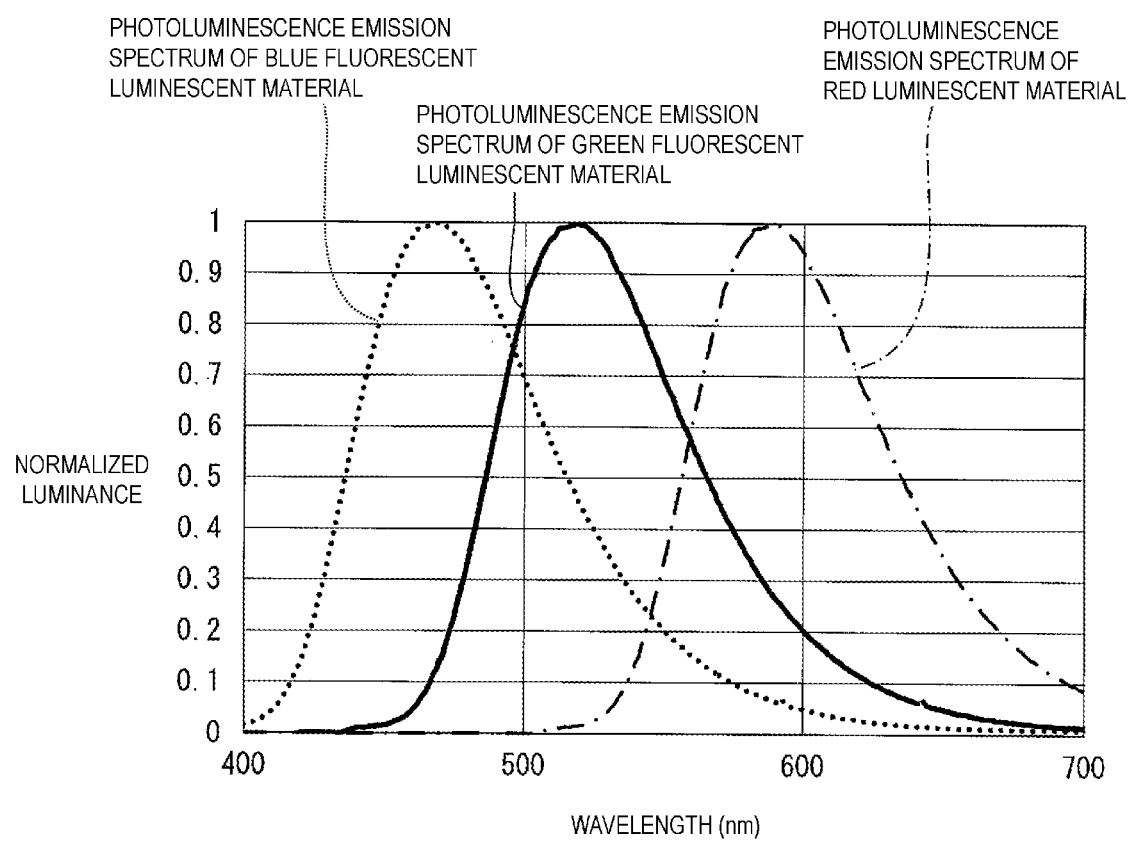
FIG. 8 is a graph illustrating an example of the photoluminescence emission spectrum of the blue fluorescent luminescent material, the photoluminescence emission spectrum of the green fluorescent luminescent material, and a photoluminescence emission spectrum of the red luminescent material.

FIG. 8 is a graph illustrating an example of the PL emission spectrum of the blue fluorescent luminescent material, the PL emission spectrum of the green fluorescent luminescent material, and the PL emission spectrum of the red luminescent material.

Note that FIG. 8 illustrates the PL emission spectrum of TBPe, used in Example 1 (described later), as the PL emission spectrum of the blue fluorescent luminescent material; the PL emission spectrum of coumarin 6, used in Example 1 (described later), as the PL emission spectrum of the green fluorescent luminescent material; and the PL emission spectrum of Ir(piq)3, used in Example 1 (described later), as the PL emission spectrum of the red luminescent material.

As illustrated in FIG. 8, the peak wavelength of the blue fluorescent luminescent material (a first peak wavelength) is approximately 470 nm, the peak wavelength of the green fluorescent luminescent material (a second peak wavelength) is approximately 520 nm, and the peak wavelength of the red luminescent material (a third peak wavelength) is approximately 590 nm.

The organic EL elements 20 according to the present embodiment are microcavity-type organic EL elements. In a microcavity-type organic EL element, emitted light is reflected in multiple between the anode electrode and the cathode electrode and resonated to produce a steep emission spectrum, and the light emission intensity at a specific wavelength is amplified.

A method of varying lengths between two resonance surfaces of organic EL elements (cavity lengths) on a luminescent color-by-luminescent color basis, i.e., varying the optical path length, is known as an example of a method for introducing such a resonance structure (microcavity structure) into organic EL elements.

In the present embodiment, the cavity length is varied on a subpixel 3-by-subpixel 3 basis by setting the thickness of the light-transmissive electrode 21b on a subpixel 3-by-subpixel 3 basis, and the microcavity effect is used to improve the light emission color, the light emission efficiency, and the like.

Accordingly, some of the light emitted from the luminescent materials in each subpixel 3 according to the present embodiment is emitted directly to the exterior, and the remaining light is reflected in multiple and then emitted to the exterior. In other words, the light emitted to the exterior from each subpixel 3 includes: light that is emitted from the luminescent material, and is emitted as-is to the exterior through the light-transmissive electrode (the second electrode 23, in the present embodiment) provided on the side opposite from the side on which the reflective electrode is provided, with the organic EL layer 22 interposed therebetween; and light that is emitted from the luminescent material, is reflected in multiple between the anode electrode and the cathode electrode (and more specifically, between the reflective electrode and the light-transmissive electrode, which in the present embodiment is between the reflective electrode 21a of the first electrode 21 and the second electrode 23), and is then emitted to the exterior through the light-transmissive electrode (the second electrode 23, in the present embodiment) provided on the side opposite from the side on which the reflective electrode is provided.

As such, in the subpixel 3B, the light emitted from the blue fluorescent light-emitting layer 34B is emitted to the exterior, and the light emitted to the exterior at this time includes light obtained by the light emitted from the blue fluorescent light-emitting layer 34B (i.e., light emitted from the blue fluorescent luminescent material) being reflected in multiple between the anode electrode and the cathode electrode in the subpixel 3B. Likewise, in the subpixel 3G1 and the subpixel 3G2, the light emitted from the green fluorescent light-emitting layer 34G is emitted to the exterior; the light emitted to the exterior from the subpixel 3G1 includes light obtained by the light emitted from the green fluorescent light-emitting layer 34G (i.e., light emitted from the green fluorescent luminescent material) being reflected in multiple between the anode electrode and the cathode electrode in the subpixel 3G1, and the light emitted to the exterior from the subpixel 3G2 includes light obtained by the light emitted from the green fluorescent light-emitting layer 34G being reflected in multiple between the anode electrode and the cathode electrode in the subpixel 3G2. Additionally, in the subpixel 3R, the light emitted from the red light-emitting layer 34R is emitted to the exterior, and the light emitted to the exterior at this time includes light obtained by the light emitted from the red light-emitting layer 34R (i.e., light emitted from the red luminescent material) being reflected in multiple between the anode electrode and the cathode electrode in the subpixel 3R.

In the subpixel 3B, the thickness of the light-transmissive electrode 21b is set such that the distance between the reflective electrode 21a and the second electrode 23 is an optimal thickness for emitting light in a blue wavelength range to the exterior (a distance that strengthens the intensity of the peak wavelength of the blue fluorescent luminescent material). Likewise, in the subpixel 3G1 and the subpixel 3G2, the thickness of the light-transmissive electrode 21b is set such that the distance between the reflective electrode 21a and the second electrode 23 is an optimal thickness for emitting light in a green wavelength range to the exterior (a distance that strengthens the intensity of the peak wavelength of the green fluorescent luminescent material); and in the subpixel 3R, the thickness of the light-transmissive electrode 21b is set such that the distance between the reflective electrode 21a and the second electrode 23 is an optimal thickness for emitting light in a red wavelength range to the exterior (a distance that strengthens the intensity of the peak wavelength of the red luminescent material).

The method for changing the thickness of the light-transmissive electrode 21b in each subpixel 3 is not particularly limited. The light-transmissive electrode material may be formed at a desired thickness for each subpixel 3 through vapor deposition, a printing method, or the like; or the light-transmissive electrode material may be formed through sputtering and patterned through photolithography, after which the thickness of each layer constituted by the light-transmissive electrode material is adjusted to the desired thickness through ashing or the like.

As a result, the first electrodes 21, which have a different thickness for each of the subpixels 3, are formed in a matrix on the TFT substrate 10.

Next, the banks 15 are patterned and formed so as to cover the end portions of the first electrodes 21, in the same manner as the interlayer insulating film 13. Through this process, the first electrodes 21 are formed as the anode electrodes, so as to be separated by the bank 15 in each subpixel 3.

The TFT substrate 10 that has gone through the processes described above is then subjected to low-pressure baking to remove moisture, and an oxygen plasma process to clean the surfaces of the first electrodes 21.

Next, the material of the hole injection layer 31 and the material of the hole transport layer 32 are vapor-deposited, in that order, on the entirety of the display region of the TFT substrate 10 on which the first electrodes 21 are formed, as carried out in the past (S2, S3).

Next, the material of the red light-emitting layer 34R is deposited linearly in a direction connecting the subpixel 3G1 and the subpixel 3R, using the vapor deposition mask 70R for forming the red light-emitting layer, in which a plurality of the openings 71R for two subpixels, corresponding to the subpixel 3R and the subpixel 3G1 in each pixel 2, are provided in the row direction and the column direction; as a result, the red light-emitting layer 34R is formed in the light emitting region 4G1 and the light emitting region 4R, as indicated by the broken lines in FIG. 9B. In the present embodiment, the material of the red light-emitting layer 34R is linearly deposited in subpixel columns of even-numbered rows that constitute the subpixel 3G1 and the subpixel 3R. The red light-emitting layer 34R is formed on the hole transport layer 32 as an intermittent stripe following the column direction as a result (S4).

Next, the material of the separation layer 35 is deposited linearly in a direction connecting the subpixel 3G1 and the subpixel 3R, using the vapor deposition mask 70R for forming the red light-emitting layer, on the red light-emitting layer 34R. As a result, the separation layer 35 having the same pattern as the red light-emitting layer 34R when viewed in a plan view is layered upon the red light-emitting layer 34R (S5).

Note that in the present embodiment, the red light-emitting layer 34R and the separation layer 35 have the same pattern when viewed in a plan view, and thus an example in which the red light-emitting layer 34R and the separation layer 35 are formed consecutively using the same vapor deposition mask 70R has been described as an example. However, the present embodiment is not limited thereto. The red light-emitting layer 34R and the separation layer 35 may be patterned and formed using separate dedicated vapor deposition masks having the same opening pattern.

Next, the material of the green fluorescent light-emitting layer 34G is linearly-deposited in the direction connecting the adjacent subpixel 3G1 and subpixel 3G2 in each pixel 2 (i.e., the direction connecting the subpixel 3G1 and the subpixel 3G2 that are directly adjacent) using, as the vapor deposition mask 70G, a vapor deposition mask 70G in which a plurality of the openings 71G are provided in the oblique direction, which intersects with the row direction and the column direction, for two subpixels, corresponding to the subpixel 3G1 and the subpixel 3G2 in each pixel 2; as a result, the green fluorescent light-emitting layer 34G is formed in the light emitting region 4G1 and the light emitting region 4G2 indicated by the broken lines, as illustrated in FIG. 9B. Accordingly, the green fluorescent light-emitting layer 34G is formed, as an intermittent stripe following the oblique direction, on the hole transport layer 32, overlapping the separation layer 35 in the subpixel 3G1 and disposed directly on the hole transport layer 32 in the subpixel 3G2 (S6).

Next, the material of the blue fluorescent light-emitting layer 34B is deposited linearly in a direction connecting the subpixel 3B and the subpixel 3G1, using the vapor deposition mask 70B for forming the blue fluorescent light-emitting layer, in which a plurality of the openings 71B for two subpixels, corresponding to the subpixel 3B and the subpixel 3G1 in each pixel 2, are provided in the row direction and the column direction; as a result, the blue fluorescent light-emitting layer 34B is formed in the light emitting region 4B and the light emitting region 4G1, as indicated by the broken lines in FIG. 9C. In the present embodiment, the material of the blue fluorescent light-emitting layer 34B is linearly deposited in subpixel columns of odd-numbered rows that constitute the subpixel 3B and the subpixel 3G1. Accordingly, the blue fluorescent light-emitting layer 34B is formed, as an intermittent stripe following the row direction, on the hole transport layer 32, overlapping the green fluorescent light-emitting layer 34G in the subpixel 3G1 and disposed directly on the hole transport layer 32 in the subpixel 3B (S7).

Note that metal masks formed from a metal can be used as the vapor deposition masks 70B, 70R, and 70G, for example.

Then, the material of the electron transport layer 36 and the material of the electron injection layer 37 are vapor-deposited, in that order, on the entirety of the display region of the TFT substrate 10 on which the above-described colors of light-emitting layers 34 are formed, as carried out in the past (S8, S9).

Next, the second electrode 23 is formed as the cathode electrode on the entirety of the display region in the TFT substrate 10, so as to cover the electron injection layer 37 (S10).

Vapor deposition such as vacuum vapor deposition, CVD, plasma CVD, or the like, sputtering, a printing method, or the like may be used to form the second electrode 23.

Then, the material of the protection layer 24 is vapor-deposited on the entirety of the display region in the TFT substrate 10, so as to cover the second electrode 23 (S11). The organic EL elements 20 are formed on the TFT substrate 10 as a result.

The TFT substrate 10 on which the organic EL elements 20 are formed and the sealing substrate 40 are then affixed to each other by a filler layer and a sealing member (not shown), as illustrated in FIG. 4, by carrying out the sealing process. The organic EL display device 1 according to the present embodiment is obtained in this manner.

However, the method of sealing the organic EL elements 20 is not limited to the method described above, and various known sealing methods can be employed instead.

In the present embodiment, the reflective electrode 21a, the light-transmissive electrode 21b, the hole injection layer 31, the hole transport layer 32, the red light-emitting layer 34R, the separation layer 35, the green fluorescent light-emitting layer 34G, the blue fluorescent light-emitting layer 34B, the electron transport layer 36, the electron injection layer 37, the second electrode 23, and the protection layer 24 are layered on the TFT substrate 10, in that order from the TFT substrate 10 side, on the basis of the flowchart illustrated in FIG. 10, as Example 1.

Materials for the layers layered on the TFT substrate 10 and thicknesses thereof in Example 1 are as follows. However, the dimensions and materials denoted below are merely examples, and the present embodiment is not intended to be limited to these specific dimensions and materials. The following assumes that the thickness of the light-transmissive electrode 21b has been optically optimized through optical simulations to align the luminescent color of the subpixel 3G1 and the luminescent color of the subpixel 3G2.

Example 1

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 135 nm/subpixel 3G2: 165 nm/subpixel 3R: 40 nm)

Hole injection layer 31: HAT-CN (10 nm)

Hole transport layer 32: TCTA (20 nm)

Red light-emitting layer 34R: CBP (host material 90%)/Ir(piq)3 (red luminescent material, 10%) (10 nm)

Separation layer 35: CBP (20 nm)

Green fluorescent light-emitting layer 34G: TPD (host material, 90%)/coumarin 6 (green fluorescent luminescent material, 10%) (10 nm)

Blue fluorescent light-emitting layer 34B: ADN (host material, 90%)/TBPe (blue fluorescent luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

As described above, in the present embodiment, the blue fluorescent light-emitting layer 34B, the green fluorescent light-emitting layer 34G, and the red light-emitting layer 34R are common light-emitting layers that are each common to two of the subpixels 3 in each pixel 2. By using common light-emitting layers, light emission is achieved using the Förster-type energy transfer of the fluorescent luminescent material and the transferable distance thereof, while improving the productivity.

As described above, according to the present embodiment, the blue fluorescent light-emitting layer 34B, the green fluorescent light-emitting layer 34G, and the red light-emitting layer 34R are layered in the subpixel 3G1; however, while Förster-type energy transfer occurs from the blue fluorescent light-emitting layer 34B to the green fluorescent light-emitting layer 34G, no Förster-type energy transfer occurs from the blue fluorescent light-emitting layer 34B and the green fluorescent light-emitting layer 34G to the red light-emitting layer 34R, and thus only the green fluorescent luminescent material emits light.

In other words, the green fluorescent luminescent material, which is the luminescent material in the green fluorescent light-emitting layer 34G, has a lower $S_1$ level than the blue fluorescent luminescent material, which is the luminescent material in the blue fluorescent light-emitting 34B, and the opposing surface distance $D_{BG}$ between the blue fluorescent light-emitting layer 34B and the green fluorescent light-emitting layer 34G is less than or equal to the Förster radius. As such, even if, for example, holes and electrons recombine in the blue fluorescent light-emitting layer 34B, the Förster transfer enables the green fluorescent luminescent material to emit light at substantially 100%. Additionally, the separation layer 35 is provided between the red light-emitting layer 34R and the green fluorescent light-emitting layer 34G, which of the blue fluorescent light-emitting layer 34B and the green fluorescent light-emitting layer 34G is located on the red light-emitting layer 34R side, and thus energy transfer from the blue fluorescent light-emitting layer 34B and the green fluorescent light-emitting layer 34G to the red light-emitting layer 34R is inhibited. Thus as described above, color mixing can be suppressed even if the RGB light-emitting layers 34 are layered in the subpixel 3G1.

In an organic EL display device having a PenTile arrangement that does not employ the above-described layered structure, linear deposition can only be carried out for subpixel columns constituted by green subpixels.

However, according to the present embodiment, employing the above-described layered structure makes it possible, when depositing the red light-emitting layer 34R, the green fluorescent light-emitting layer 34G, and the blue fluorescent light-emitting layer 34B, to form two adjacent subpixels 3 including the subpixel 3G1 as a single unit (i.e., in a single vapor deposition region). In other words, because the subpixel 3G1 has a layered structure including the light-emitting layers 34 of all of the colors provided in the subpixel 3B, the subpixel 3G1, and the subpixel 3R, linear deposition can be carried out not only in the direction connecting the subpixel 3G1 and the subpixel 3G2, but also in the direction connecting the subpixel 3G1 and the subpixel 3R and in the direction connecting the subpixel 3B and the subpixel 3G1. This makes it possible to suppress color mixing in those directions as well.

Furthermore, according to the present embodiment, the light-emitting layers 34 and the separation layer 35, which is an intermediate layer (the first intermediate layer), in all of the RGB subpixels 3, which are arranged having a PenTile arrangement, can be vapor-deposited using a vapor deposition mask having an opening pattern constituted by two subpixels' worth of openings, as described above. As such, the deposition margin for preventing color mixing can be reduced, the resolution can be improved by reducing the pitch of the subpixels 3, and the surface area of the subpixels 3 can be broadened and current stress reduced while providing the same resolution, which makes it possible to lengthen the lifespan of the organic EL elements 20.

Thus according to the present embodiment, the blue fluorescent light-emitting layer 34B, the green fluorescent light-emitting layer 34G, and the red light-emitting layer 34R can be linearly deposited, and color mixing does not arise easily despite a plurality of the light-emitting layers 34 being layered in the subpixel 3G1 as described above. Accordingly, the deposition margin for preventing color mixing can be reduced more than in display devices using known separate-patterning techniques, and a higher resolution can be achieved more easily than in display devices using known separate-patterning techniques.

Additionally, the organic EL display device 1 does not require a CF layer or an optical interference effect as with the white CF technique or PTL 1, despite having the above-described layered structure for the light-emitting layers. This makes it possible to avoid a situation where more power is consumed, the light distribution properties worsen, and the like. Therefore, a high color level and low power consumption can be achieved at the same time.

Thus according to the present embodiment, it is possible to provide a display device that can reduce the deposition margin for preventing color mixing by making color mixing less likely than in display devices using the known separate-patterning technique, thereby achieving higher resolutions more easily, and that can achieve both high color levels and low power consumption. Additionally, in the present embodiment, the light emitting regions 4G1 and 4G2 (the subpixels 3G1 and 3G2) are rotated by 45 degrees relative to the light emitting regions 4B and 4R (the subpixels 3B and 3R), for diamond shapes, as illustrated in FIGS. 3 and 9B. In the present embodiment, the green fluorescent light-emitting layer 34G is linearly-deposited in an oblique direction with respect to a display region 1a, as illustrated in FIG. 9B. Thus as illustrated in FIG. 9B, by carrying out linear deposition so that the respective sides of the opening 71G in the vapor deposition mask 70G are parallel to the respective sides of the light emitting regions 4G1 and 4G2 that oppose the stated sides, the gaps between the light emitting regions 4 can be used to the greatest extent possible, which makes it possible to increase the density at which the subpixels 3 are provided.

Modified Example

The present embodiment describes an example in which the display device according to the present embodiment is an organic EL display device. However, the display device according to the present embodiment may be any display device employing PL light emission. The display device according to the present embodiment is therefore not limited to the above-described examples, and may be, for example, an inorganic EL display device, a display device aside from an EL display device that employs PL light emission, or the like. Furthermore, inorganic materials may be used for the luminescent materials, and inorganic layers may be formed instead of organic layers.

The present embodiment describes forming the blue fluorescent light-emitting layer 34B as the first light-emitting layer containing the first fluorescent luminescent material, forming the green fluorescent light-emitting layer 34G as the second light-emitting layer containing the second fluorescent luminescent material, and forming the red light-emitting layer 34R as the third light-emitting layer containing the third luminescent material. However, the present embodiment is not limited thereto. The combination of the first fluorescent luminescent material, the second fluorescent luminescent material, and the third luminescent material is not limited to a combination of the blue fluorescent luminescent material, the green fluorescent luminescent material, and the red luminescent material. Any combination may be used as long as the second fluorescent luminescent material emits light having a peak wavelength (second peak wavelength) longer than the peak wavelength of the light emitted from the first fluorescent luminescent material (first peak wavelength), the third luminescent material emits light having a peak wavelength (third peak wavelength) longer than the second peak wavelength, and the $S_1$ level of the second fluorescent luminescent material is lower than the $S_1$ level of the first fluorescent luminescent material and higher than the $S_1$ level of the third luminescent material.

Additionally, although the present embodiment describes a case where the light-emitting layers 34 in all of the RGB subpixels 3 are vapor-deposited using a vapor deposition mask having an opening pattern constituted by two subpixels' worth of openings, the present embodiment is not limited thereto. When forming any one of the RGB light-emitting layers 34, e.g., when forming the green fluorescent light-emitting layer 34G, a normal vapor deposition mask having an opening pattern in which individual openings 71G are provided for each subpixel 3 may be used as the vapor deposition mask 70G. In other words, the function layers constituting the light-emitting layer unit 33, aside from the green fluorescent light-emitting layer 34G, may be vapor-deposited using a vapor deposition mask having an opening pattern in which two subpixels' worth of openings are provided in the row direction and the column direction, and only the green fluorescent light-emitting layer 34G may be vapor-deposited using the above-described normal vapor deposition mask. In this case too, linear deposition of the blue fluorescent light-emitting layer 34B and linear deposition of the red light-emitting layer 34R can be carried out, which is not possible in an organic EL display device having a PenTile arrangement that does not employ the above-described layered structure.

Second Embodiment

Figure 11:
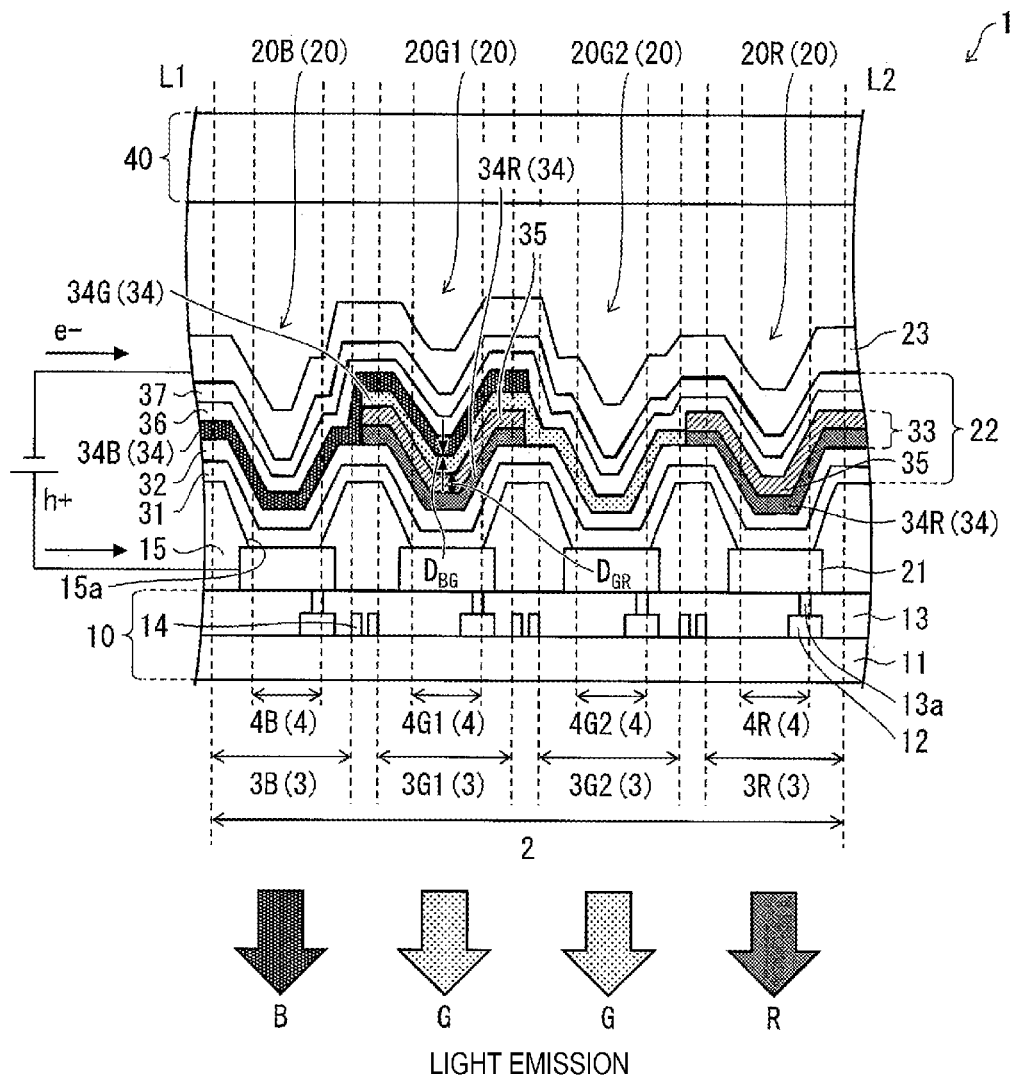
FIG. 11 is a cross-sectional view illustrating an example of the overall configuration of an organic EL display device according to a second embodiment of the disclosure.

A description follows regarding another embodiment of the disclosure, primarily on the basis of FIGS. 3, 10, and 11.

The present embodiment will describe differences from the first embodiment, and constituent elements having the same functions as the constituent elements described in the first embodiment will be assigned the same reference signs, with descriptions thereof omitted. It goes without saying that the same modifications as those of the first embodiment can be applied to the present embodiment as well.

FIG. 11 is a cross-sectional view illustrating an example of the overall configuration of the organic EL display device 1 according to the present embodiment. Like the organic EL display device 1 according to the first embodiment, the organic EL display device 1 according to the present embodiment has the PenTile pixel arrangement illustrated in FIG. 3. As such, FIG. 11 illustrates an example of the overall configuration of a single pixel area, enclosed within the single dot-single dash line in FIG. 3, and illustrates the overall configuration in a cross-section taken along the line L1-L2 indicated in FIG. 3.

The organic EL display device 1 according to the present embodiment is a bottom-emitting organic EL display device in which light from the light-emitting layer unit 33 is emitted from the first electrode 21 side, i.e., from the TFT substrate 10 side. The first electrode 21 is a light-transmissive electrode, and a reflective electrode that is thicker than the second electrode 23 (the semitransparent electrode) in the organic EL display device 1 according to the first embodiment is used as the second electrode 23 instead of providing the protection layer 24. Aside from this, however, the organic EL display device 1 according to the present embodiment is the same as the organic EL display device 1 according to the first embodiment.

The light-emission direction of the organic EL display device 1 may be on the first electrode 21 side or on the second electrode 23 side. As such, the organic EL display device 1 may have a bottom-emitting structure, as in the present embodiment.

Note that when the organic EL display device 1 is a bottom-emitting device, an insulating substrate that is transparent, called a transparent substrate or a light-transmitting substrate, such as a glass substrate or a plastic substrate, is used as the insulating substrate 11.

Additionally, when the organic EL display device 1 is a bottom-emitting device, the light from the light-emitting layer unit 33 is emitted from the light-transmissive electrode side directly from the light-transmissive electrode side, or having been reflected by the reflective electrode. Accordingly, in the present embodiment, the first electrode 21 on the TFT substrate 10 is a light-transmissive electrode, and the second electrode 23 is a reflective electrode, as described above. The light-transmissive electrode material, the reflective electrode material, and the like described as examples in the first embodiment can be used as the materials of the light-transmissive electrode and the reflective electrode.

In the present embodiment, the first electrode 21 constituted by the light-transmissive electrode, the hole injection layer 31, the hole transport layer 32, the red light-emitting layer 34R, the separation layer 35, the green fluorescent light-emitting layer 34G, the blue fluorescent light-emitting layer 34B, the electron transport layer 36, the electron injection layer 37, and the second electrode 23 constituted by the reflective electrode are layered, in that order from the TFT substrate 10 side, on the TFT substrate 10, on the basis of the flowchart illustrated in FIG. 10.

Materials for the layers layered on the TFT substrate 10 and thicknesses thereof are as follows. However, the dimensions and materials denoted below are merely examples, and the present embodiment is not intended to be limited to those specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 2

First electrode 21 (anode electrode, light-transmissive electrode) ITO: (50 nm)
Hole injection layer 31: HAT-CN (10 nm)
Hole transport layer 32: TCTA (20 nm)
Red light-emitting layer 34R: CBP (host material 90%)/Ir(piq)3 (red luminescent material, 10%) (10 nm)
Separation layer 35: CBP (20 nm)
Green fluorescent light-emitting layer 34G: TPD (host material, 90%)/coumarin 6 (green fluorescent luminescent material, 10%) (10 nm)
Blue fluorescent light-emitting layer 34B: ADN (host material, 90%)/TBPe (blue fluorescent luminescent material, 10%) (10 nm)
Electron transport layer 36: BCP (30 nm)
Electron injection layer 37: LiF (1 nm)
Second electrode 23 (cathode electrode, reflective electrode): Al (100 nm)

According to the present embodiment, a bottom-emitting organic EL display device 1 having the same effects as those of the first embodiment can be provided.

Additionally, when the organic EL display device 1 has a bottom-emitting structure as described above, the microcavity effect is weak, and thus the color level, light emission efficiency, and the like of the organic EL elements 20 in the subpixels 3 do not easily change even if the optical path length (cavity length) of the organic EL elements 20 in the subpixels 3 is changed. As such, if, like the first electrode 21 according to the first embodiment, the second electrode 23 is given a layered structure including the reflective electrode and a light-transmissive electrode serving as a thickness adjustment layer (an optical path length adjustment layer), the color level, efficiency, and the like of the organic EL elements 20 in the subpixels 3 will not change easily, even if the optical path length of the organic EL elements 20 in the subpixels 3 is changed by changing the thickness of the light-transmissive electrode, the thickness of the organic EL layer 22 between the first electrode 21 and the second electrode 23 is changed in each subpixel 3, or the like.

Thus according to the present embodiment, there is no particular problem even if the layers in the organic EL display device 1 have a uniform thickness as described above, and thus the process of producing the organic EL display device 1 can be simplified compared to when a top-emitting structure is used.

Third Embodiment

A description follows regarding yet another embodiment of the disclosure, primarily on the basis of FIGS. 1 to 4 and 10 to 13.

The present embodiment will describe differences from the first and second embodiments, and constituent elements having the same functions as the constituent elements described in the first and second embodiments will be assigned the same reference signs, with descriptions thereof omitted. It goes without saying that the same modifications as those of the first and second embodiments can be applied to the present embodiment as well.

Overall Configuration of Organic EL Display Device 1

Figure 12:
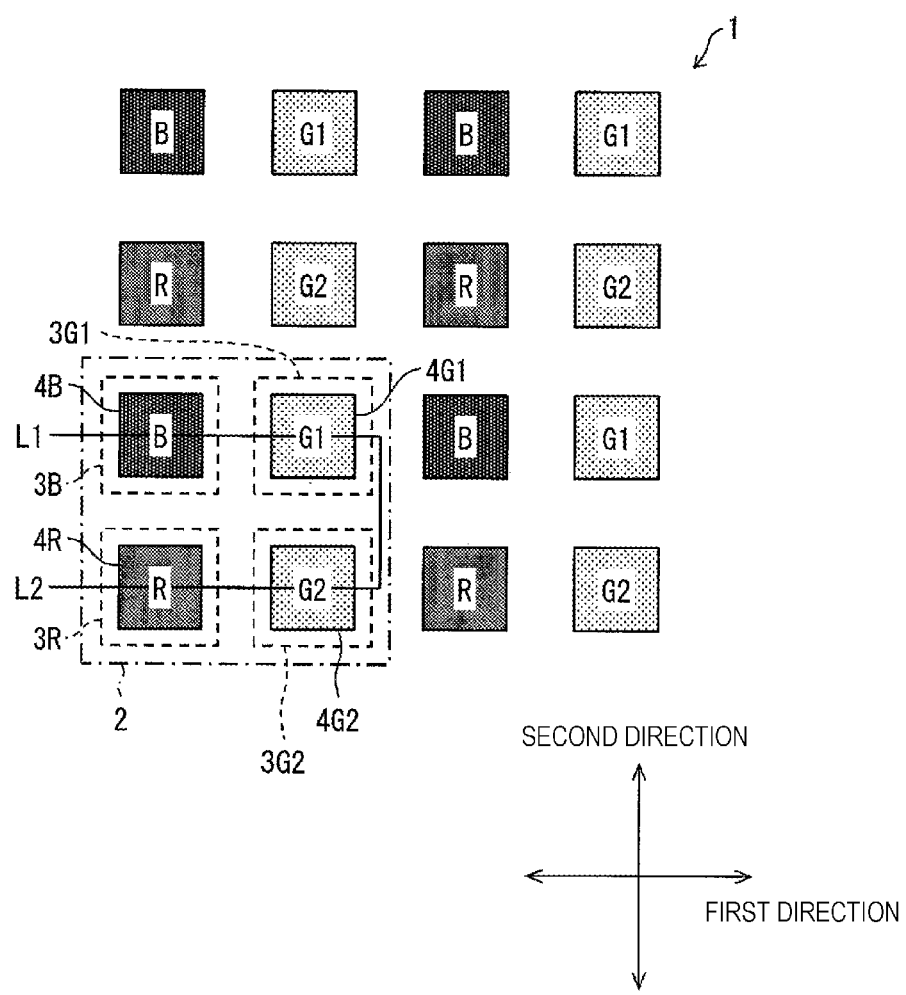
FIG. 12 is a diagram schematically illustrating a pixel arrangement in an organic EL display device according to a third embodiment of the disclosure.

FIG. 12 is a diagram schematically illustrating a pixel arrangement in the organic EL display device 1 according to the present embodiment.

The first and second embodiments describe a case where the organic EL display device 1 has a PenTile arrangement as an example. However, as illustrated in FIG. 12, the organic EL display device 1 may have an S-Stripe type pixel arrangement (an S-Stripe arrangement), in which the subpixel 3B is adjacent to the subpixel 3G1 and the subpixel 3R is adjacent to the subpixel 3G2 in the row direction, and the subpixel 3B is adjacent to the subpixel 3R and the subpixel 3G1 is adjacent to the subpixel 3G2 in the column direction orthogonal to the row direction. Columns constituted by the subpixels 3B and the subpixels 3G1 and columns constituted by the subpixels 3G2 and the subpixels 3R, which are formed following the row direction, are arranged alternating in the column direction, and in the display region, the respective colors of the subpixels 3 repeat in the row direction such that the subpixel 3B and the subpixel 3G1 are arranged in an alternating manner in odd-numbered rows, and the subpixel 3R and the subpixel 3G2 are arranged in an alternating manner in even-numbered rows, for example, in the S-Stripe arrangement as well, in the same manner as in the PenTile arrangement. These arrangements make use of the fact that human vision is less sensitive to R and B and more sensitive to G. As illustrated in FIGS. 3 and 12, in these arrangements, each row is constituted by two colors at a time, namely the subpixel 3B and the subpixel 3G1 or the subpixel 3G2 and the subpixel 3R. Also, in each row, subpixels of colors lacking as compared to RGB arrangements are reproduced in a simulated manner through combinations with subpixels in adjacent rows. Thus in these arrangements, the dot width of the subpixels 3 in each row can be increased in the row direction by an amount corresponding to the subpixels of the colors lacking, as compared to a vertical stripe-type RGB arrangement. Accordingly, a high-resolution organic EL display device 1 can be produced with ease, and a resolution that appears high can be maintained, even with a lower number of pixels. Note that in the present embodiment, the light emitting regions 4 (the subpixels 3) are all rectangular in shape, as illustrated in FIGS. 12 and 13A to 13C.

Unlike an organic EL display device having a known S-Stripe arrangement, the subpixel 3G1 and the subpixel 3G2 in the organic EL display device 1 according to the present embodiment have a different layered structure, as illustrated in FIGS. 1, 2, 4, and 11.

Manufacturing Method for Organic EL Display Device 1

Figure 13A:
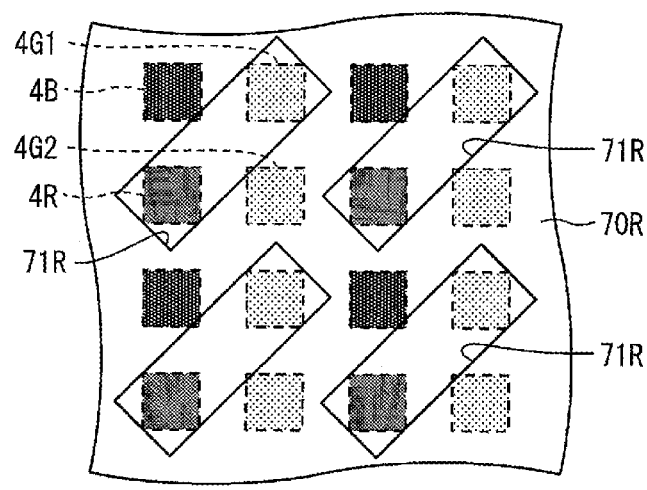
FIGS. 13A to 13C are plan views illustrating processes for producing the light-emitting layer unit in the organic EL display device according to the third embodiment of the disclosure, in the order of those processes.
Figure 13B:
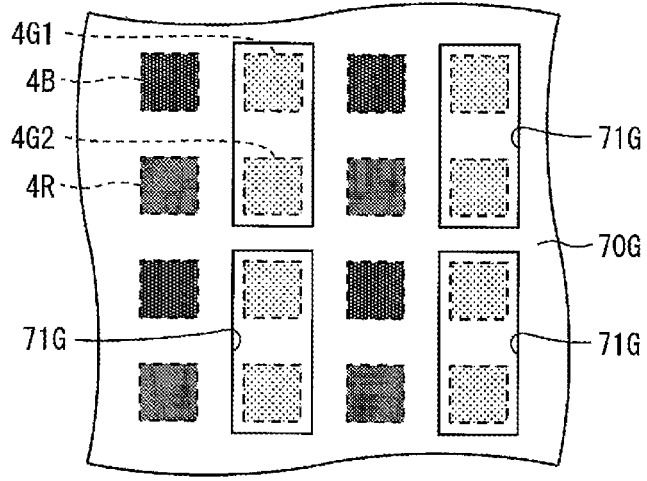
Figure 13C:
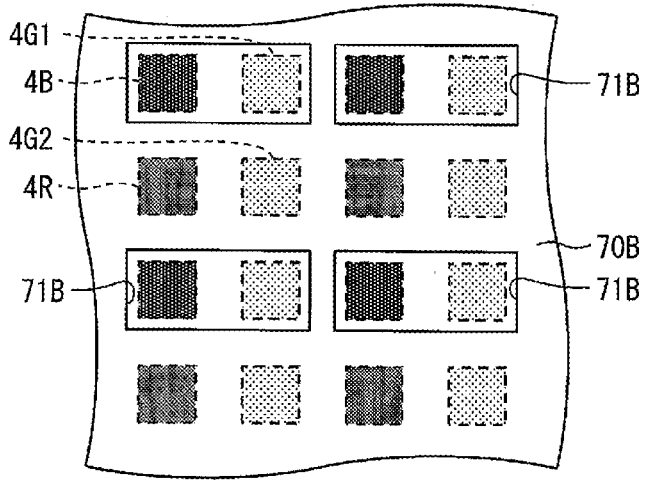

FIGS. 13A to 13C are plan views illustrating processes for producing the light-emitting layer unit 33 in the organic EL display device 1 according to the present embodiment, in the order of those processes. Note that in FIGS. 13A to 13C, the same hatching as that indicated in FIG. 12 has been added to the light emitting regions 4 for the purpose of identifying the light emitting region 4B, the light emitting region 4G1, the light emitting region 4G2, and the light emitting region 4R. The actual deposition is carried out through openings 71B, 71R, and 71G in vapor deposition masks 70B, 70R, and 70G, respectively. As described earlier, the light emitting region 4B, the light emitting region 4G1, the light emitting region 4G2, and the light emitting region 4R are positioned within the subpixel 3B, the subpixel 3G1, the subpixel 3G2, and the subpixel 3R, respectively, in that order.

In the manufacturing method for the organic EL display device 1 according to the present embodiment, vapor deposition is carried out using the vapor deposition masks 70R, 70G, and 70B illustrated in FIGS. 13A to 13C in the red light-emitting layer formation process (S4) to the blue fluorescent light-emitting layer formation process (S7) illustrated in FIG. 10.

In the present embodiment, in the red light-emitting layer formation process (S4) and the separation layer formation process (S5), the material of the red light-emitting layer 34R and the material of the separation layer 35 are linearly-deposited in the direction connecting the subpixel 3G1 and the subpixel 3R (i.e., the direction connecting the subpixel 3G1 and the subpixel 3R immediately adjacent to each other) using the vapor deposition mask 70R for forming the red light-emitting layer material, in which a plurality of the openings 71R are provided in the oblique direction for two subpixels, corresponding to the subpixel 3G1 and the subpixel 3R in each pixel 2; as a result, the red light-emitting layer 34R and the separation layer 35 are formed in the light emitting region 4G1 and the light emitting region 4R indicated by the broken lines, as illustrated in FIG. 13A. As a result, the red light-emitting layer 34R is formed on the hole transport layer 32, in an intermittent stripe shape along the oblique direction, and the separation layer 35 having the same pattern as the red light-emitting layer 34R when viewed in a plan view is layered on the red light-emitting layer 34R.

However, in the present embodiment too, the red light-emitting layer 34R and the separation layer 35 may of course be patterned and formed using separate dedicated vapor deposition masks having the same opening pattern, in the same manner as in the first embodiment.

In the green fluorescent light-emitting layer formation process (S6), the material of the green fluorescent light-emitting layer 34G is deposited linearly in a direction connecting the subpixel 3G1 and the subpixel 3G2, using, as the vapor deposition mask 70G, the vapor deposition mask 70G for forming the green fluorescent light-emitting layer, in which a plurality of the openings 71G for two subpixels, corresponding to the subpixel 3G1 and the subpixel 3G2 in each pixel 2, are provided in the row direction and the column direction; as a result, the green fluorescent light-emitting layer 34G is formed in the light emitting region 4G1 and the light emitting region 4G2, as indicated by the broken lines in FIG. 13B. In the present embodiment, the material of the green fluorescent light-emitting layer 34G is linearly deposited in even-numbered subpixel columns that constitute the subpixel 3G1 and the subpixel 3G2. Accordingly, the green fluorescent light-emitting layer 34G is formed, as an intermittent stripe following the column direction, on the hole transport layer 32, overlapping the separation layer 35 in the subpixel 3G1 and disposed directly on the hole transport layer 32 in the subpixel 3G2.

Additionally, in the blue fluorescent light-emitting layer formation process (S7), the material of the blue fluorescent light-emitting layer 34B is linearly-deposited in the direction connecting the subpixel 3B and the subpixel 3G1 using, as the vapor deposition mask 70B, a vapor deposition mask 70B for forming the blue fluorescent light-emitting layer similar to the vapor deposition mask 70B illustrated in FIG. 9C, in which a plurality of the openings 71B are provided in the row direction and the column direction for two subpixels, corresponding to the subpixel 3B and the subpixel 3G1 in each pixel 2; as a result, the blue fluorescent light-emitting layer 34B is formed in the light emitting region 4B and the light emitting region 4G1 indicated by the broken lines, as illustrated in FIG. 13C. In the present embodiment, the material of the blue fluorescent light-emitting layer 34B is linearly deposited in subpixel columns of odd-numbered rows that constitute the subpixel 3B and the subpixel 3G1. Accordingly, the blue fluorescent light-emitting layer 34B is formed, as an intermittent stripe following the row direction, on the hole transport layer 32, overlapping the green fluorescent light-emitting layer 34G in the subpixel 3G1 and disposed directly on the hole transport layer 32 in the subpixel 3B.

According to the present embodiment, employing an S-Stripe type pixel arrangement as described above makes it possible to improve the apparent resolution.

Normally, in an organic EL display device having an S-Stripe arrangement, linear deposition can only be carried out for subpixel columns constituted by green subpixels. However, according to the present embodiment, all of the layers constituting the light-emitting layer unit 33 can be linearly deposited, as described above.

Additionally, the light-emitting layer unit 33 in the organic EL display device 1 according to the present embodiment has the same layered structure as the layered structure illustrated in FIGS. 1, 2, 4, and 11, as described above. Accordingly, when forming the red light-emitting layer 34R in common for the subpixel 3G1 and the subpixel 3R, even if the red light-emitting layer 34R has infiltrated into the subpixel 3B and the red light-emitting layer 34R has been formed under the blue fluorescent light-emitting layer 34B, electrons will not reach the red light-emitting layer 34R, and red color mixing will therefore not arise in the subpixel 3B, as long as the material in the blue fluorescent light-emitting layer 34B having the highest content percentage is a hole transporting material. Likewise, when forming the red light-emitting layer 34R in common for the subpixel 3G1 and the subpixel 3R, even if the red light-emitting layer 34R has infiltrated into the subpixel 3G2 and the red light-emitting layer 34R has been formed under the green fluorescent light-emitting layer 34G, electrons will not reach the red light-emitting layer 34R, and red color mixing will therefore not arise in the subpixel 3G2, as long as the material in the green fluorescent light-emitting layer 34G having the highest content percentage is a hole transporting material. Thus using a hole transporting material for both the material in the blue fluorescent light-emitting layer 34B having the highest content percentage and the material in the green fluorescent light-emitting layer 34G having the highest content percentage makes it possible to achieve a configuration in which color mixing does not easily arise even if even a minute amount of the red luminescent material infiltrates into another subpixel 3 (i.e., at least one of the subpixel 3B and the subpixel 3G2) when depositing the red light-emitting layer 34R.

Additionally, in the present embodiment, when depositing the red light-emitting layer 34R, assuming the vapor deposition mask 70R is viewed from a direction perpendicular to the mask surface (i.e., in a plan view), the respective sides of the openings 71R in the vapor deposition mask 70R (the respective ends of the openings) are in a non-parallel relationship with the respective sides of the light emitting regions 4 of the subpixels 3 located within the openings 71R (in other words, the respective ends of the openings 15a in the banks 15 in the subpixels 3 located in the openings 71R), as illustrated in FIG. 13A. As such, in the subpixels 3R and 3G1 where the red light-emitting layer 34R is deposited, unless the light emitting regions 4R and 4G1 are formed smaller than the light emitting regions 4B and 4G2 in the other subpixels 3B and 3G2 adjacent to the light emitting regions 4R and 4G1, and the openings 71R in the vapor deposition mask 70R are made smaller as well, it becomes easier for the material of the red light-emitting layer 34R to infiltrate into the subpixels 3B and 3G2.

In other words, when the light emitting regions 4R and 4G1 in which the red light-emitting layer 34R is formed are the same size as the light emitting regions 4B and 4G2 as illustrated in FIG. 13A, and the openings 71R are formed in the vapor deposition mask 70R at a size at which the entirety of the light emitting regions 4R and 4G1 corresponding to two subpixels are included therein, the openings 71R in the vapor deposition mask 70R will partially overlap with the corners of the other light emitting regions 4B and 4G2 unless the deposition margin for preventing color mixing is increased and the non-emissive region is formed larger than as illustrated in FIG. 13A.

However, according to the present embodiment, a hole transporting material is used for both the material in the blue fluorescent light-emitting layer 34B having the highest content percentage and the material in the green fluorescent light-emitting layer 34G having the highest content percentage, as described above; it is thus difficult for color mixing to arise even if the red luminescent material infiltrates into other subpixels 3, and therefore unnecessary for the light emitting regions 4R and 4G1 to be formed smaller than the light emitting regions 4B and 4G2 as illustrated in FIGS. 12 and 13A to 13C. In other words, by using a hole transporting material for both the material in the blue fluorescent light-emitting layer 34B having the highest content percentage and the material in the green fluorescent light-emitting layer 34G having the highest content percentage as described above, the aperture ratio of the subpixels 3 can be made higher than when such is not the case.

Fourth Embodiment

A description follows regarding yet another embodiment of the disclosure, primarily on the basis of FIGS. 1 and 14A to 14C.

The present embodiment will describe differences from the first to third embodiments, and constituent elements having the same functions as the constituent elements described in the first to third embodiments will be assigned the same reference signs, with descriptions thereof omitted. It goes without saying that the same modifications as those of the first to third embodiments can be applied to the present embodiment as well.

The organic EL display device 1 according to the present embodiment differs from the organic EL display device 1 according to the first embodiment in that a TADF material is used for the blue fluorescent luminescent material.

FIG. 14A is a diagram illustrating Förster transfer, FIG. 14B is a diagram illustrating Dexter transfer (Dexter-type energy transfer), and FIG. 14C is a diagram illustrating a TADF material.

As illustrated in FIG. 14A, in Förster transfer using the Förster mechanism (dipole-dipole interaction), acceptor electrons in the HOMO (highest occupied molecular orbital) level resonate with dipole vibrations of donor electrons excited at the LUMO (lowest unoccupied molecular orbital) level and change to wave motion at the LUMO level, and are excited from a ground state (singlet ground state) to an excited singlet state. In this manner, energy of light absorbed by the donors in the excited singlet state is transferred to the acceptors, and when the acceptors are fluorescent molecules, the acceptors give off fluorescent light. Note that in FIG. 14A, $^1D^*$ indicates the donor excited singlet state, and $^1A$ indicates the acceptor ground state (singlet ground state).

In Förster transfer, excitation energy moves directly between two adjacent pigment molecules due to electron resonance, and thus direct contact between pigment molecules is not required for energy transfer. Förster transfer can occur as long as the distance between the donor and acceptor is within an effective radius (Förster radius).

As illustrated in FIG. 14B, in Dexter transfer using the Dexter mechanism (electron exchange interaction), overlapping orbits between pigment molecules caused by collisions between pigment molecules results in the exchange of donor electrons in an excited triplet state and acceptor electrons in a triplet ground state, which produces energy transfer. Note that in FIG. 14B, $^3D^*$ indicates the donor excited triplet state, and $^3A$ indicates the acceptor ground state (triplet ground state).

In Dexter transfer, collision between pigment molecule is required, and thus it is necessary for the pigment molecules to be in contact with each other.

Normally, in an organic EL element, electrons and holes are injected into the light-emitting layer and recombine to generate excitons, and the light given off when the excitons are deactivated is utilized. Here, the probability of the excitons being generated in the excited singlet state is 25%, and the probability of the excitons being generated in the excited triplet state is 75%.

However, as illustrated in FIG. 14A, a transition from the excited singlet state ($S_1$ level) to the ground state ($S_0$ level) is a permitted transition between states having the same spin multiplicity, whereas as illustrated in FIG. 14B, a transition from the excited triplet state ($T_1$ level) to the ground state ($S_0$ level) is a prohibited transition between states having different spin multiplicities. Therefore, the triplet excitons generated at the $T_1$ level change to thermal energy or the like and deactivate as heat, without emitting light, and therefore do not contribute to light emission. There is thus a problem in that the light emission efficiency of a normal fluorescent luminescent material drops when excitons are generated at the $T_1$ level.

Furthermore, Förster transfer from a given material in an excited triplet state (one of two adjacent pigment molecules) to another material in an excited triplet state (the other of the two adjacent pigment molecules) is prohibited, and only Dexter transfer occurs. Thus when excitons have been generated at the $T_1$ level, energy is transferred only to molecules in direct contact.

Thus as illustrated in FIG. 1, for example, in the subpixel 3G1, when excitons are generated in the blue fluorescent light-emitting layer 34B, no energy is transferred from the blue fluorescent luminescent material at the $T_1$ level to the green fluorescent luminescent material. Energy is only transferred from the blue fluorescent luminescent material at the $S_1$ level to the green fluorescent luminescent material at the $S_1$ level, and thus in the subpixel 3G1, it is possible that color mixing, a drop in the light emitting efficiency, or the like will arise.

Accordingly, the blue fluorescent luminescent material used for the blue fluorescent light-emitting layer 34B is preferably a TADF material.

As described in the first embodiment, a TADF material has an extremely low $\Delta E_{ST}$, and as illustrated in FIG. 14C, reverse intersystem crossing from the $T_1$ level to the $S_1$ level arises in a TADF material. Thus if a TADF material is used for the blue fluorescent luminescent material, excitons at the $T_1$ level are upconverted to the S1 level through the reverse intersystem crossing.

Thus if a TADF material is used for the blue fluorescent luminescent material, even if, for example, excitons have been generated in the blue fluorescent light-emitting layer 34B of the subpixel 3G1, energy will be transferred from the blue fluorescent luminescent material to the green fluorescent luminescent material due to Förster transfer between $S_1$ levels resulting from the reverse intersystem crossing from the $T_1$ level to the $S_1$ level. Accordingly, using a TADF material for the blue fluorescent luminescent material makes it possible to suppress blue color mixing in the subpixel 3G1 and thus improve the color level in the subpixel 3G1.

Additionally, using a TADF material for the blue fluorescent luminescent material results in excitons at the $T_1$ level being upconverted to the $S_1$ level in the subpixel 3B, which improves the light emission efficiency in the subpixel 3B and in turn improves the light emission efficiency of the organic EL display device 1. For the same reason, a TADF material may be used for the green fluorescent luminescent material. In this case, in the subpixels 3G1 and 3G2, excitons at the $T_1$ level are upconverted to the $S_1$ level, which improves the light emission efficiency in the subpixels 3G1 and 3G2 and in turn improves the light emission efficiency of the organic EL display device 1. Of course, a TADF material may be used as the red luminescent material, as described earlier, to improve the light emission efficiency in the subpixel 3R.

The above-described 2CzPN, DMAC-DPS, and the like can be given as examples of TADF materials that emit blue light. The above-described 4CzIPN, 4CzPN, PXZ-DPS, and the like can be given as examples of TADF materials that emit green light.

In the present embodiment, an organic EL display device 1 having the same conditions as in Example 1 was produced as an example, with the exception of the blue fluorescent light-emitting layer 34B being formed from mCP (host material, 90%)/DMAC-DPS (blue fluorescent luminescent material, 10%) instead of ADN (host material, 90%)/TBPe (blue fluorescent luminescent material, 10%).

In other words, in the present embodiment the material and thicknesses of the layers layered on the TFT substrate 10 are as described below; and as illustrated in FIG. 4, in the present embodiment too, the reflective electrode 21a, the light-transmissive electrode 21b, the hole injection layer 31, the hole transport layer 32, the red light-emitting layer 34R, the separation layer 35, the green fluorescent light-emitting layer 34G, the blue fluorescent light-emitting layer 34B, the electron transport layer 36, the electron injection layer 37, the second electrode 23, and the protection layer 24 are layered on the TFT substrate 10, in that order from the TFT substrate 10 side, on the basis of the flowchart illustrated in FIG. 10, in the same manner as in the first embodiment. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 3

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 135 nm/subpixel 3G2: 165 nm/subpixel 3R: 40 nm)
Hole injection layer 31: HAT-CN (10 nm)
Hole transport layer 32: TCTA (20 nm)
Red light-emitting layer 34R: CBP (host material 90%)/Ir(piq)3 (red luminescent material, 10%) (10 nm)
Separation layer 35: CBP (20 nm)
Green fluorescent light-emitting layer 34G: TPD (host material, 90%)/coumarin 6 (green fluorescent luminescent material, 10%) (10 nm)
Blue fluorescent light-emitting layer 34B: mCP (host material, 90%)/DMAC-DPS (blue fluorescent luminescent material, 10%) (10 nm)
Electron transport layer 36: BCP (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

Fifth Embodiment

Yet another embodiment of the disclosure will be described below with reference primarily to FIGS. 1, 2, 4, and 10. The present embodiment will describe differences from the first to fourth embodiments, and constituent elements having the same functions as the constituent elements described in the first to fourth embodiments will be assigned the same reference signs, with descriptions thereof omitted. It goes without saying that the same modifications as those of the first to fourth embodiments can be applied to the present embodiment as well.

The organic EL display device 1 according to the present embodiment has the same layered structure as the layered structure illustrated in FIGS. 1, 2, and 4. As illustrated in FIG. 1, in the organic EL display device 1 having such a layered structure, it is necessary, in the subpixel 3G1, for holes and electrons to recombine and generate excitons to emit green light in the green fluorescent light-emitting layer 34G on the cathode electrode side of the separation layer 35 (i.e., the second electrode 23). Additionally, in the subpixel 3R, it is necessary for holes and electrons to recombine and generate excitons to emit red light in the red light-emitting layer 34R on the anode electrode side of the separation layer 35 (i.e., the first electrode 21).

It is therefore desirable that the separation layer 35 exhibit bipolar transport properties, where both the hole transport properties and the electron transport properties are high, as described in the first embodiment.

Accordingly, in the present embodiment, the carrier transport properties are adjusted by forming the separation layer 35 from a plurality of materials.

In particular, when the separation layer 35 is provided on the red light-emitting layer 34R in the subpixel 3R, as illustrated in FIGS. 1, 2, and 4, there is a concern that the light emission efficiency will drop due to excessive flow of holes from the red light-emitting layer 34R to the separation layer 35. Accordingly, it is desirable that the combination ratio of the electron transporting material in the separation layer 35 be greater than the combination ratio of the hole transporting material.

In this manner, forming the separation layer 35 from a plurality of materials having different carrier transport properties makes it easier to control the carrier transport properties, and makes it possible to more easily improve the light emission efficiency of the respective colors, than when forming the separation layer 35 from a single type of material having bipolar transport properties.

In the present embodiment, as illustrated in FIG. 4, the reflective electrode 21a, the light-transmissive electrode 21b, the hole injection layer 31, the hole transport layer 32, the red light-emitting layer 34R, the separation layer 35, the green fluorescent light-emitting layer 34G, the blue fluorescent light-emitting layer 34B, the electron transport layer 36, the electron injection layer 37, the second electrode 23, and the protection layer 24 are layered on the TFT substrate 10, in that order from the TFT substrate 10 side, on the basis of the flowchart illustrated in FIG. 10.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 4

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 135 nm/subpixel 3G2: 165 nm/subpixel 3R: 40 nm)
Hole injection layer 31: HAT-CN (10 nm)
Hole transport layer 32: TCTA (20 nm)
Red light-emitting layer 34R: CBP (host material 90%)/Ir(piq)3 (red luminescent material, 10%) (10 nm)
Separation layer 35: BCP (70%)/TPD (30%) (10 nm)
Green fluorescent light-emitting layer 34G: TPD (host material, 90%)/coumarin 6 (green fluorescent luminescent material, 10%) (10 nm)
Blue fluorescent light-emitting layer 34B: mCP (host material, 90%)/DMAC-DPS (blue fluorescent luminescent material, 10%) (10 nm)
Electron transport layer 36: BCP (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

As described above, according to the present embodiment, the separation layer 35 is formed as a mixed layer of BCP, which is an electron transporting material, and TPD, which is a hole transporting material, with a greater amount of BCP being used than TPD.

Sixth Embodiment

A description follows regarding still another embodiment of the disclosure, primarily on the basis of FIGS. 3, 10, 12, and 15 to 17. The present embodiment will describe differences from the first to fifth embodiments, and constituent elements having the same functions as the constituent elements described in the first to fifth embodiments will be assigned the same reference signs, with descriptions thereof omitted. It goes without saying that the same modifications as those of the first to fifth embodiments can be applied to the present embodiment as well.

Overall Configuration of Organic EL Display Device 1

Figure 15:
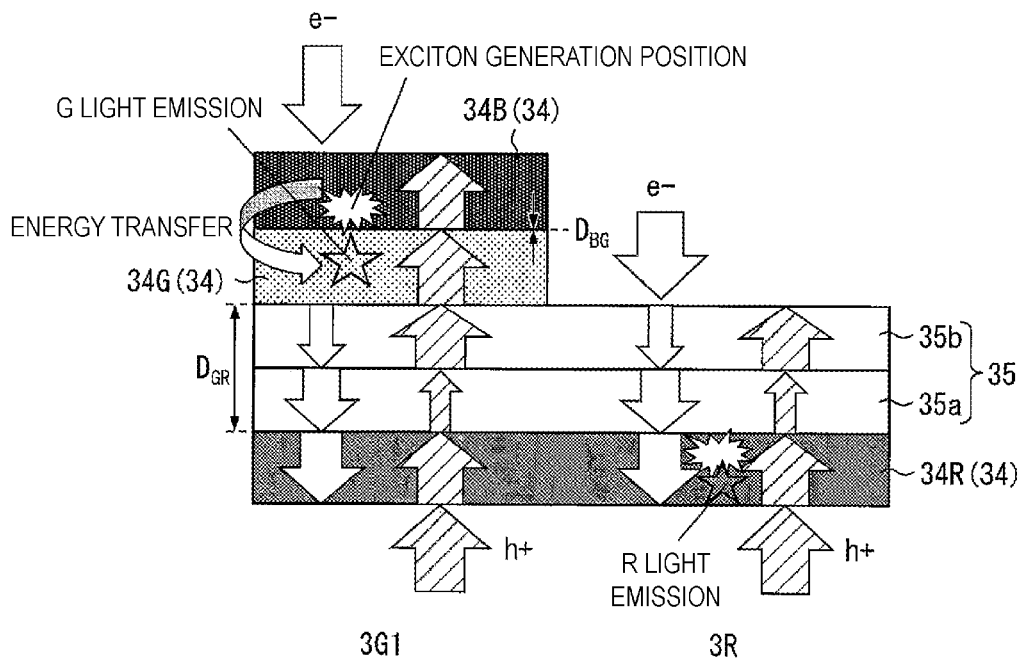
FIG. 15 is a diagram schematically illustrating the principle of light emission by a first green subpixel and a red subpixel of an organic EL display device according to a sixth embodiment of the disclosure.
Figure 16:
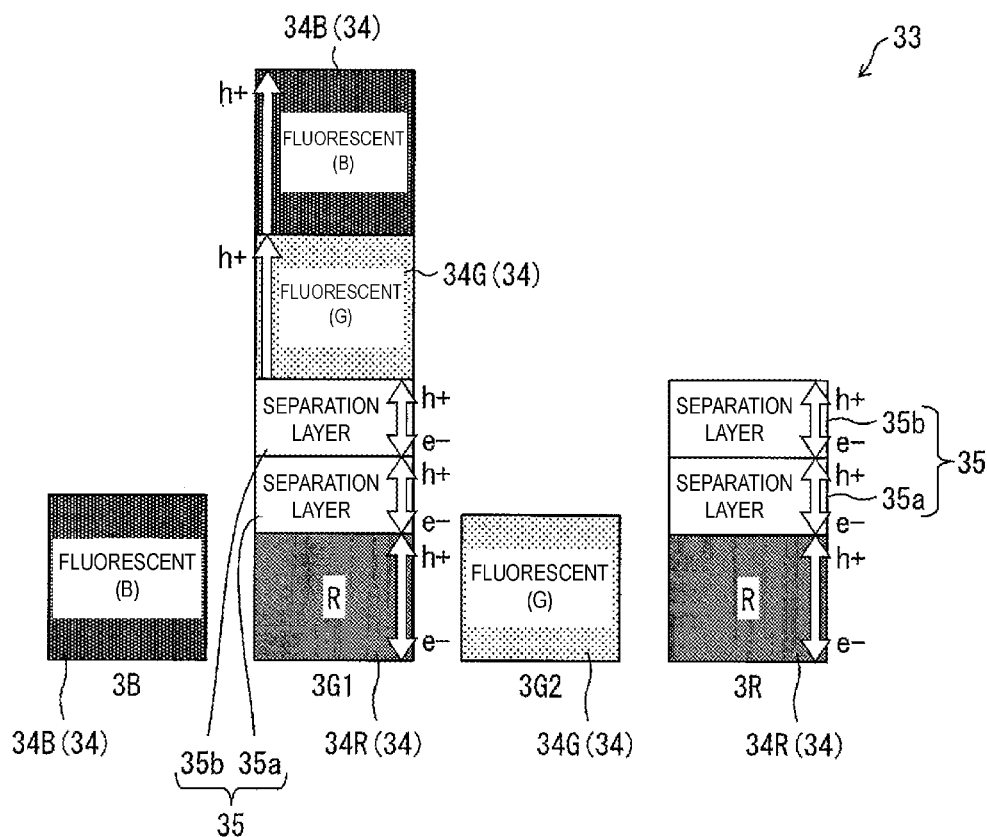
FIG. 16 is a diagram schematically illustrating a layered structure in the light-emitting layer unit of the organic EL display device according to the sixth embodiment of the disclosure.
Figure 17:
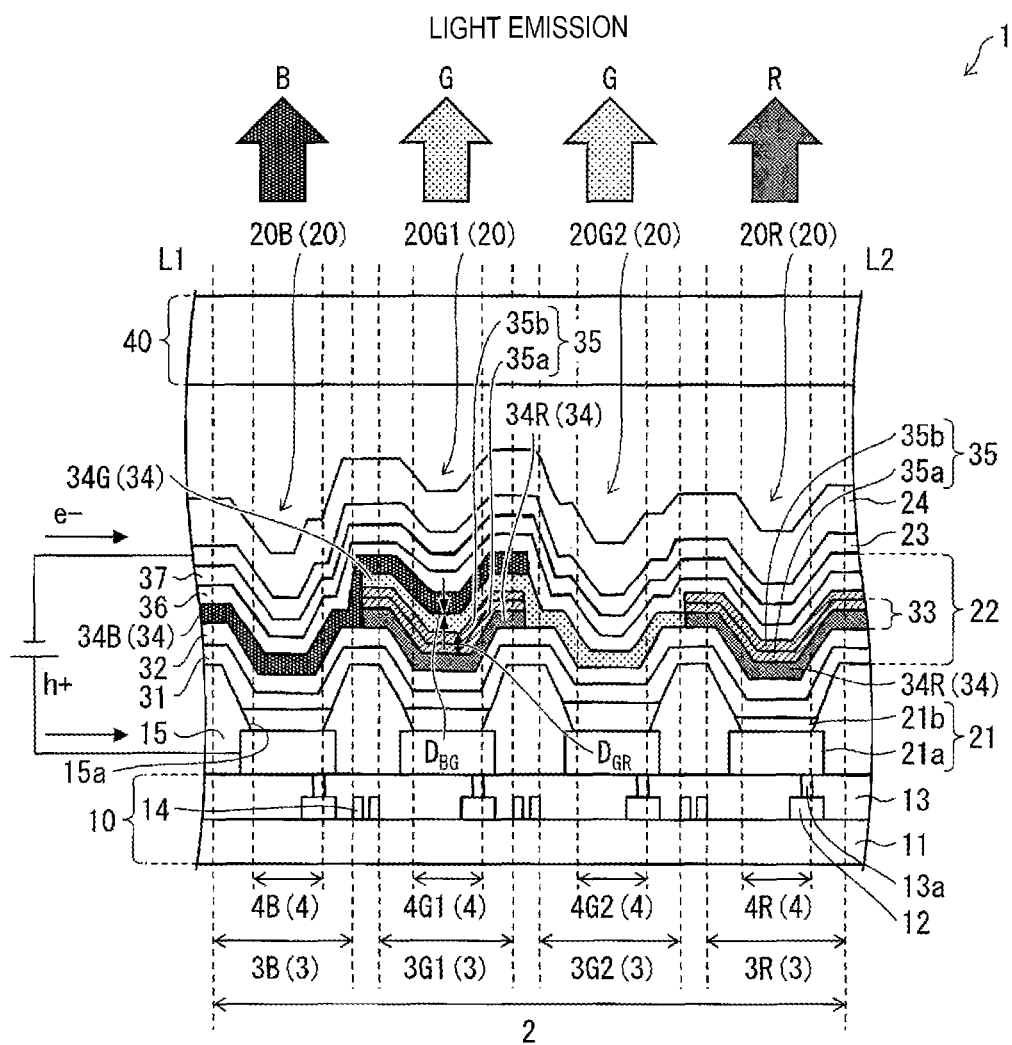
FIG. 17 is a cross-sectional view illustrating an example of the overall configuration of the organic EL display device according to the sixth embodiment of the disclosure.

FIG. 15 is a diagram schematically illustrating the principle of light emission by the subpixel 3G1 and the subpixel 3R of the subpixel 3 in the organic EL display device 1 according to the present embodiment. FIG. 16 is a diagram schematically illustrating the layered structure of the light-emitting layer unit 33 of the organic EL display device 1 according to the present embodiment. FIG. 17 is a cross-sectional view illustrating an example of the overall configuration of the organic EL display device 1 according to the present embodiment. Note that FIG. 17 illustrates an example of the overall configuration of a single pixel area, corresponding to a cross-section taken along the line L1-L2 indicated in FIG. 3 or FIG. 12.

The organic EL display device 1 according to the present embodiment is the same as the organic EL display device 1 according to the first to fifth embodiments, aside from the separation layer 35 being a layered body constituted by a plurality of layers.

As illustrated in FIGS. 15 to 17, the separation layer 35 according to the present embodiment has a dual-layer structure including a first separation layer 35a and a second separation layer 35b. As illustrated in FIGS. 15 and 16, the first separation layer 35a and the second separation layer 35b have mutually-different carrier transport properties. When the first separation layer 35a and the second separation layer 35b have mutually-different carrier transport properties in this manner, the luminescent colors displayed by the subpixels 3 can be obtained with a higher level of efficiency.

For example, making the combination ratio of the electron transporting material higher than the combination ratio of the hole transporting material in the first separation layer 35a located on the first electrode 21 (anode electrode) side makes it possible to suppress hole leakage from the red light-emitting layer 34R adjacent to the first separation layer 35a. On the other hand, by making the combination ratio of the hole transporting material higher than the combination ratio of the electron transporting material in the second separation layer 35b located on the second electrode 23 (cathode electrode) side makes it possible to suppress electron leakage from the green fluorescent light-emitting layer 34G adjacent to the second separation layer 35b. Accordingly, in the subpixel 3R, a drop in the light emitting efficiency of the red luminescent material caused by hole leakage from the red light-emitting layer 34R can be suppressed, and in the subpixel 3G1, a drop in the light emitting efficiency of the green fluorescent luminescent material caused by electron leakage from the green fluorescent light-emitting layer 34G can be suppressed. Note that the subpixel 3B and the subpixel 3G2, in which the separation layer 35 is not provided, are the same as in the first to fifth embodiments.

As described above, as long as the opposing surface distance $D_{GR}$ in the subpixel 3G1 is greater than the Förster radius, no energy will be transferred (through Förster transfer or Dexter transfer) from the green fluorescent light-emitting layer 34G to the red light-emitting layer 34R in the subpixel 3G2.

Accordingly, when the separation layer 35 is a layered body constituted by a plurality of layers as described above, the thickness of each layer constituting the separation layer 35 may be less than or equal to the Förster radius as long as the thickness of the layered body (i.e., the total thickness of the layers constituting the separation layer 35) is greater than the Förster radius.

For example, even if both the thickness of the first separation layer 35a and the thickness of the second separation layer 35b described above are less than or equal to the Förster radius, energy transfer between the blue and green fluorescent light-emitting layers 34B and 34G and the red light-emitting layer 34R in the subpixel 3G1 can be inhibited as illustrated in FIG. 15, and an effect of suppressing color mixing in the subpixel 3G1 can be achieved, as long as the thickness of the separation layer 35 constituted by the first separation layer 35a and the second separation layer 35b (i.e., the total thickness of the first separation layer 35a and the second separation layer 35b) is greater than the Förster radius.

Manufacturing Method for Organic EL Display Device 1

In the present embodiment, the separation layer 35 is constituted by the first separation layer 35a and the second separation layer 35b as described above, and as such, the separation layer formation process (S5) indicated in FIG. 10 includes a first separation layer formation process and a second separation layer formation process.

The first separation layer 35a and the second separation layer 35b both have the same pattern as the red light-emitting layer 34R when viewed in a plan view.

Accordingly, in the first separation layer formation process and the second separation layer formation process, the material of the first separation layer 35a and the material of the second separation layer 35b, respectively, can be linearly deposited in a direction connecting the subpixel 3G1 and the subpixel 3R, using the vapor deposition mask 70R for forming the red light-emitting layer. Accordingly, the first separation layer 35a and the second separation layer 35b having the same pattern as the red light-emitting layer 34R when viewed in a plan view can be layered upon the red light-emitting layer 34R.

The present embodiment describes, as an example, a case where the red light-emitting layer 34R, the first separation layer 35a, and the second separation layer 35b have the same pattern when viewed in a plan view, so that the red light-emitting layer 34R, the first separation layer 35a, and the second separation layer 35b are formed consecutively using the same vapor deposition mask 70R. However, the present embodiment is not limited thereto. The red light-emitting layer 34R, the first separation layer 35a, and the second separation layer 35b may be patterned and formed using separate dedicated vapor deposition masks having the same opening pattern.

In the present embodiment, the reflective electrode 21a, the light-transmissive electrode 21b, the hole injection layer 31, the hole transport layer 32, the red light-emitting layer 34R, the first separation layer 35a, the second separation layer 35b, the green fluorescent light-emitting layer 34G, the blue fluorescent light-emitting layer 34B, the electron transport layer 36, the electron injection layer 37, the second electrode 23, and the protection layer 24 are layered, in that order from the TFT substrate 10 side, on the TFT substrate 10, on the basis of the flowchart illustrated in FIG. 10.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 5

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 135 nm/subpixel 3G2: 165 nm/subpixel 3R: 40 nm)

Hole injection layer 31: HAT-CN (10 nm)

Hole transport layer 32: TCTA (20 nm)

Red light-emitting layer 34R: CBP (host material 90%)/Ir(piq)3 (red luminescent material, 10%) (10 nm)

First separation layer 35a: BCP (80%)/TPD (20%) (10 nm)

Second separation layer 35b: BCP (30%)/TPD (70%) (10 nm)

Separation layer 35: BCP (70%)/TPD (30%) (10 nm)

Green fluorescent light-emitting layer 34G: TPD (host material, 90%)/coumarin 6 (green fluorescent luminescent material, 10%) (10 nm)

Blue fluorescent light-emitting layer 34B: mCP (host material, 90%)/DMAC-DPS (blue fluorescent luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

As described above, in the present embodiment, the separation layer 35 is given a dual-layer structure including the first separation layer 35a and the second separation layer 35b, and the thickness of the separation layer 35 is set to greater than or equal to 15 nm. In the present embodiment as well, the thickness of the separation layer 35 constituted by the first separation layer 35a and the second separation layer 35b is preferably less than or equal to 50 nm, and more preferably less than or equal to 30 nm. It is therefore desirable that the thickness of the first separation layer 35a and the thickness of the second separation layer 35b be set to satisfy the above-describe ranges.

Seventh Embodiment

A description follows regarding yet another embodiment of the disclosure, primarily on the basis of FIGS. 3, 10, 12, and 18 to 21A and 21B. The present embodiment will describe differences from the first to sixth embodiments, and constituent elements having the same functions as the constituent elements described in the first to sixth embodiments will be assigned the same reference signs, with descriptions thereof omitted. It goes without saying that the same modifications as those of the first to sixth embodiments can be applied to the present embodiment as well.

Overall Configuration of Organic EL Display Device 1

Figure 18:
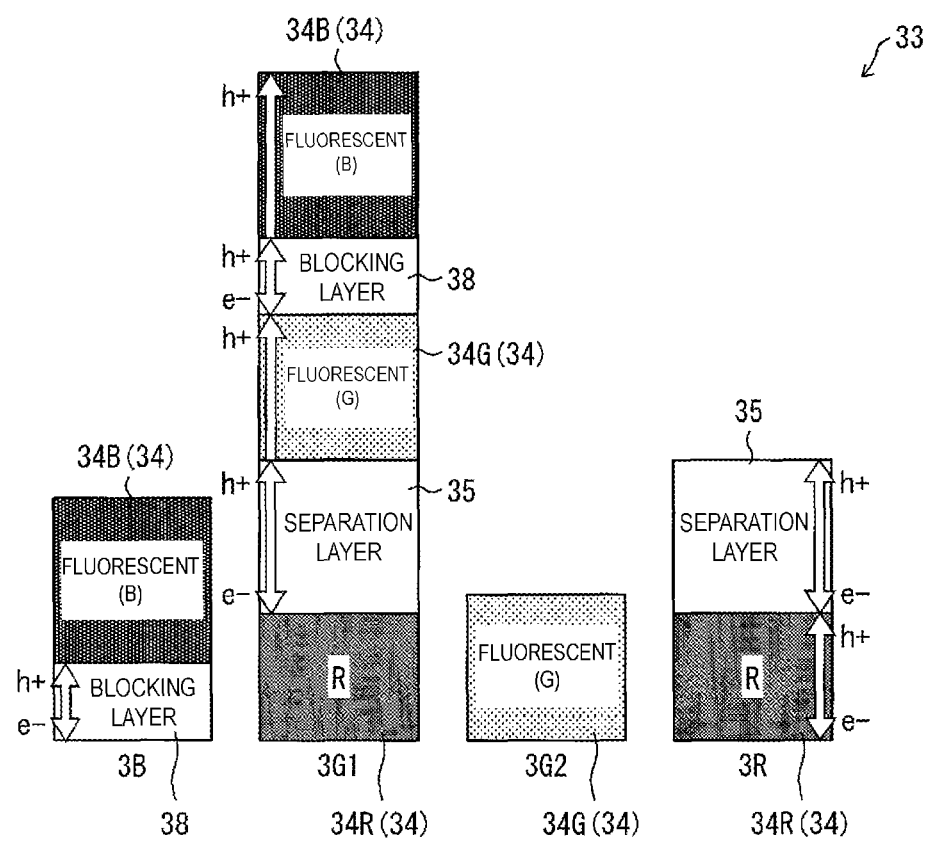
FIG. 18 is a diagram schematically illustrating a layered structure in a light-emitting layer unit of an organic EL display device according to a seventh embodiment of the disclosure.
Figure 19:
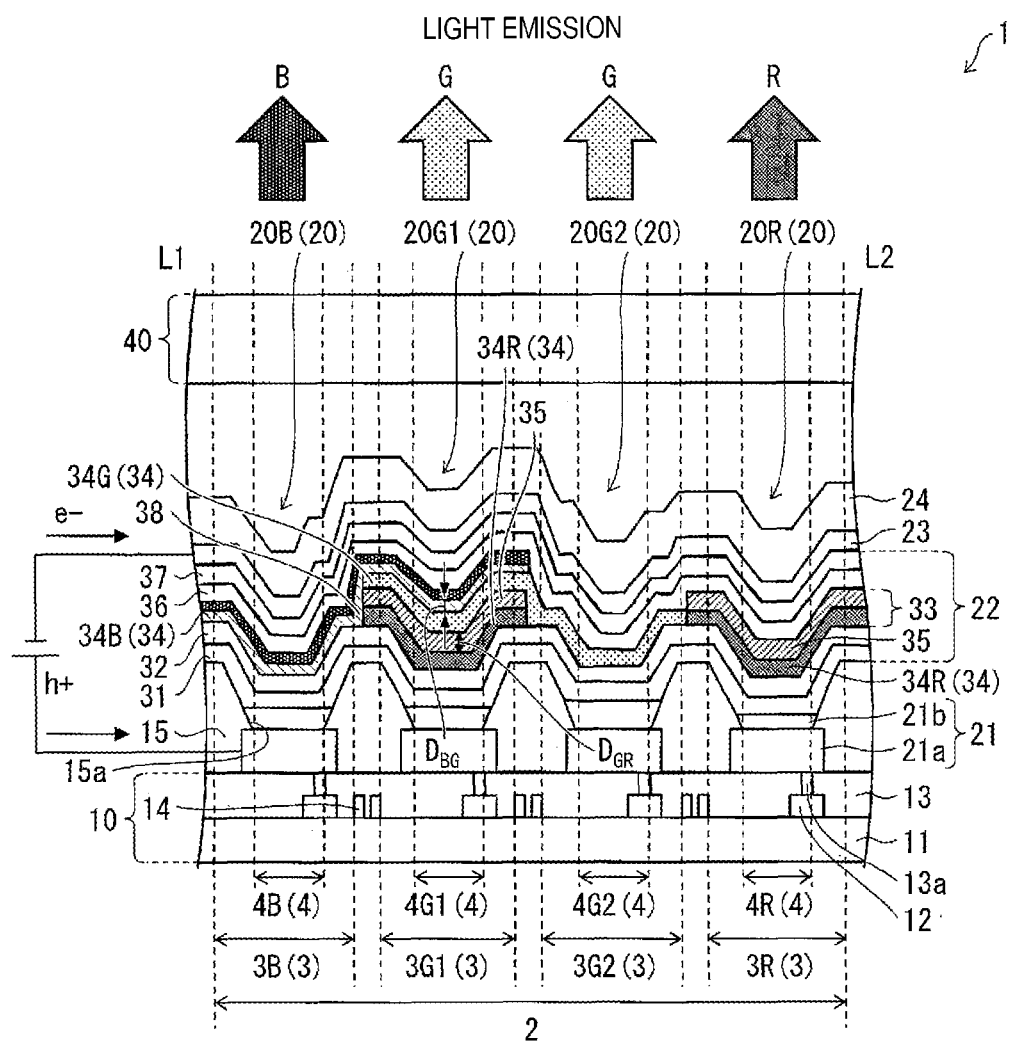
FIG. 19 is a cross-sectional view illustrating an example of the overall configuration of the organic EL display device according to the seventh embodiment of the disclosure.

FIG. 18 is a diagram schematically illustrating the layered structure of the light-emitting layer unit 33 of the organic EL display device 1 according to the present embodiment. FIG. 19 is a cross-sectional view illustrating an example of the overall configuration of the organic EL display device 1 according to the present embodiment. Note that FIG. 19 illustrates an example of the overall configuration of a single pixel area, corresponding to a cross-section taken along the line L1-L2 indicated in FIG. 3 or FIG. 12.

In the subpixel 3G1, if, when energy is transferred from the blue fluorescent luminescent material in the blue fluorescent light-emitting layer 34B to the green fluorescent luminescent material in the green fluorescent light-emitting layer 34G, molecules of the blue fluorescent luminescent material and molecules of the green fluorescent luminescent material come into direct contact, it is possible that Dexter transfer between $T_1$ levels will arise and deactivation will occur as heat without light being emitted.

Accordingly, it is desirable to provide, as a second intermediate layer, a blocking layer 38 between the blue fluorescent light-emitting layer 34B and the green fluorescent light-emitting layer 34G in the subpixel 3G1, the blocking layer 38 lacking a luminescent material, and having a thickness less than or equal to the Förster radius so as to inhibit Dexter transfer from the blue fluorescent luminescent material in the blue fluorescent light-emitting layer 34B to the green fluorescent luminescent material in the green fluorescent light-emitting layer 34G.

The blocking layer 38 has a thickness less than or equal to the Förster radius, and thus in the subpixel 3G1, Förster transfer from the blue fluorescent luminescent material to the green fluorescent luminescent material is not inhibited, but Dexter transfer is inhibited. Accordingly, providing the thin blocking layer 38, constituted by any desired material, between the blue fluorescent light-emitting layer 34B and the green fluorescent light-emitting layer 34G in the subpixel 3G1 makes it possible to improve the light emission efficiency of the green fluorescent luminescent material in the subpixel 3G1.

The thickness of the blocking layer 38 is equal to the opposing surface distance $D_{BG}$, and it is therefore necessary to set the thickness to be less than or equal to the Förster radius. To reliably ensure Förster transfer, the blocking layer 38 is preferably formed as thin as possible. The thickness of the blocking layer 38 is therefore preferably less than or equal to 10 nm, and more preferably less than or equal to 5 nm.

FIGS. 18 and 19 illustrate, as an example, a case where the blocking layer 38 is provided as a common layer for the subpixel 3B and the subpixel 3G1.

Accordingly, in the organic EL display device 1 illustrated in FIGS. 18 and 19, the light-emitting layer unit 33 has, in the subpixel 3B, a layered structure in which the blue fluorescent light-emitting layer 34B and the blocking layer 38 are layered in that order from the first electrode 21 side, and has, in the subpixel 3G1, a layered structure in which the red light-emitting layer 34R, the separation layer 35, the green fluorescent light-emitting layer 34G, the blocking layer 38, and the blue fluorescent light-emitting layer 34B are layered in that order from the first electrode 21 side. Like the first to sixth embodiments, the light-emitting layer unit 33 is constituted by the green fluorescent light-emitting layer 34G in the subpixel 3G2, and in the subpixel 3R, has a layered structure in which the red light-emitting layer 34R and the separation layer 35 are layered in that order from the first electrode 21 side, in the present embodiment as well.

It is desirable that the blocking layer 38 exhibit bipolar transport properties for the blocking layer 38 as a whole, for example. To that end, a material that alone has bipolar transport properties, such as a bipolar transporting material, or a material that has bipolar transport properties by combining two or more types of materials, is used as the material of the blocking layer 38.

The blocking layer 38 is a layer for inhibiting Dexter transfer from the blue fluorescent luminescent material to the green fluorescent luminescent material in the subpixel 3G1. As long as the blocking layer 38 is disposed between the green fluorescent light-emitting layer 34G and the blue fluorescent light-emitting layer 34B in the subpixel 3G1, the blocking layer 38 need not be disposed in the other subpixels 3. However, providing the blocking layer 38 in common for the subpixel 3B and the subpixel 3G1 as described above, for example, makes it possible to linearly deposit the material of the blocking layer 38 in a direction connecting the subpixel 3B and the subpixel 3G1.

Manufacturing Method for Organic EL Display Device 1

Figure 20:
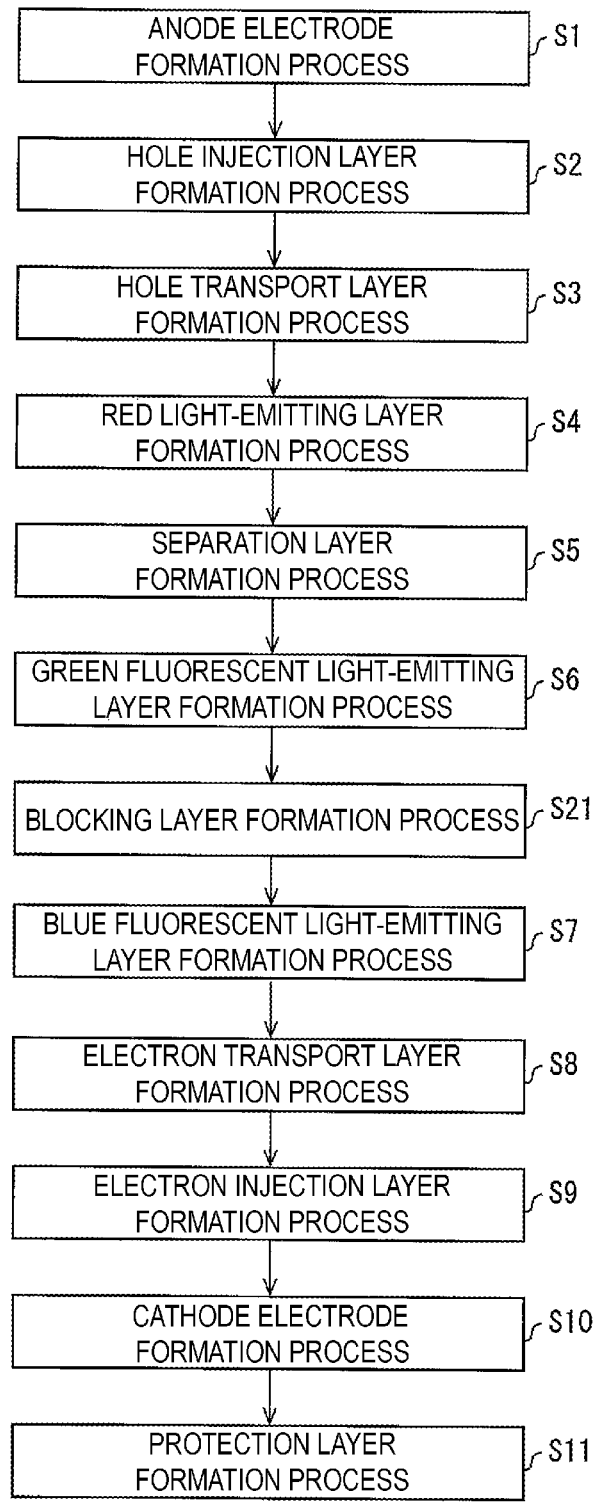
FIG. 20 is a flowchart illustrating the flow of processes for producing main portions of an organic EL display device according to the seventh embodiment of the disclosure.

FIG. 20 is a flowchart illustrating the flow of processes for producing main portions of the organic EL display device 1 according to the present embodiment.

The manufacturing method for the organic EL display device 1 according to the present embodiment is the same as the manufacturing method for the organic EL display devices 1 according to the first to sixth embodiments, aside from the organic EL element preparation process indicated in FIG. 10 including a blocking layer formation process (S21) between the green fluorescent light-emitting layer formation process (S6) and the blue fluorescent light-emitting layer formation process (S7), as illustrated in FIG. 20.

As described above, in the examples illustrated in FIGS. 18 and 19, the blocking layer 38 is, like the blue fluorescent light-emitting layer 34B, provided as a common layer for the subpixel 3B and the subpixel 3G1. Accordingly, in the manufacturing method for the organic EL display device 1 illustrated in FIGS. 18 and 19, the blocking layer 38 and the blue fluorescent light-emitting layer 34B can be formed consecutively using the same vapor deposition mask 70B. Accordingly, in the blue fluorescent light-emitting layer formation process (S7), the blue fluorescent light-emitting layer 34B having the same pattern as the blocking layer 38 when viewed in a plan view is layered on the blocking layer 38. However, the present embodiment is not limited thereto. The blocking layer 38 and the blue fluorescent light-emitting layer 34B may be patterned and formed using separate dedicated vapor deposition masks having the same opening pattern.

In the present embodiment, the reflective electrode 21a, the light-transmissive electrode 21b, the hole injection layer 31, the hole transport layer 32, the red light-emitting layer 34R, the separation layer 35, the green fluorescent light-emitting layer 34G, the blocking layer 38, the blue fluorescent light-emitting layer 34B, the electron transport layer 36, the electron injection layer 37, the second electrode 23, and the protection layer 24 are layered on the TFT substrate 10, in that order from the TFT substrate 10 side, on the basis of the flowchart illustrated in FIG. 20.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 6

Reflective electrode 21a (first electrode 21; anode electrode): Ag (100 nm)
Light-transmissive electrode 21b (first electrode 21, anode electrode): ITO (subpixel 3B: 130 nm/subpixel 3G1: 130 nm/subpixel 3G2: 165 nm/subpixel 3R: 40 nm)
Hole injection layer 31: HAT-CN (10 nm)
Hole transport layer 32: TCTA (20 nm)
Red light-emitting layer 34R: CBP (host material 90%)/Ir(piq)3 (red luminescent material, 10%) (10 nm)
Separation layer 35: CBP (20 nm)
Green fluorescent light-emitting layer 34G: TPD (host material, 90%)/coumarin 6 (green fluorescent luminescent material, 10%) (10 nm)
Blocking layer 38: mCP (5 nm)
Blue fluorescent light-emitting layer 34B: mCP (host material, 90%)/DMAC-DPS (blue fluorescent luminescent material, 10%) (10 nm)
Electron transport layer 36: BCP (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

Modified Example

FIGS. 18 and 19 illustrate, as an example, a case where the blocking layer 38 is provided in common for the subpixels 3B and 3G1. However, the present embodiment is not limited thereto.

Figure 21A:
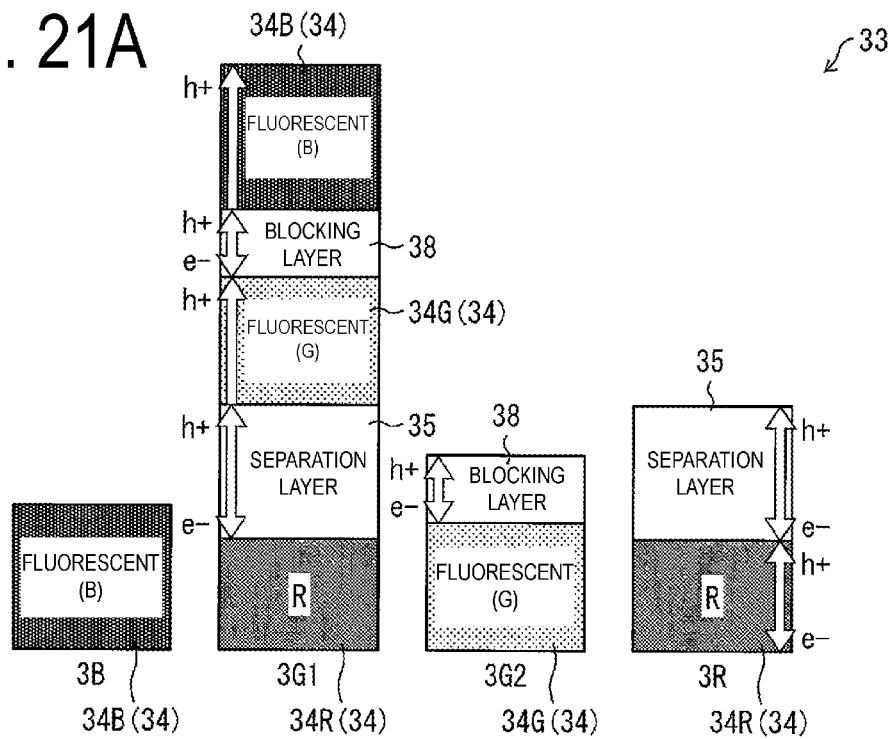
FIGS. 21A and 21B are diagrams schematically illustrating another example of the layered structure of the light-emitting layer unit according to the seventh embodiment of the disclosure.
Figure 21B:
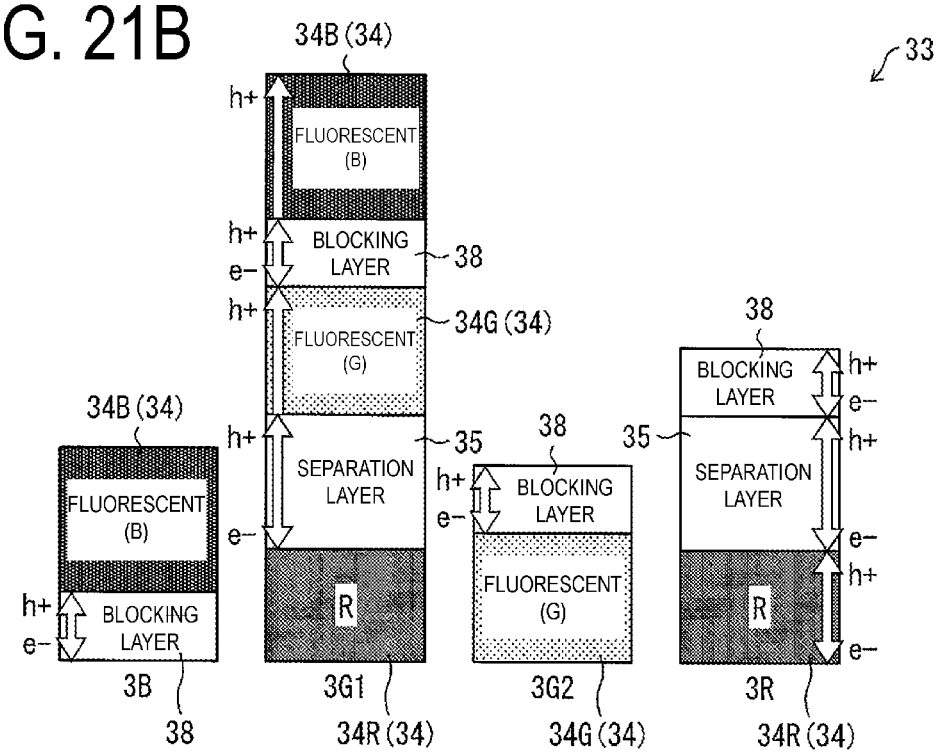

FIGS. 21A and 21B are diagrams schematically illustrating another example of the layered structure of the light-emitting layer unit 33 according to the present embodiment.

As described above, it is sufficient for the blocking layer 38 to be disposed between the green fluorescent light-emitting layer 34G and the blue fluorescent light-emitting layer 34B in the subpixel 3G1.

The blocking layer 38 may be provided as a common layer for the subpixels 3G1 and 3G2 as illustrated in FIG. 21A, or may be provided as a common layer for all the subpixels 3 as illustrated in FIG. 21B.

In either case, it is desirable that a bipolar transporting material be used for the material of the blocking layer 38, as illustrated in FIGS. 21A and 21B.

Providing the blocking layer 38 as a common layer for the subpixels 3G1 and 3G2 as illustrated in FIG. 21A makes it possible to inhibit Dexter transfer from the blue fluorescent luminescent material to the green fluorescent luminescent material in the subpixel 3G1, and also makes it possible to linearly deposit the material of the blocking layer 38 in a direction connecting the subpixel 3G1 and the subpixel 3G2.

In this case, the green fluorescent light-emitting layer 34G and the blocking layer 38 can be formed consecutively using the same vapor deposition mask 70G. In other words, after the green fluorescent light-emitting layer formation process (S6), the blocking layer 38 having the same pattern as the green fluorescent light-emitting layer 34G when viewed in a plan view is layered on the green fluorescent light-emitting layer 34G in a blocking layer formation process (S21). However, the present embodiment is not limited thereto. The green fluorescent light-emitting layer 34G and the blocking layer 38 may be patterned and formed using separate dedicated vapor deposition masks having the same opening pattern.

The materials and thicknesses of the layers layered on the TFT substrate 10 when the blocking layer 38 is provided as a common layer for the subpixels 3G1 and 3G2 as illustrated in FIG. 21A are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 7

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 130 nm/subpixel 3G2: 160 nm/subpixel 3R: 40 nm)
Hole injection layer 31: HAT-CN (10 nm)
Hole transport layer 32: TCTA (20 nm)
Red light-emitting layer 34R: CBP (host material 90%)/Ir(piq)3 (red luminescent material, 10%) (10 nm)
Separation layer 35: CBP (20 nm)
Green fluorescent light-emitting layer 34G: TPD (host material, 90%)/coumarin 6 (green fluorescent luminescent material, 10%) (10 nm)
Blocking layer 38: mCP (5 nm)
Blue fluorescent light-emitting layer 34B: mCP (host material, 90%)/DMAC-DPS (blue fluorescent luminescent material, 10%) (10 nm)
Electron transport layer 36: BCP (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

Additionally, providing the blocking layer 38 as a common layer for all the subpixels 3 as illustrated in FIG. 21B makes it possible to inhibit Dexter transfer from the blue fluorescent luminescent material to the green fluorescent luminescent material in the subpixel 3G1, and also makes it possible to vapor-deposit the blocking layer 38 using an open mask in which the entire display region is open.

The materials and thicknesses of the layers layered on the TFT substrate 10 when the blocking layer 38 is provided as a common layer for all the subpixels 3 as illustrated in FIG. 21B are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 8

Reflective electrode 21a (first electrode 21; anode electrode): Ag (100 nm)
Light-transmissive electrode 21b (first electrode 21, anode electrode): ITO (subpixel 3B: 130 nm/subpixel 3G1: 130 nm/subpixel 3G2: 160 nm/subpixel 3R: 40 nm)
Hole injection layer 31: HAT-CN (10 nm)
Hole transport layer 32: TCTA (20 nm)
Red light-emitting layer 34R: CBP (host material 90%)/Ir(piq)3 (red luminescent material, 10%) (10 nm)
Separation layer 35: CBP (20 nm)
Green fluorescent light-emitting layer 34G: TPD (host material, 90%)/coumarin 6 (green fluorescent luminescent material, 10%) (10 nm)
Blocking layer 38: mCP (5 nm)
Blue fluorescent light-emitting layer 34B: mCP (host material, 90%)/DMAC-DPS (blue fluorescent luminescent material, 10%) (10 nm)
Electron transport layer 36: BCP (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

Eighth Embodiment

Yet another embodiment of the disclosure will be described below with reference primarily to FIGS. 3, 12, and 22 to 24. The present embodiment will describe differences from the first to seventh embodiments, and constituent elements having the same functions as the constituent elements described in the first to seventh embodiments will be assigned the same reference signs, with descriptions thereof omitted. It goes without saying that the same modifications as those of the first to seventh embodiments can be applied to the present embodiment as well.

Overall Configuration of Organic EL Display Device 1

Figure 22:
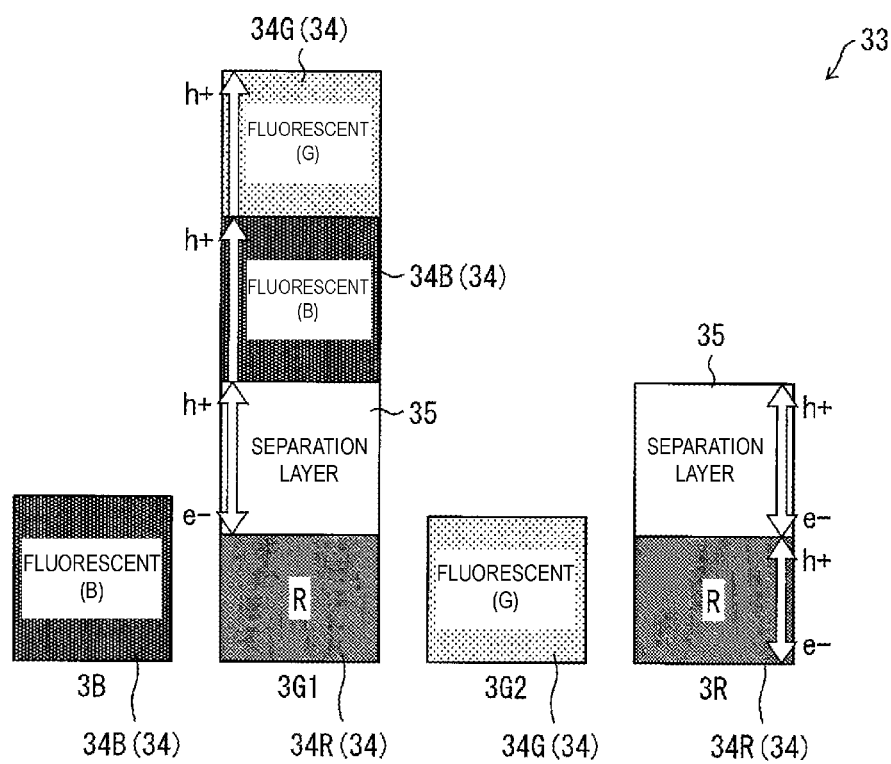
FIG. 22 is a diagram schematically illustrating a layered structure in a light-emitting layer unit of an organic EL display device according to an eighth embodiment of the disclosure.
Figure 23:
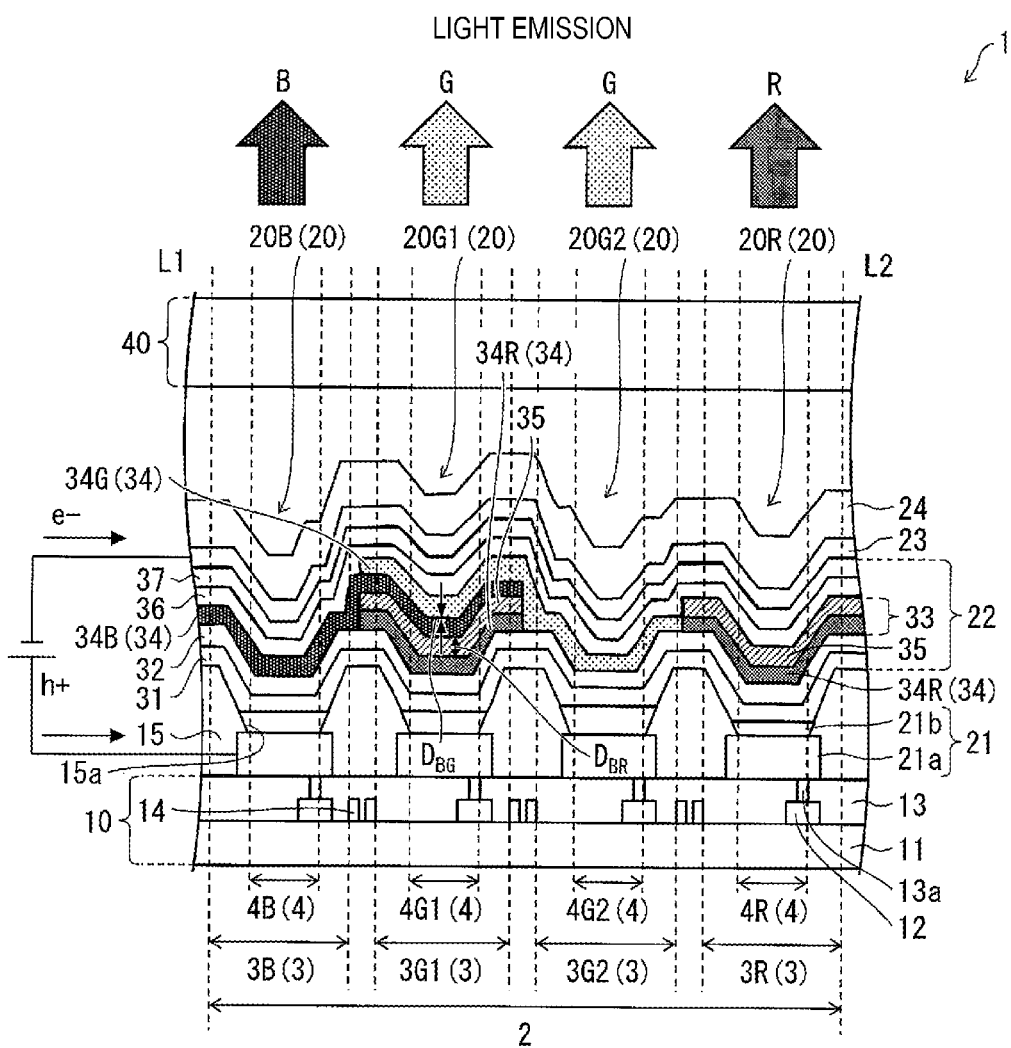
FIG. 23 is a cross-sectional view illustrating an example of the overall configuration of the organic EL display device according to the eighth embodiment of the disclosure.

FIG. 22 is a diagram schematically illustrating the layered structure of the light-emitting layer unit 33 of the organic EL display device 1 according to the present embodiment. FIG. 23 is a cross-sectional view illustrating an example of the overall configuration of the organic EL display device 1 according to the present embodiment. Note that FIG. 23 illustrates an example of the overall configuration of a single pixel area, corresponding to a cross-section taken along the line L1-L2 indicated in FIG. 3 or FIG. 12.

As illustrated in FIGS. 22 and 23, in the organic EL display device 1 according to the present embodiment, the light-emitting layer unit 33 has a configuration in which the red light-emitting layer 34R, the separation layer 35, the blue fluorescent light-emitting layer 34B, and the green fluorescent light-emitting layer 34G are layered, in that order, from the first electrode 21 side, between the first electrode 21 and the second electrode 23.

More specifically, the light-emitting layer unit 33 in the organic EL display device 1 according to the present embodiment has the same configuration as the light-emitting layer unit 33 in the organic EL display devices 1 according to the first to seventh embodiments, aside from that the layering order of the blue fluorescent light-emitting layer 34B and the green fluorescent light-emitting layer 34G is reversed in the subpixel 3G1, and the green fluorescent light-emitting layer 34G is located closer to the second electrode 23, which is a cathode electrode, than the blue fluorescent light-emitting layer 34B. For example, aside from the above-described differences, the organic EL display device 1 illustrated in FIG. 23 has the same configuration as the organic EL display device 1 according to the first embodiment, for example.

Note that FIGS. 22 and 23 illustrate, as an example, a case where only the separation layer 35 serving as the first intermediate layer is provided in the subpixel 3G1 as the intermediate layer, to simplify the descriptions and illustrations. However, the present embodiment is not limited thereto, and the subpixel 3G1 may include the separation layer 35 (the first intermediate layer) and the blocking layer 38 (the second intermediate layer) as the intermediate layer. Additionally, as described above, the separation layer 35 may be a layered body including the first separation layer 35a and the second separation layer 35b.

In the present embodiment, the blue fluorescent light-emitting layer 34B and the red light-emitting layer 34R are adjacent in the layering direction, with the separation layer 35 interposed therebetween, as illustrated in FIGS. 22 and 23. Thus in the present embodiment, the distance between opposing surfaces of the blue fluorescent light-emitting layer 34B and the red light-emitting layer 34R (an opposing surface distance $D_{BR}$), i.e., a distance between the surface of the blue fluorescent light-emitting layer 34B located furthest on the red light-emitting layer 34R side (a lower surface of the blue fluorescent light-emitting layer 34B, in the present embodiment) and the surface of the red light-emitting layer 34R located furthest on the blue fluorescent light-emitting layer 34B side (an upper surface of the red light-emitting layer 34R, in the present embodiment), which is equal to the thickness of the separation layer 35, is set to a distance exceeding the Förster radius. Note that like the opposing surface distance $D_{GR}$, the opposing surface distance $D_{BR}$ is preferably greater than or equal to 15 nm and less than or equal to 50 nm, and more preferably greater than or equal to 15 nm and less than or equal to 30 nm.

Like the first to seventh embodiments, in the present embodiment too, it is preferable that a hole transporting material be used for the material of at least one, and desirably both, of the material in the green fluorescent light-emitting layer 34G having the highest content percentage and the material in the blue fluorescent light-emitting layer 34B having the highest content percentage. Also, like the first to seventh embodiments, in the present embodiment too, a bipolar transporting material or a hole transporting material is used for the red light-emitting layer 34R, and a material having bipolar transport properties as a whole is used for the intermediate layer such as the separation layer 35 and the like.

In the present embodiment, too, the thickness of the blue fluorescent light-emitting layer 34B is preferably set to less than or equal to 10 nm, for the same reasons as those described in the first embodiment.

Additionally, in the present embodiment, it is preferable, for the same reasons as those described in the first embodiment, that part of the PL emission spectrum of the blue fluorescent luminescent material overlap with part of the absorption spectrum of the green fluorescent luminescent material. It is also preferable that no overlap be present between the absorption spectrum of the material of the separation layer 35 and the PL emission spectrum of the fluorescent luminescent material of at least the light-emitting layer, among the blue fluorescent light-emitting layer 34B and the green fluorescent light-emitting layer 34G provided on the opposite side of the separation layer 35 from the red light-emitting layer 34R, that is adjacent to the separation layer 35 (the blue fluorescent light-emitting layer 34B, in the present embodiment), and further preferable that no overlap be present between the PL emission spectrum of the green fluorescent luminescent material and the PL emission spectrum of the blue fluorescent luminescent material.

Additionally, in the present embodiment, it is preferable that at least one of the blue fluorescent luminescent material and the green fluorescent luminescent material, and desirably both, be a TADF material, for the same reasons as those described in the fourth embodiment.

In the present embodiment too, as in the first to seventh embodiments, excitons are generated in the blue fluorescent light-emitting layer 34B in the subpixel 3B, excitons are generated in the green fluorescent light-emitting layer 34G in the subpixel 3G2, and excitons are generated in the red light-emitting layer 34R in the subpixel 3R. Even if, as in the present embodiment, the layering order of the blue fluorescent light-emitting layer 34B and the green fluorescent light-emitting layer 34G in the subpixel 3G1 is reversed from that in the first to seventh embodiments, whether excitons are generated by the blue fluorescent light-emitting layer 34B or excitons are generated by the green fluorescent light-emitting layer 34G in the subpixel 3G1 differs depending on the relationship between the carrier mobility of the material in the blue fluorescent light-emitting layer 34B having the highest content percentage and the carrier mobility of the material in the green fluorescent light-emitting layer 34G having the highest content percentage.

As described above, in the present embodiment, the green fluorescent light-emitting layer 34G is located further on the cathode electrode side (the second electrode 23 side) than the blue fluorescent light-emitting layer 34B. Thus as illustrated in FIG. 22, for example, excitons are generated in the green fluorescent light-emitting layer 34G when a hole transporting material is used for both the material in the blue fluorescent light-emitting layer 34B having the highest content percentage and the material in the green fluorescent light-emitting layer 34G having the highest content percentage.

In this case, it is desirable that a TADF material be used for both the blue fluorescent luminescent material and the green fluorescent luminescent material. When excitons are generated in the green fluorescent light-emitting layer 34G, the probability that the excitons are generated in an excited singlet state is 25%, and the probability that the excitons are generated in an excited triplet state is 75%, in the green fluorescent light-emitting layer 34G. As such, when a TADF material is not used for the green fluorescent luminescent material, the 75% excitons do not emit light, and thermally deactivate. Using a TADF material for the green fluorescent luminescent material results in excitons at the $T_1$ level being upconverted to the $S_1$ level in the subpixel 3G1, which improves the light emitting efficiency in the subpixel 3G1 and in turn improves the light emitting efficiency of the organic EL display device 1. Additionally, if a TADF material is used for the blue fluorescent luminescent material, even if, for example, excitons have been generated in the blue fluorescent light-emitting layer 34B, energy will be transferred from the blue fluorescent luminescent material to the green fluorescent luminescent material due to Förster transfer between $S_1$ levels resulting from the reverse intersystem crossing from the $T_1$ level to the $S_1$ level. Accordingly, using a TADF material for the green fluorescent luminescent material and the blue fluorescent luminescent material makes it possible to suppress blue color mixing in the subpixel 3G1 and thus improve the color level in the subpixel 3G1.

Manufacturing Method for Organic EL Display Device 1

Figure 24:
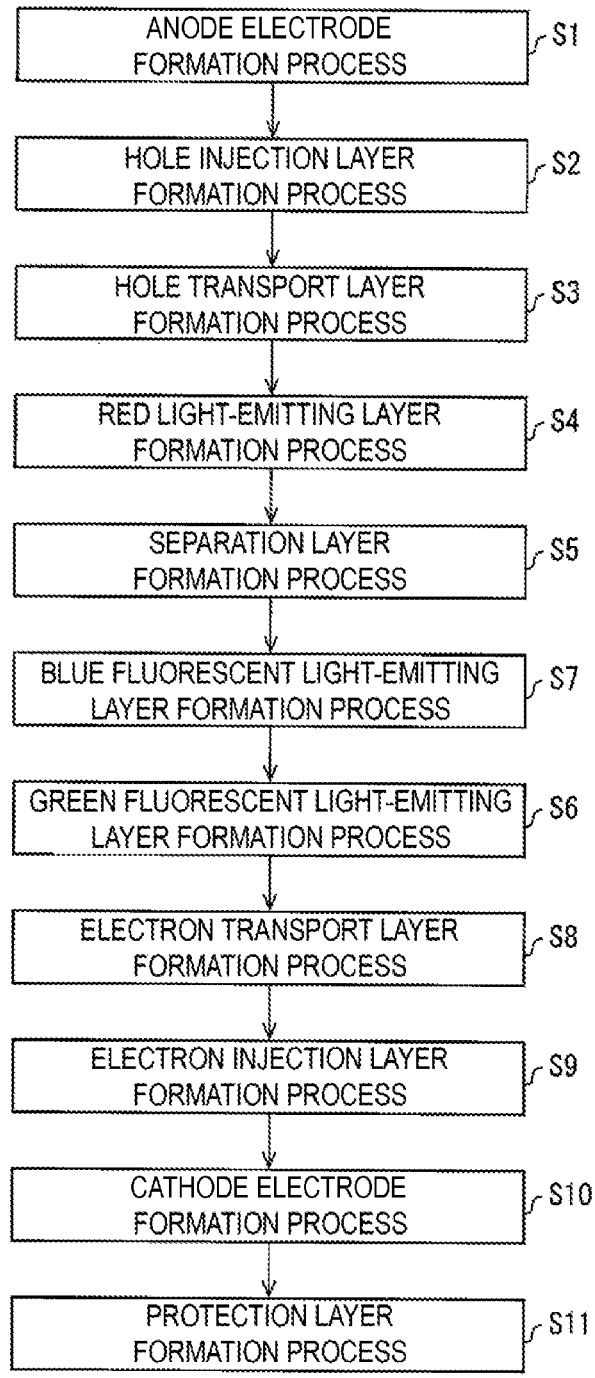
FIG. 24 is a flowchart illustrating the flow of processes for producing main portions of the organic EL display device according to the eighth embodiment of the disclosure.

FIG. 24 is a flowchart illustrating the flow of processes for producing main portions of the organic EL display device 1 according to the present embodiment.

In the present embodiment, the anode electrode formation process (S1), the hole injection layer formation process (S2), the hole transport layer formation process (S3), the red light-emitting layer formation process (S4), the separation layer formation process (S5), the blue fluorescent light-emitting layer formation process (S7), the green fluorescent light-emitting layer formation process (S6), the electron transport layer formation process (S8), the electron injection layer formation process (9), the cathode electrode formation process (S10), and the protection layer formation process (S11) are carried out in that order, as illustrated in FIG. 24. Accordingly, the organic EL display device 1 having the above-described layered structure can be produced.

In the present embodiment, the reflective electrode 21a, the light-transmissive electrode 21b, the hole injection layer 31, the hole transport layer 32, the red light-emitting layer 34R, the separation layer 35, the blue fluorescent light-emitting layer 34B, the green fluorescent light-emitting layer 34G, the electron transport layer 36, the electron injection layer 37, the second electrode 23, and the protection layer 24 are layered on TFT substrate 10, in that order from the TFT substrate 10 side, on the basis of the flowchart illustrated in FIG. 24.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2. Additionally, in the following example, a TADF material was used for both the blue fluorescent luminescent material and the green fluorescent luminescent material.

Example 9

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 135 nm/subpixel 3G2: 165 nm/subpixel 3R: 40 nm)

Hole injection layer 31: HAT-CN (10 nm)

Hole transport layer 32: TCTA (20 nm)

Red light-emitting layer 34R: CBP (host material 90%)/Ir(piq)3 (red luminescent material, 10%) (10 nm)

Separation layer 35: CBP (20 nm)

Blue fluorescent light-emitting layer 34B: mCP (host material, 90%)/DMAC-DPS (blue fluorescent luminescent material, 10%) (10 nm)

Green fluorescent light-emitting layer 34G: mCP (host material, 90%)/4CzIPN (green fluorescent luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

Advantageous Effects

According to the present embodiment, in the subpixel 3G1, the green fluorescent light-emitting layer 34G is located furthest on the cathode electrode side (i.e., the second electrode 23 side) within the light-emitting layer unit 33, as illustrated in FIGS. 22 and 23. Accordingly, if the carrier mobility provides hole transport properties in at least one of the material in the green fluorescent light-emitting layer 34G having the highest content percentage (mCP, which is the host material in Example 9) and the material in the blue fluorescent light-emitting layer 34B having the highest content percentage (mCP, which is the host material in Example 9), the probability that excitons will be generated in the green fluorescent light-emitting layer 34G increases, and the light emitting efficiency is improved.

Even if excitons are generated in the blue fluorescent light-emitting layer 34B, setting the thickness of the blue fluorescent light-emitting layer 34B to less than or equal to 10 nm as described above shortens the distance from the location where the excitons are generated to the green fluorescent light-emitting layer 34G. This is expected to improve the probability that Förster transfer will arise, improve the color level, and improve the light emitting efficiency.

Additionally, according to the present embodiment, when forming the blue fluorescent light-emitting layer 34B in common for the subpixel 3B and the subpixel 3G1 through linear deposition, even if the blue fluorescent light-emitting layer 34B has infiltrated into the subpixel 3G2 and the blue fluorescent light-emitting layer 34B has been formed under the green fluorescent light-emitting layer 34G (i.e., on the first electrode 21 side), energy is transferred from the blue fluorescent luminescent material to the green fluorescent luminescent material, and thus blue color mixing will not arise in the subpixel 3G2.

Additionally, as in the first to seventh embodiments, the red light-emitting layer 34R is located furthest on the anode electrode side (i.e., on the first electrode 21 side) in the light-emitting layer unit 33, and the red light-emitting layer formation process (S4) is carried out before the blue fluorescent light-emitting layer formation process (S7) and the green fluorescent light-emitting layer formation process (S6), in the present embodiment as well.

Thus in the present embodiment as well, when forming the red light-emitting layer 34R in common for the subpixel 3G1 and the subpixel 3R through linear deposition, even if the red light-emitting layer 34R has infiltrated into the subpixel 3B and the red light-emitting layer 34R has been formed under the blue fluorescent light-emitting layer 34B, electrons will not reach the red light-emitting layer 34R, and red color mixing will therefore not arise in the subpixel 3B, as long as the material in the blue fluorescent light-emitting layer 34B having the highest content percentage is a hole transporting material.

Likewise, when forming the red light-emitting layer 34R in common for the subpixel 3G1 and the subpixel 3R, even if the red light-emitting layer 34R has infiltrated into the subpixel 3G2 and the red light-emitting layer 34R has been formed under the green fluorescent light-emitting layer 34G, electrons will not reach the red light-emitting layer 34R, and red color mixing will therefore not arise in the subpixel 3G2, as long as the material in the green fluorescent light-emitting layer 34G having the highest content percentage is a hole transporting material.

Thus according to the present embodiment, using a hole transporting material for both the material in the blue fluorescent light-emitting layer 34B having the highest content percentage and the material in the green fluorescent light-emitting layer 34G having the highest content percentage makes it possible to achieve a configuration in which color mixing does not easily arise even if even a minute amount of the red luminescent material infiltrates into another subpixel 3 (i.e., at least one of the subpixel 3B and the subpixel 3G2) when depositing the red light-emitting layer 34R.

Ninth Embodiment

Yet another embodiment of the disclosure will be described below with reference primarily to FIGS. 3, 12, and 25 to 27. The present embodiment will describe differences from the first to eighth embodiments, and constituent elements having the same functions as the constituent elements described in the first to eighth embodiments will be assigned the same reference signs, with descriptions thereof omitted. It goes without saying that the same modifications as those of the first to eighth embodiments can be applied to the present embodiment as well.

Overall Configuration of Organic EL Display Device 1

Figure 25:
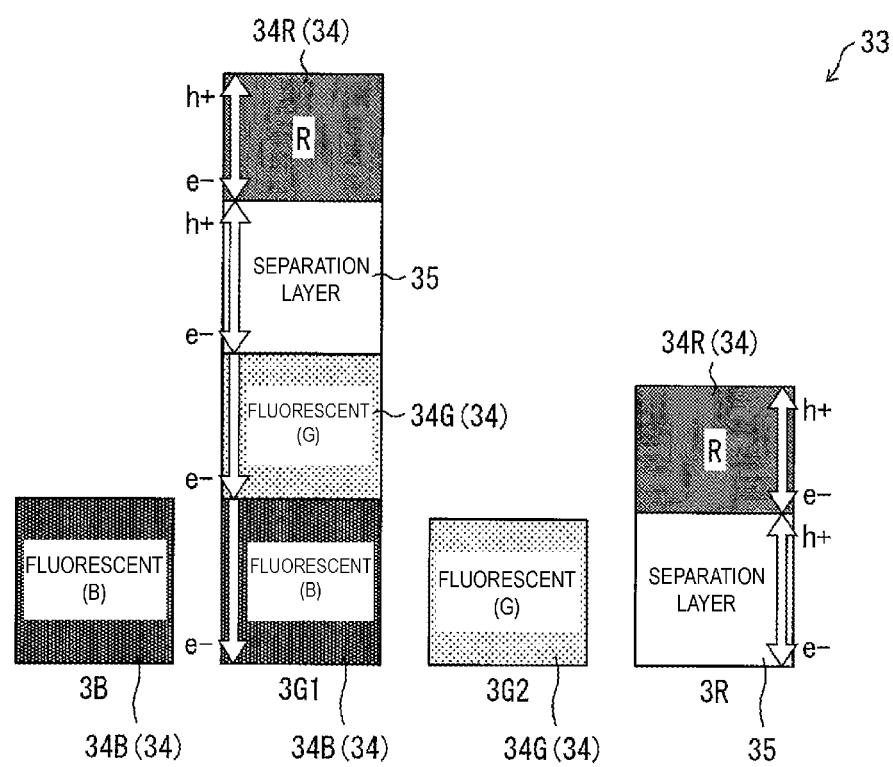
FIG. 25 is a diagram schematically illustrating a layered structure in a light-emitting layer unit of an organic EL display device according to a ninth embodiment of the disclosure.
Figure 26:
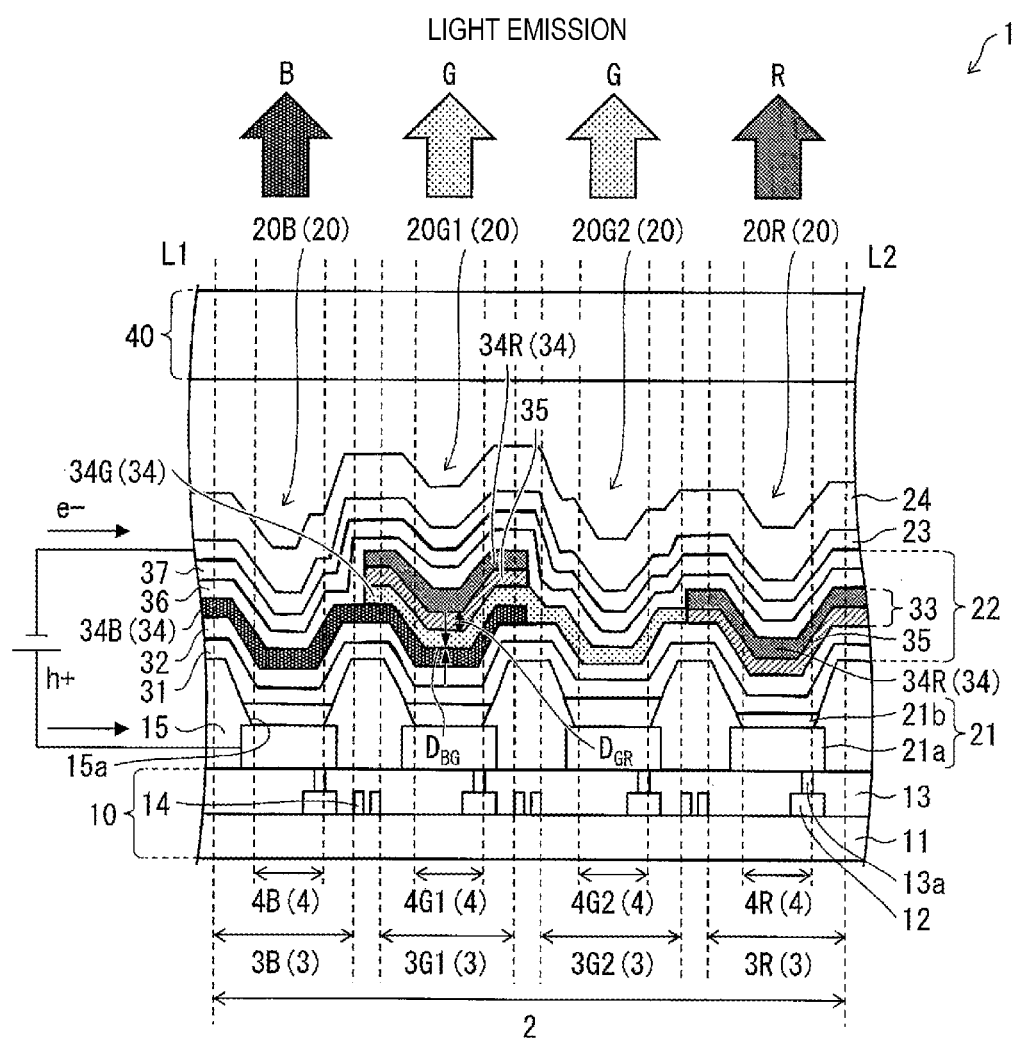
FIG. 26 is a cross-sectional view illustrating an example of the overall configuration of the organic EL display device according to the ninth embodiment of the disclosure.

FIG. 25 is a diagram schematically illustrating the layered structure of the light-emitting layer unit 33 of the organic EL display device 1 according to the present embodiment. FIG. 26 is a cross-sectional view illustrating an example of the overall configuration of the organic EL display device 1 according to the present embodiment. Note that FIG. 26 illustrates an example of the overall configuration of a single pixel area, corresponding to a cross-section taken along the line L1-L2 indicated in FIG. 3 or FIG. 12.

As illustrated in FIGS. 25 and 26, in the organic EL display device 1 according to the present embodiment, the light-emitting layer unit 33 has a configuration in which the blue fluorescent light-emitting layer 34B, the green fluorescent light-emitting layer 34G, the separation layer 35 (the first intermediate layer), and the red light-emitting layer 34R are layered in that order, from the first electrode 21 side, between the first electrode 21 and the second electrode 23.

In other words, in the present embodiment, the layering order in the light-emitting layer unit 33 is reversed from the order in the first to seventh embodiments. Thus in the present embodiment, an electron transporting material is used for at least one, and desirably both, of the material in the green fluorescent light-emitting layer 34G having the highest content percentage and the material in the blue fluorescent light-emitting layer 34B having the highest content percentage. Aside from these points, the organic EL display device 1 according to the present embodiment has the same configuration as the organic EL display device 1 according to the first to seventh embodiments. For example, aside from the above-described differences, the organic EL display device 1 illustrated in FIG. 26 has the same configuration as the organic EL display device 1 according to the first embodiment, for example.

Note that FIGS. 25 and 26 illustrate, as an example, a case where only the separation layer 35, which is the first intermediate layer, is provided as an intermediate layer in the subpixel 3G1, to simplify the descriptions and illustrations. However, the present embodiment is not limited thereto, and the subpixel 3G1 may include the separation layer 35 (the first intermediate layer) and the blocking layer 38 (the second intermediate layer) as the intermediate layer. Additionally, as described above, the separation layer 35 may be a layered body including the first separation layer 35a and the second separation layer 35b.

However, in the present embodiment, a bipolar transporting material or an electron transporting material is used for the red light-emitting layer 34R. On the other hand, a material that as a whole has bipolar transport properties is used for the intermediate layer, such as the separation layer 35, in the same manner as in the first to eighth embodiments.

In the present embodiment, too, the thickness of the blue fluorescent light-emitting layer 34B is preferably set to less than or equal to 10 nm, for the same reasons as those described in the first embodiment.

Additionally, in the present embodiment, it is preferable, for the same reasons as those described in the first embodiment, that part of the PL emission spectrum of the blue fluorescent luminescent material overlap with part of the absorption spectrum of the green fluorescent luminescent material. It is also preferable that no overlap be present between the absorption spectrum of the material of the separation layer 35 and the PL emission spectrum of the fluorescent luminescent material of at least the light-emitting layer, among the blue fluorescent light-emitting layer 34B and the green fluorescent light-emitting layer 34G provided on the opposite side of the separation layer 35 from the red light-emitting layer 34R, that is adjacent to the separation layer 35 (the green fluorescent light-emitting layer 34G, in the present embodiment), and further preferable that no overlap be present between the PL emission spectrum of the green fluorescent luminescent material and the PL emission spectrum of the blue fluorescent luminescent material.

Additionally, in the present embodiment too, it is preferable that at least one of the blue fluorescent luminescent material and the green fluorescent luminescent material, and desirably both, be a TADF material, for the same reasons as those described in the fourth embodiment.

In the present embodiment too, as in the first to seventh embodiments, excitons are generated in the blue fluorescent light-emitting layer 34B in the subpixel 3B, excitons are generated in the green fluorescent light-emitting layer 34G in the subpixel 3G2, and excitons are generated in the red light-emitting layer 34R in the subpixel 3R. In the subpixel 3G1, whether excitons are generated in the blue fluorescent light-emitting layer 34B or in the green fluorescent light-emitting layer 34G is determined by the relationship between the carrier mobility of the material in the blue fluorescent light-emitting layer 34B having the highest content percentage and the carrier mobility of the material in the green fluorescent light-emitting layer 34G having the highest content percentage.

As described above, in the present embodiment, the layering order in the light-emitting layer unit 33 is reversed from the order in the first to seventh embodiments. Excitons are therefore generated in the blue fluorescent light-emitting layer 34B when an electron transporting material is used for both the material in the green fluorescent light-emitting layer 34G having the highest content percentage and the material in the blue fluorescent light-emitting layer 34B having the highest content percentage, as illustrated in FIG. 25, for example. Thus in this case, it is desirable that a TADF material be used for at least the blue fluorescent luminescent material, for the same reasons as those described in the fourth embodiment.

Manufacturing Method for Organic EL Display Device 1

Figure 27:
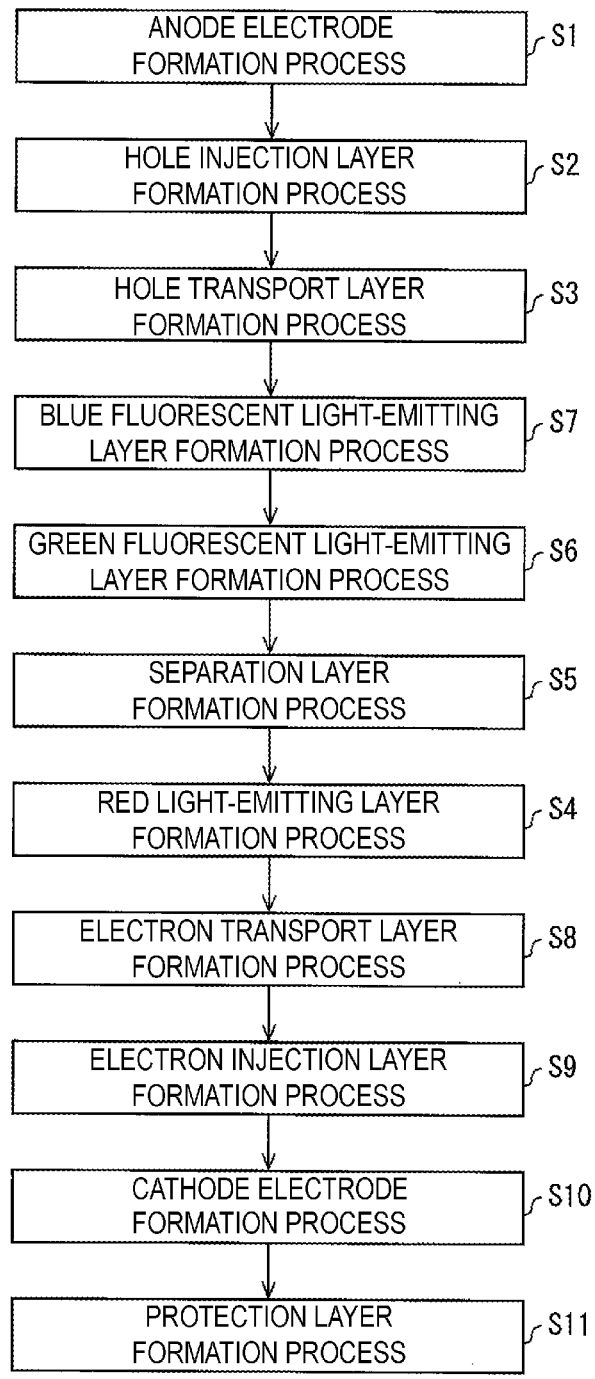
FIG. 27 is a flowchart illustrating the flow of processes for producing main portions of an organic EL display device according to a ninth embodiment of the disclosure.

FIG. 27 is a flowchart illustrating the flow of processes for producing main portions of the organic EL display device 1 according to the present embodiment.

In the present embodiment, the anode electrode formation process (S1), the hole injection layer formation process (S2), the hole transport layer formation process (S3), the blue fluorescent light-emitting layer formation process (S7), the green fluorescent light-emitting layer formation process (S6), the separation layer formation process (S5), the red light-emitting layer formation process (S4), the electron transport layer formation process (S8), the electron injection layer formation process (S9), the cathode electrode formation process (S10), and the protection layer formation process (S11) are carried out in that order, as illustrated in FIG. 27. Accordingly, the organic EL display device 1 having the above-described layered structure can be produced.

In the present embodiment, the reflective electrode 21a, the light-transmissive electrode 21b, the hole injection layer 31, the hole transport layer 32, the blue fluorescent light-emitting layer 34B, the green fluorescent light-emitting layer 34G, the separation layer 35, the red light-emitting layer 34R, the electron transport layer 36, the electron injection layer 37, the second electrode 23, and the protection layer 24 are layered on the TFT substrate 10, in that order from the TFT substrate 10 side, on the basis of the flowchart illustrated in FIG. 27.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 10

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 135 nm/subpixel 3G2: 165 nm/subpixel 3R: 40 nm)

Hole injection layer 31: HAT-CN (10 nm)

Hole transport layer 32: TCTA (20 nm)

Blue fluorescent light-emitting layer 34B: DPEPO (host material, 90%)/DMAC-DPS (blue fluorescent luminescent material, 10%) (10 nm)

Green fluorescent light-emitting layer 34G: BCP (host material, 90%)/coumarin 6 (green fluorescent luminescent material, 10%) (10 nm)

Separation layer 35: CBP (20 nm)

Red light-emitting layer 34R: CBP (host material 90%)/Ir(piq)3 (red luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

Advantageous Effects

In the present embodiment, the layering order in the light-emitting layer unit 33 is reversed from that in the first to seventh embodiments as described above. As such, using an electron transporting material for at least one, and desirably both, of the material in the green fluorescent light-emitting layer 34G having the highest content percentage and the material in the blue fluorescent light-emitting layer 34B having the highest content percentage makes it difficult for color mixing to arise, and thus the light emitting efficiency can be improved.

Thus if a host material having good compatibility with the dopant material, which can improve the light emitting efficiency of the dopant material, a host material having a high $S_1$ level or $T_1$ level, which can suppress a drop in efficiency caused by energy transfer to the host material, is an electron transporting material, using the above-described layering order in the light-emitting layer unit 33 makes it possible to provide an organic EL display device 1 having better properties.

With respect to the recent state of development in the organic EL display device industry, host materials having hole transport properties can be synthesized more easily and have a wider range of types that host materials having electron transport properties, and have undergone much more development. Selecting a host material having electron transport properties as the host material therefore makes it easier to obtain a material having favorable properties than when selecting a host material having hole transport properties.

In reality, electron transporting materials having extremely high electron mobility are better known than hole transporting materials having extremely high hole mobility. Host materials having electron transport properties thus tend to have lower voltages than host materials having hole transport properties seen in the current market. Accordingly, lower voltages can be anticipated in the organic EL display device 1 according to the present embodiment than in the organic EL display device 1 according to the first to eighth embodiments.

Additionally, according to the present embodiment, when forming the blue fluorescent light-emitting layer 34B in common for the subpixel 3B and the subpixel 3G1 through linear deposition, even if the blue fluorescent light-emitting layer 34B has infiltrated into the subpixel 3G2 and the blue fluorescent light-emitting layer 34B has been formed under the green fluorescent light-emitting layer 34G (i.e., on the first electrode 21 side), energy is transferred from the blue fluorescent luminescent material to the green fluorescent luminescent material, and thus blue color mixing will not arise in the subpixel 3G2.

Additionally, in the present embodiment, the red light-emitting layer 34R is located furthest on the cathode electrode side (i.e., the second electrode 23 side) in the light-emitting layer unit 33, and the red light-emitting layer formation process (S4) is carried out after the blue fluorescent light-emitting layer formation process (S7) and the green fluorescent light-emitting layer formation process (S6).

Thus according to the present embodiment, when forming the red light-emitting layer 34R in common for the subpixel 3G1 and the subpixel 3R through linear deposition, even if the red light-emitting layer 34R has infiltrated into the subpixel 3B and the red light-emitting layer 34R has been formed above the blue fluorescent light-emitting layer 34B (i.e., on the second electrode 23 side), holes will not reach the red light-emitting layer 34R, and red color mixing will therefore not arise in the subpixel 3B, as long as the material in the blue fluorescent light-emitting layer 34B having the highest content percentage is an electron transporting material.

Likewise, when forming the red light-emitting layer 34R in common for the subpixel 3G1 and the subpixel 3R, even if the red light-emitting layer 34R has infiltrated into the subpixel 3G2 and the red light-emitting layer 34R has been formed above the green fluorescent light-emitting layer 34G, holes will not reach the red light-emitting layer 34R, and red color mixing will therefore not arise in the subpixel 3G2, as long as the material in the green fluorescent light-emitting layer 34G having the highest content percentage is an electron transporting material.

Thus according to the present embodiment, using an electron transporting material for both the material in the blue fluorescent light-emitting layer 34B having the highest content percentage and the material in the green fluorescent light-emitting layer 34G having the highest content percentage makes it possible to achieve a configuration in which color mixing does not easily arise even if even a minute amount of the red luminescent material infiltrates into another subpixel 3 (i.e., at least one of the subpixel 3B and the subpixel 3G2) when depositing the red light-emitting layer 34R.

Tenth Embodiment

Yet another embodiment of the disclosure will be described below with reference primarily to FIGS. 3, 12, and 28 to 30. The present embodiment will describe differences from the first to ninth embodiments, and constituent elements having the same functions as the constituent elements described in the first to ninth embodiments will be assigned the same reference signs, with descriptions thereof omitted. It goes without saying that the same modifications as those of the first to ninth embodiments can be applied to the present embodiment as well.

Overall Configuration of Organic EL Display Device 1

Figure 28:
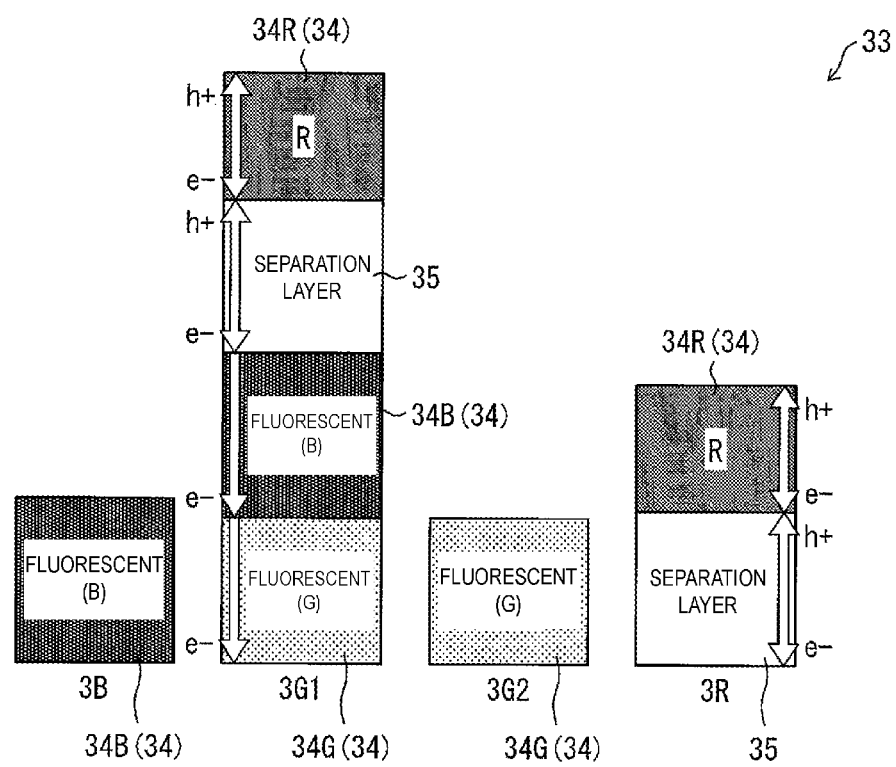
FIG. 28 is a diagram schematically illustrating a layered structure in a light-emitting layer unit of an organic EL display device according to a tenth embodiment of the disclosure.
Figure 29:
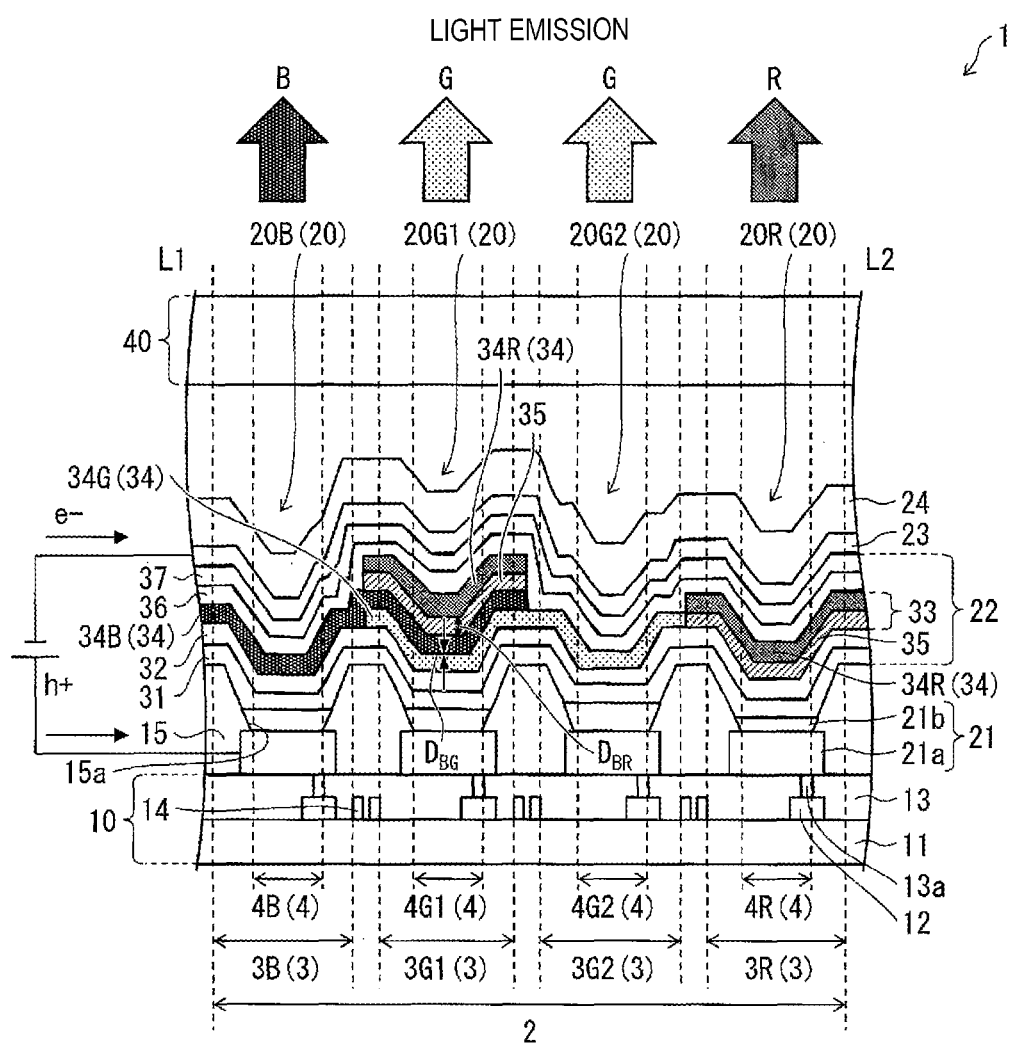
FIG. 29 is a cross-sectional view illustrating an example of the overall configuration of the organic EL display device according to the tenth embodiment of the disclosure.

FIG. 28 is a diagram schematically illustrating the layered structure of the light-emitting layer unit 33 of the organic EL display device 1 according to the present embodiment. FIG. 29 is a cross-sectional view illustrating an example of the overall configuration of the organic EL display device 1 according to the present embodiment. Note that FIG. 29 illustrates an example of the overall configuration of a single pixel area, corresponding to a cross-section taken along the line L1-L2 indicated in FIG. 3 or FIG. 12.

As illustrated in FIGS. 28 and 29, in the organic EL display device 1 according to the present embodiment, the light-emitting layer unit 33 has a configuration in which the green fluorescent light-emitting layer 34G, the blue fluorescent light-emitting layer 34B, the separation layer 35 (the first intermediate layer), and the red light-emitting layer 34R are layered in that order, from the first electrode 21 side, between the first electrode 21 and the second electrode 23.

More specifically, the light-emitting layer unit 33 in the organic EL display device 1 according to the present embodiment has the same configuration as the light-emitting layer unit 33 in the organic EL display device 1 according to the ninth embodiment, aside from that the layering order of the blue fluorescent light-emitting layer 34B and the green fluorescent light-emitting layer 34G is reversed in the subpixel 3G1, and the green fluorescent light-emitting layer 34G is located closer to the second electrode 23, which is a cathode electrode, than the blue fluorescent light-emitting layer 34B.

Note that in the present embodiment as well, FIGS. 28 and 29 illustrate, as an example, a case where only the separation layer 35, which is the first intermediate layer, is provided as an intermediate layer in the subpixel 3G1, to simplify the descriptions and illustrations. However, the present embodiment is not limited thereto, and the subpixel 3G1 may include the separation layer 35 (the first intermediate layer) and the blocking layer 38 (the second intermediate layer) as the intermediate layer. Additionally, as described above, the separation layer 35 may be a layered body including the first separation layer 35a and the second separation layer 35b.

In the present embodiment, the blue fluorescent light-emitting layer 34B and the red light-emitting layer 34R are adjacent in the layering direction, with the separation layer 35 interposed therebetween, as illustrated in FIGS. 28 and 29. Thus as in the eighth embodiment, in the present embodiment, the distance between opposing surfaces of the blue fluorescent light-emitting layer 34B and the red light-emitting layer 34R (the opposing surface distance $D_{BR}$), i.e., a distance between the surface of the blue fluorescent light-emitting layer 34B located furthest on the red light-emitting layer 34R side (an upper surface of the blue fluorescent light-emitting layer 34B, in the present embodiment) and the surface of the red light-emitting layer 34R located furthest on the blue fluorescent light-emitting layer 34B side (a lower surface of the red light-emitting layer 34R, in the present embodiment), which is equal to the thickness of the separation layer 35, is set to a distance exceeding the Förster radius. Note that like the opposing surface distance $D_{GR}$, the opposing surface distance $D_{BR}$ is preferably greater than or equal to 15 nm and less than or equal to 50 nm, and more preferably greater than or equal to 15 nm and less than or equal to 30 nm, in the present embodiment as well.

Also, like the ninth embodiment, in the present embodiment too, it is preferable that an electron transporting material be used for the material of at least one, and desirably both, of the material in the green fluorescent light-emitting layer 34G having the highest content percentage and the material in the blue fluorescent light-emitting layer 34B having the highest content percentage. Also, like the ninth embodiment, in the present embodiment too, a bipolar transporting material or a hole transporting material is used for the red light-emitting layer 34R, and a material having bipolar transport properties as a whole is used for the intermediate layer such as the separation layer 35 and the like.

In the present embodiment, too, the thickness of the blue fluorescent light-emitting layer 34B is preferably set to less than or equal to 10 nm, for the same reasons as those described in the first embodiment.

Additionally, in the present embodiment, it is preferable, for the same reasons as those described in the first embodiment, that part of the PL emission spectrum of the blue fluorescent luminescent material overlap with part of the absorption spectrum of the green fluorescent luminescent material. It is also preferable that no overlap be present between the absorption spectrum of the material of the separation layer 35 and the PL emission spectrum of the fluorescent luminescent material of at least the light-emitting layer, among the blue fluorescent light-emitting layer 34B and the green fluorescent light-emitting layer 34G provided on the opposite side of the separation layer 35 from the red light-emitting layer 34R, that is adjacent to the separation layer 35 (the blue fluorescent light-emitting layer 34B, in the present embodiment), and further preferable that no overlap be present between the PL emission spectrum of the green fluorescent luminescent material and the PL emission spectrum of the blue fluorescent luminescent material.

In the present embodiment too, the organic EL display device 1 according to the present embodiment has a configuration in which, in the organic EL display device 1 according to the ninth embodiment, the layering order of the blue fluorescent light-emitting layer 34B and the green fluorescent light-emitting layer 34G is reversed in the subpixel 3G1, as described above. On the other hand, the organic EL display device 1 according to the present embodiment can be said to have the same configuration as the organic EL display device 1 according to the eighth embodiment aside from the following: that the layering order of the light-emitting layer unit 33 is reversed from the layering order in the organic EL display device 1 according to the eighth embodiment; that an electron transporting material is used for at least one, and desirably both, of the material in the green fluorescent light-emitting layer 34G having the highest content percentage and the material in the blue fluorescent light-emitting layer 34B having the highest content percentage; and that a bipolar transporting material or a hole transporting material is used for the red light-emitting layer 34R.

In the present embodiment, the green fluorescent light-emitting layer 34G is located further on the anode electrode side (the first electrode 21 side) than the blue fluorescent light-emitting layer 34B, which is opposite from the eighth and ninth embodiments. Thus as illustrated in FIG. 28, for example, excitons are generated in the green fluorescent light-emitting layer 34G, in the same manner as in the organic EL display device 1 described in the eighth embodiment with reference to FIG. 22, when an electron transporting material is used for both the material in the blue fluorescent light-emitting layer 34B having the highest content percentage and the material in the green fluorescent light-emitting layer 34G having the highest content percentage.

Thus according to the organic EL display device 1 illustrated in FIG. 28, it is desirable that a TADF material be used for both the blue fluorescent luminescent material and the green fluorescent luminescent material, for the same reasons as those described in the eighth embodiment.

Of course, in the subpixel 3G1, whether excitons are generated in the blue fluorescent light-emitting layer 34B or in the green fluorescent light-emitting layer 34G is determined by the relationship between the carrier mobility of the material in the blue fluorescent light-emitting layer 34B having the highest content percentage and the carrier mobility of the material in the green fluorescent light-emitting layer 34G having the highest content percentage, in the present embodiment as well. Thus the present embodiment is not limited to the above-described configuration, and at least one of the blue fluorescent luminescent material and the green fluorescent luminescent material may be a TADF material.

Manufacturing Method for Organic EL Display Device 1

Figure 30:
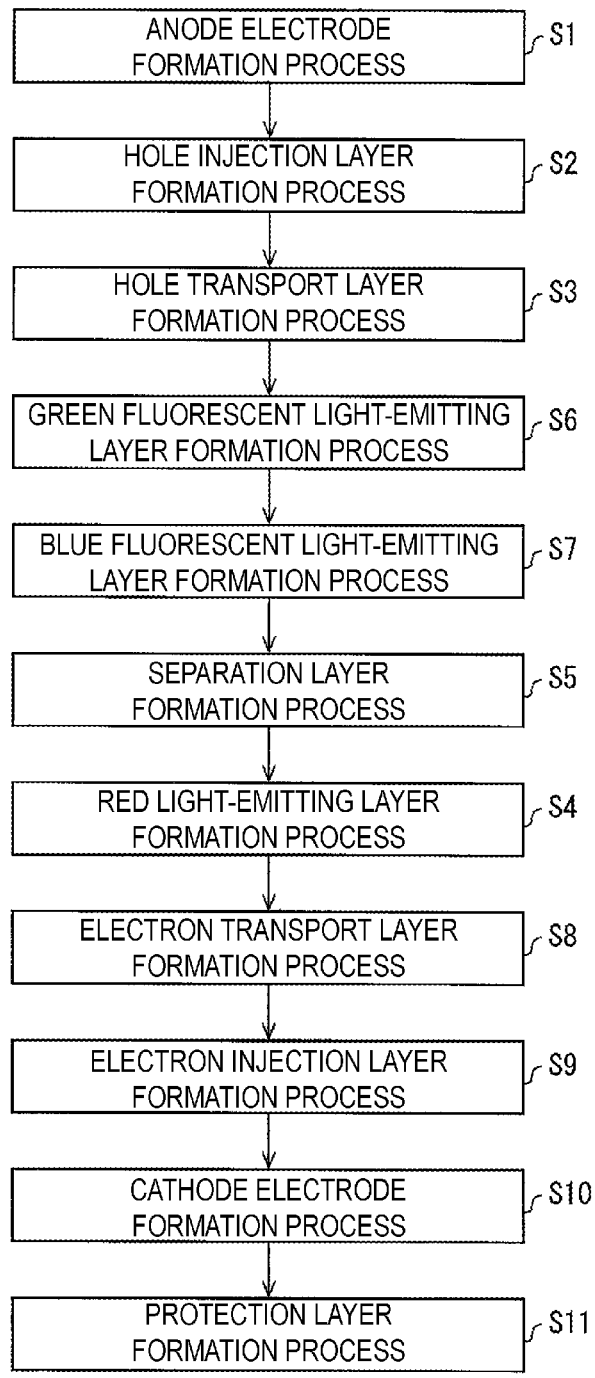
FIG. 30 is a flowchart illustrating the flow of processes for producing main portions of an organic EL display device according to the tenth embodiment of the disclosure.

FIG. 30 is a flowchart illustrating the flow of processes for producing main portions of the organic EL display device 1 according to the present embodiment.

In the present embodiment, the anode electrode formation process (S1), the hole injection layer formation process (S2), the hole transport layer formation process (S3), the green fluorescent light-emitting layer formation process (S6), the blue fluorescent light-emitting layer formation process (S7), the separation layer formation process (S5), the red light-emitting layer formation process (S4), the electron transport layer formation process (S8), the electron injection layer formation process (S9), the cathode electrode formation process (S10), and the protection layer formation process (S11) are carried out in that order, as illustrated in FIG. 30. Accordingly, the organic EL display device 1 having the above-described layered structure can be produced.

In the present embodiment, the reflective electrode 21a, the light-transmissive electrode 21b, the hole injection layer 31, the hole transport layer 32, the green fluorescent light-emitting layer 34G, the blue fluorescent light-emitting layer 34B, the separation layer 35, the red light-emitting layer 34R, the electron transport layer 36, the electron injection layer 37, the second electrode 23, and the protection layer 24 are layered on the TFT substrate 10, in that order from the TFT substrate 10 side, on the basis of the flowchart illustrated in FIG. 30.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2. Additionally, in the following example, a TADF material was used for both the blue fluorescent luminescent material and the green fluorescent luminescent material.

Example 11

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 135 nm/subpixel 3G2: 165 nm/subpixel 3R: 40 nm)

Hole injection layer 31: HAT-CN (10 nm)

Hole transport layer 32: TCTA (20 nm)

Green fluorescent light-emitting layer 34G: BCP (host material, 90%)/4CzIPN (green fluorescent luminescent material, 10%) (10 nm)

Blue fluorescent light-emitting layer 34B: DPEPO (host material, 90%)/DMAC-DPS (blue fluorescent luminescent material, 10%) (10 nm)

Separation layer 35: CBP (20 nm)

Red light-emitting layer 34R: CBP (host material 90%)/Ir(piq)3 (red luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

Advantageous Effects

According to the present embodiment, in the subpixel 3G1, the green fluorescent light-emitting layer 34G is located furthest on the anode electrode side (i.e., the first electrode 21 side) within the light-emitting layer unit 33, as illustrated in FIGS. 28 and 29. Accordingly, if as described above the carrier mobility provides electron transport properties in at least one of the material in the green fluorescent light-emitting layer 34G having the highest content percentage (DPEPO, which is the host material in Example 11) and the material in the blue fluorescent light-emitting layer 34B having the highest content percentage (BCP, which is the host material in Example 11), the probability that excitons will be generated in the green fluorescent light-emitting layer 34G increases, and the light emitting efficiency is improved.

Even if excitons are generated in the blue fluorescent light-emitting layer 34B, setting the thickness of the blue fluorescent light-emitting layer 34B to less than or equal to 10 nm as described above shortens the distance from the location where the excitons are generated to the green fluorescent light-emitting layer 34G. This is expected to improve the probability that Förster transfer will arise, improve the color level, and improve the light emitting efficiency.

Additionally, according to the present embodiment, when forming the blue fluorescent light-emitting layer 34B in common for the subpixel 3B and the subpixel 3G1 through linear deposition, even if the blue fluorescent light-emitting layer 34B has infiltrated into the subpixel 3G2 and the blue fluorescent light-emitting layer 34B has been formed above the green fluorescent light-emitting layer 34G (i.e., on the second electrode 23 side), energy is transferred from the blue fluorescent luminescent material to the green fluorescent luminescent material, and thus blue color mixing will not arise in the subpixel 3G2.

Additionally, in the present embodiment, the red light-emitting layer 34R is located furthest on the cathode electrode side (i.e., the second electrode 23 side) within the light-emitting layer unit 33, as in the ninth embodiment. The red light-emitting layer formation process (S4) is carried out after the green fluorescent light-emitting layer formation process (S6) and the blue fluorescent light-emitting layer formation process (S7).

Thus according to the present embodiment, when forming the red light-emitting layer 34R in common for the subpixel 3G1 and the subpixel 3R through linear deposition, even if the red light-emitting layer 34R has infiltrated into the subpixel 3B and the red light-emitting layer 34R has been formed above the blue fluorescent light-emitting layer 34B (i.e., on the second electrode 23 side), holes will not reach the red light-emitting layer 34R, and red color mixing will therefore not arise in the subpixel 3B, as long as the material in the blue fluorescent light-emitting layer 34B having the highest content percentage is an electron transporting material.

Likewise, when forming the red light-emitting layer 34R in common for the subpixel 3G1 and the subpixel 3R, even if the red light-emitting layer 34R has infiltrated into the subpixel 3G2 and the red light-emitting layer 34R has been formed above the green fluorescent light-emitting layer 34G, holes will not reach the red light-emitting layer 34R, and red color mixing will therefore not arise in the subpixel 3G2, as long as the material in the green fluorescent light-emitting layer 34G having the highest content percentage is an electron transporting material.

Thus according to the present embodiment as well, using an electron transporting material for both the material in the blue fluorescent light-emitting layer 34B having the highest content percentage and the material in the green fluorescent light-emitting layer 34G having the highest content percentage makes it possible to achieve a configuration in which color mixing does not easily arise even if even a minute amount of the red luminescent material infiltrates into another subpixel 3 (i.e., at least one of the subpixel 3B and the subpixel 3G2) when depositing the red light-emitting layer 34R, as in the ninth embodiment.

Additionally, in the present embodiment as well, if a host material having good compatibility with the dopant material, a host material having a high $S_1$ level or $T_1$ level, which can suppress a drop in efficiency caused by energy transfer to the host material, is an electron transporting material, using the above-described layering order in the light-emitting layer unit 33 makes it possible to provide an organic EL display device 1 having better properties, like in the ninth embodiment.

Furthermore, as described in the ninth embodiment, selecting a host material having electron transport properties as the host material makes it easy to obtain a material having better properties than a host material having hole transport properties. Host materials having electron transport properties also tend to have lower voltages than host materials having hole transport properties seen in the current market. Accordingly, lower voltages can be anticipated in the organic EL display device 1 according to the present embodiment than in the organic EL display device 1 according to the first to eighth embodiments, in the same manner as the organic EL display device 1 according to the ninth embodiment.

Eleventh Embodiment

Yet another embodiment of the disclosure will be described below with reference primarily to FIGS. 3, 9A, 10, 12, 13A, 31, and 32. The present embodiment will describe differences from the first to tenth embodiments, and constituent elements having the same functions as the constituent elements described in the first to tenth embodiments will be assigned the same reference signs, with descriptions thereof omitted. It goes without saying that the same modifications as those of the first to tenth embodiments can be applied to the present embodiment as well.

Overall Configuration of Organic EL Display Device 1

Figure 31:
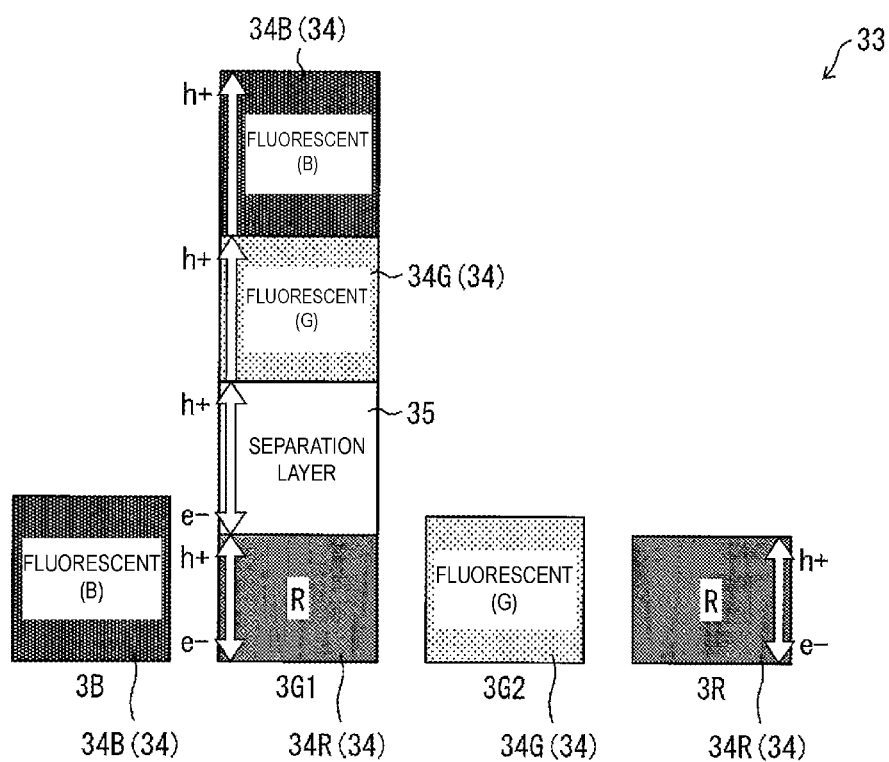
FIG. 31 is a diagram schematically illustrating a layered structure in a light-emitting layer unit of an organic EL display device according to an eleventh embodiment of the disclosure.
Figure 32:
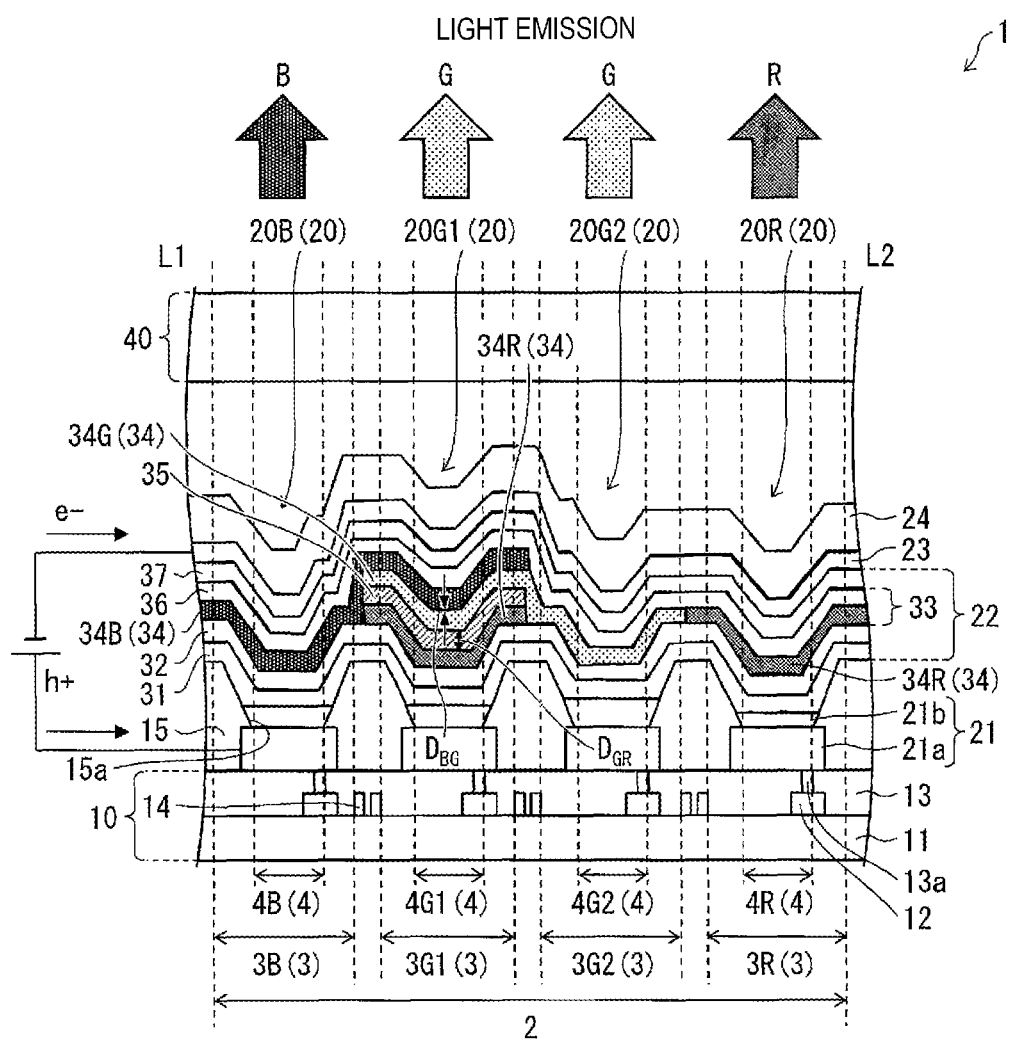
FIG. 32 is a cross-sectional view illustrating an example of the overall configuration of the organic EL display device according to the eleventh embodiment of the disclosure.

FIG. 31 is a diagram schematically illustrating the layered structure of the light-emitting layer unit 33 of the organic EL display device 1 according to the present embodiment. FIG. 32 is a cross-sectional view illustrating an example of the overall configuration of the organic EL display device 1 according to the present embodiment. Note that FIG. 32 illustrates an example of the overall configuration of a single pixel area, corresponding to a cross-section taken along the line L1-L2 indicated in FIG. 3 or FIG. 12.

As illustrated in FIGS. 31 and 32, the organic EL display device 1 according to the present embodiment has the same configuration as the organic EL display device 1 described in the first to ninth embodiments, aside from the separation layer 35 being selectively formed in the subpixel 3G1 (i.e., the separation layer 35 being provided only between the red light-emitting layer 34R and the green fluorescent light-emitting layer 34G in the subpixel 3G1). Note that FIGS. 31 and 32 illustrate, as an example a case where the organic EL display device 1 according to the present embodiment has the same configuration as the organic EL display device 1 according to the first embodiment or the third embodiment, aside from the separation layer 35 being provided only between the red light-emitting layer 34R and the green fluorescent light-emitting layer 34G in the subpixel 3G1.

Manufacturing Method for Organic EL Display Device 1

The manufacturing method for the organic EL display device 1 according to the present embodiment is the same as the manufacturing method for the organic EL display device 1 described in the first embodiment or the third embodiment, for example, aside from that after the red light-emitting layer 34R is linearly deposited using the vapor deposition mask 70R illustrated in FIG. 9A or FIG. 13A in the red light-emitting layer formation process (S4), the separation layer 35 is formed using a dedicated vapor deposition mask having openings corresponding only to the subpixel 3G1 in the separation layer formation process (S5).

However, layering the separation layer 35 only in the subpixel 3G2 in this manner as in the present embodiment changes the overall thickness of the function layers (organic layers) in the subpixel 3R from that in the first and third embodiments. As such, optical optimization is carried out, and the thickness of the light-transmissive electrode 21b in the subpixel 3R is changed from that in the first and third embodiments.

In the present embodiment, the reflective electrode 21a, the light-transmissive electrode 21b, the hole injection layer 31, the hole transport layer 32, the red light-emitting layer 34R, the separation layer 35, the green fluorescent light-emitting layer 34G, the blue fluorescent light-emitting layer 34B, the electron transport layer 36, the electron injection layer 37, the second electrode 23, and the protection layer 24 are layered on the TFT substrate 10, in that order from the TFT substrate 10 side, on the basis of the flowchart illustrated in FIG. 10.

Materials for the layers layered on the TFT substrate 10 and thicknesses thereof are as follows. However, the dimensions and materials denoted below are merely examples, and the present embodiment is not intended to be limited to these specific dimensions and materials. As described above, the following example also assumes that the thickness of the light-transmissive electrode 21b has been optically optimized through optical simulations to align the luminescent color of the subpixel 3G1 and the luminescent color of the subpixel 3G2.

Example 12

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 135 nm/subpixel 3G2: 165 nm/subpixel 3R: 60 nm)
  Hole injection layer 31: HAT-CN (10 nm)
  Hole transport layer 32: TCTA (20 nm)
  Red light-emitting layer 34R: CBP (host material 90%)/Ir(piq)3 (red luminescent material, 10%) (10 nm)
  Separation layer 35: CBP (20 nm)
  Green fluorescent light-emitting layer 34G: TPD (host material, 90%)/coumarin 6 (green fluorescent luminescent material, 10%) (10 nm)
  Blue fluorescent light-emitting layer 34B: ADN (host material, 90%)/TBPe (blue fluorescent luminescent material, 10%) (10 nm)
  Electron transport layer 36: BCP (30 nm)
  Electron injection layer 37: LiF (1 nm)
  Second electrode 23 (cathode electrode, semitransparent electrode): Ag—Mg alloy (Ag/Mg mixing ratio=0.9/0.1) (20 nm)
  Protection layer 24: ITO (80 nm)

Advantageous Effects

According to the present embodiment, because the separation layer 35 is patterned and formed only in the subpixel 3G1 (i.e., the separation layer 35 is not provided in the subpixel 3R), it is easy for carrier recombination to arise in the red light-emitting layer 34R, which makes it possible to increase the light emitting efficiency.

Additionally, according to the present embodiment, one additional instance of separate-pattern deposition than in the first embodiment is carried out; however, even if a minute amount of the separation layer 35 itself infiltrates into another subpixel 3 due to shadow or the like, energy transfer will not be inhibited if the separation layer 35 is thin, and thus precision is not required for the pattern openings.

Modified Example

The present embodiment describes and illustrates, as an example, a case where the separation layer 35 is formed only in the subpixel 3G1 in the organic EL display devices 1 according to the first and third embodiments. However, it goes without saying that a configuration may also be employed in which the separation layer 35 is formed only in the subpixel 3G1 in the organic EL display devices 1 according to the second and fourth to tenth embodiments. Accordingly, in each embodiment, the above-described effects can be achieved along with the effects described in those individual embodiments.

CONCLUSION

A display device (e.g., the organic EL display device 1) according to Aspect 1 of the disclosure includes: a plurality of pixels (the pixels 2), each including a first subpixel (e.g., the subpixel 3B), a second subpixel (e.g., the subpixel 3G1), a third subpixel (e.g., the subpixel 3G2), and a fourth subpixel (e.g., the subpixel 3R), wherein a first light-emitting layer containing a first fluorescent luminescent material (e.g., the blue fluorescent light-emitting layer 34B) is provided in common for the first subpixel and the second subpixel; a second light-emitting layer containing a second fluorescent luminescent material (e.g., the green fluorescent light-emitting layer 34G) is provided in common for the second subpixel and the third subpixel; a third light-emitting layer containing a third luminescent material (e.g., the red light-emitting layer 34R) is provided in common for the second subpixel and the fourth subpixel; an energy level (S level) of the second fluorescent luminescent material in a minimum excited singlet state is lower than an energy level of the first fluorescent luminescent material in a minimum excited singlet state and higher than an energy level of the third luminescent material in a minimum excited singlet state; in the second subpixel, a distance between opposing surfaces of the first light-emitting layer and the second light-emitting layer (e.g., the opposing surface distance $D_{BG}$) is less than or equal to a Förster radius, and a separation layer (the separation layer 35) that inhibits Förster-type energy transfer is layered between the third light-emitting layer and the light-emitting layer, of the first light-emitting layer and the second light-emitting layer, that is located closer to the third light-emitting layer; in the first subpixel, the first fluorescent luminescent material emits light, and the light emitted from the first fluorescent luminescent material is emitted to the exterior; in the second subpixel and the third subpixel, the second fluorescent luminescent material emits light, and the light emitted from the second fluorescent luminescent material is emitted to the exterior; in the fourth subpixel, the third luminescent material emits light, and the light emitted from the third luminescent material is emitted to the exterior; the first fluorescent luminescent material emits light having a first peak wavelength; the second fluorescent luminescent material emits light having a second peak wavelength longer than the first peak wavelength; and the third luminescent material emits light having a third peak wavelength longer than the second peak wavelength.

As a display device according to Aspect 2 of the disclosure, in Aspect 1, the device may further include: an anode electrode (e.g., the first electrode 21) and a cathode electrode (e.g., the second electrode 23), wherein one of the anode electrode and the cathode electrode may include a reflective electrode (e.g., the reflective electrode 21a), and the other may be a light-transmissive electrode; in each pixel, a plurality of function layers including the first light-emitting layer, the second light-emitting layer, the third light-emitting layer, and the separation layer (e.g., the hole injection layer 31, the hole transport layer 32, the blue fluorescent light-emitting layer 34B, the green fluorescent light-emitting layer 34G, the red light-emitting layer 34R, the separation layer 35, the blocking layer 38, the electron transport layer 36, and the electron injection layer 37) may be provided between the anode electrode and the cathode electrode; in the first subpixel, the light emitted from the first fluorescent luminescent material may be emitted through the light-transmissive electrode to the exterior, directly or having been reflected in multiple between the reflective electrode and the light-transmissive electrode in the first subpixel; in the second subpixel, the light emitted from the second fluorescent luminescent material may be emitted through the light-transmissive electrode to the exterior, directly or having been reflected in multiple between the reflective electrode and the light-transmissive electrode in the second subpixel; in the third subpixel, the light emitted from the second fluorescent luminescent material may be emitted through the light-transmissive electrode to the exterior, directly or having been reflected in multiple between the reflective electrode and the light-transmissive electrode in the third subpixel; and in the fourth subpixel, the light emitted from the third luminescent material may be emitted through the light-transmissive electrode to the exterior, directly or having been reflected in multiple between the reflective electrode and the light-transmissive electrode in the fourth subpixel.

As a display device according to Aspect 3 of the disclosure, in Aspect 2, the light-emitting layers and the separation layer may, in each pixel, be layered in order of the third light-emitting layer, the separation layer, the second light-emitting layer, and the first light-emitting layer, from the anode electrode side; and at least one of the material contained in the first light-emitting layer having the highest combination ratio and the material contained in the second light-emitting layer having the highest combination ratio may be a hole transporting material.

As a display device according to Aspect 4 of the disclosure, in Aspect 2, the light-emitting layers and the separation layer may, in each pixel, be layered in order of the third light-emitting layer, the separation layer, the first light-emitting layer, and the second light-emitting layer, from the anode electrode side; and at least one of the material contained in the first light-emitting layer having the highest combination ratio and the material contained in the second light-emitting layer having the highest combination ratio may be a hole transporting material.

As a display device according to Aspect 5 of the disclosure, in Aspect 2, the light-emitting layers and the separation layer may, in each pixel, be layered in order of the first light-emitting layer, the second light-emitting layer, the separation layer, and the third light-emitting layer, from the anode electrode side; and at least one of the material contained in the first light-emitting layer having the highest combination ratio and the material contained in the second light-emitting layer having the highest combination ratio may be an electron transporting material.

As a display device according to Aspect 6 of the disclosure, in Aspect 2, the light-emitting layers and the separation layer may, in each pixel, be layered in order of the second light-emitting layer, the first light-emitting layer, the separation layer, and the third light-emitting layer, from the anode electrode side; and at least one of the material contained in the first light-emitting layer having the highest combination ratio and the material contained in the second light-emitting layer having the highest combination ratio may be an electron transporting material.

As a display device according to Aspect 7 of the disclosure, in any one of Aspects 1 to 6, in the second subpixel, a distance between the third light-emitting layer and the light-emitting layer adjacent to the third light-emitting layer in a layering direction may be greater than the Förster radius.

As a display device according to Aspect 8 of the disclosure, in Aspect 7, in the second subpixel, a distance between the third light-emitting layer and the light-emitting layer adjacent to the third light-emitting layer in the layering direction may be at least 15 nm.

As a display device according to Aspect 9 of the disclosure, in any one of Aspects 1 to 8, the separation layer may be a layer having a thickness exceeding the Förster radius.

As a display device according to Aspect 10 of the disclosure, in any one of Aspects 1 to 9, the separation layer may be provided in common for the second subpixel and the fourth subpixel.

As a display device according to Aspect 11 of the disclosure, in Aspect 10, the separation layer may contain a plurality of materials having different carrier transport properties.

As a display device according to Aspect 12 of the disclosure, in Aspect 10, the separation layer may be a layered body including a first separation layer (the first separation layer 35$a$) and a second separation layer (the second separation layer 35$b$); the first separation layer and the second separation layer may be bipolar transporting materials containing a hole transporting material and an electron transporting material at mutually-different combination ratios; and a total thickness of the first separation layer and the second separation layer may be greater than the Förster radius.

As a display device according to Aspect 13 of the disclosure, in any one of Aspects 1 to 9, the separation layer may be provided only in the second subpixel.

As a display device according to Aspect 14 of the disclosure, in any one of Aspects 1 to 13, part of a light emission spectrum of the first fluorescent luminescent material and part of an absorption spectrum of the second fluorescent luminescent material may overlap.

As a display device according to Aspect 15 of the disclosure, in any one of Aspects 1 to 14, there may be no overlap between an absorption spectrum of all materials contained in the separation layer, and the light emission spectrum of at least the fluorescent luminescent material in the light-emitting layer, of the first light-emitting layer and the second light-emitting layer, that is adjacent to the separation layer.

As a display device according to Aspect 16 of the disclosure, in any one of Aspects 1 to 15, the thickness of the first light-emitting layer may be less than or equal to 10 nm.

As a display device according to Aspect 17 of the disclosure, in any one of Aspects 1 to 16, the first fluorescent luminescent material may be a thermally activated delayed fluorescence material having an energy difference of less than or equal to 0.3 eV between a minimum excited singlet state and a minimum excited triplet state.

As a display device according to Aspect 18 of the disclosure, in any one of Aspects 1 to 17, the second fluorescent luminescent material may be a thermally activated delayed fluorescence material having an energy difference of less than or equal to 0.3 eV between a minimum excited singlet state and a minimum excited triplet state.

As a display device according to Aspect 19 of the disclosure, in any one of Aspects 1 to 18, the first subpixel may be a blue subpixel (the subpixel 3B); the second subpixel may be a first green subpixel (the subpixel 3G1); the third subpixel may be a second green subpixel (the subpixel 3G2); and the fourth subpixel may be a red subpixel (the subpixel 3R).

As a display device according to Aspect 20 of the disclosure, in Aspect 19, the display device may have a PenTile type pixel arrangement, in which the first green subpixel is adjacent to the blue subpixel in a row direction and is adjacent to the red subpixel in a column direction, the second green subpixel is adjacent to the red subpixel in the row direction and is adjacent to the blue subpixel in the column direction orthogonal to the row direction, and the blue subpixel is adjacent to the red subpixel and the first green subpixel is adjacent to the second green subpixel in an oblique direction intersecting with the row direction and the column direction.

As a display device according to Aspect 21 of the disclosure, in Aspect 19, the display device may have a S-Stripe pixel arrangement, in which the blue subpixel is adjacent to the first green subpixel and the red subpixel is adjacent to the second green subpixel in a row direction, and the blue subpixel is adjacent to the red subpixel and the first green subpixel is adjacent to the second green subpixel in a column direction orthogonal to the row direction.

As a display device according to Aspect 22 of the disclosure, in any one of Aspects 1 to 21, the second subpixel may include a blocking layer (the blocking layer 38) that does not contain a luminescent material and has a thickness less than or equal to the Förster radius; and in the second subpixel, the first light-emitting layer and the second light-emitting layer may be layered with the blocking layer interposed therebetween.

As a display device according to Aspect 23 of the disclosure, in Aspect 22, the thickness of the blocking layer may be less than or equal to 10 nm.

As a display device according to Aspect 24 of the disclosure, in Aspect 21 or 22, the blocking layer may be provided in common for at least the first subpixel and the second subpixel.

As a display device according to Aspect 25 of the disclosure, in Aspect 21 or 22, the blocking layer may be provided in common for at least the second subpixel and the third subpixel.

As a display device according to Aspect 26 of the disclosure, in Aspect 21 or 22, the blocking layer may be provided in common for all of the subpixels.

As a display device according to Aspect 27 of the disclosure, in any one of Aspects 1 to 26, the display device may be a top-emitting EL display device.

As a display device according to Aspect 28 of the disclosure, in any one of Aspects 1 to 26, the display device may be a bottom-emitting EL display device.

As a display device according to Aspect 29 of the disclosure, in any one of Aspects 1 to 28, the display device may be an organic EL display device.

A manufacturing method for a display device (e.g., the organic EL display device 1) according to Aspect 30 of the disclosure is a manufacturing method for a display device, the display device including: a plurality of pixels (the pixels 2), each including a first subpixel (e.g., the subpixel 3B), a second subpixel (e.g., the subpixel 3G1), a third subpixel (e.g., the subpixel 3G2), and a fourth subpixel (e.g., the subpixel 3R), wherein in the first subpixel, a first fluorescent luminescent material emits light, and the light emitted from the first fluorescent luminescent material is emitted to the exterior; in the second subpixel and the third subpixel, a second fluorescent luminescent material emits light, and the light emitted from the second fluorescent luminescent material is emitted to the exterior; in the fourth subpixel, a third luminescent material emits light, and the light emitted from the third luminescent material is emitted to the exterior; the first fluorescent luminescent material emits light having a first peak wavelength; the second fluorescent luminescent material emits light having a second peak wavelength longer than the first peak wavelength; and the third luminescent material emits light having a third peak wavelength longer than the second peak wavelength, the method including: a function layer formation step of forming a plurality of function layers (e.g., the hole injection layer 31, the hole transport layer 32, the blue fluorescent light-emitting layer 34B, the green fluorescent light-emitting layer 34G, the red light-emitting layer 34R, the separation layer 35, the blocking layer 38, the electron transport layer 36, and the electron injection layer 37) in each of the pixels, wherein the function layer formation step includes: a first light-emitting layer formation step of forming a first light-emitting layer containing the first fluorescent luminescent material (e.g., the blue fluorescent light-emitting layer 34B) in common for the first subpixel and the second subpixel; a second light-emitting layer formation step of forming a second light-emitting layer containing the second fluorescent luminescent material (e.g., the green fluorescent light-emitting layer 34G) in common for the second subpixel and the third subpixel; a third light-emitting layer formation step of forming a third light-emitting layer containing the third luminescent material (e.g., the red light-emitting layer 34R) in common for the second subpixel and the fourth subpixel; and a separation layer formation step of forming a separation layer (the separation layer 35) in the second subpixel so that in the second subpixel, the separation layer, which inhibits Förster-type energy transfer, is layered between the third light-emitting layer and the light-emitting layer, of the first light-emitting layer and the second light-emitting layer, that is located closer to the third light-emitting layer, and in the function layer formation step: the first light-emitting layer and the second light-emitting layer are formed so that in the second subpixel, a distance between opposing surfaces of the first light-emitting layer and the second light-emitting layer (e.g., the opposing surface distance $D_{BG}$) is less than or equal to the Förster radius; and a fluorescent luminescent material having an energy level in a minimum excited singlet state that is lower than an energy level of the first fluorescent luminescent material in a minimum excited singlet state and higher than an energy level of the third luminescent material in a minimum excited singlet state is used for the second fluorescent luminescent material.

As a manufacturing method for a display device according to Aspect 31 of the disclosure, in Aspect 30, the method may further include: an anode electrode formation step of forming an anode electrode (e.g., the first electrode 21); and a cathode electrode formation step of forming a cathode electrode (e.g., the second electrode 23), wherein one of the anode electrode and the cathode electrode may include a reflective electrode (e.g., the reflective electrode 21a), and the other may be a light-transmissive electrode.

As a manufacturing method for a display device according to Aspect 32 of the disclosure, in Aspect 31, the function layer formation step may be carried out after the anode electrode formation step and before the cathode electrode formation step; and in the function layer formation step, the third light-emitting layer formation step, the separation layer formation step, the second light-emitting layer formation step, and the first light-emitting layer formation step may be carried out in that order, and a hole transporting material may be used for at least one of the material contained in the first light-emitting layer having the highest combination ratio and the material contained in the second light-emitting layer having the highest combination ratio.

As a manufacturing method for a display device according to Aspect 33 of the disclosure, in Aspect 31, the function layer formation step may be carried out after the anode electrode formation step and before the cathode electrode formation step; and in the function layer formation step, the third light-emitting layer formation step, the separation layer formation step, the first light-emitting layer formation step, and the second light-emitting layer formation step may be carried out in that order, and a hole transporting material may be used for at least one of the material contained in the first light-emitting layer having the highest combination ratio and the material contained in the second light-emitting layer having the highest combination ratio.

As a manufacturing method for a display device according to Aspect 34 of the disclosure, in Aspect 31, the function layer formation step may be carried out after the anode electrode formation step and before the cathode electrode formation step; and in the function layer formation step, the first light-emitting layer formation step, the second light-emitting layer formation step, the separation layer formation step, and the third light-emitting layer formation step may be carried out in that order, and an electron transporting material may be used for at least one of the material contained in the first light-emitting layer having the highest combination ratio and the material contained in the second light-emitting layer having the highest combination ratio.

As a manufacturing method for a display device according to Aspect 35 of the disclosure, in Aspect 31, the function layer formation step may be carried out after the anode electrode formation step and before the cathode electrode formation step; and in the function layer formation step, the second light-emitting layer formation step, the first light-emitting layer formation step, the separation layer formation step, and the third light-emitting layer formation step may be carried out in that order, and an electron transporting material may be used for at least one of the material contained in the first light-emitting layer having the highest combination ratio and the material contained in the second light-emitting layer having the highest combination ratio.

As a manufacturing method for a display device according to Aspect 36 of the disclosure, in any one of Aspects 30 to 35, in the separation layer formation step, the separation layer may be formed so that the separation layer has a thickness exceeding the Förster radius.

As a manufacturing method for a display device according to Aspect 37 of the disclosure, in any one of Aspects 30 to 36, in the separation layer formation step, the separation layer may be formed in common for the second subpixel and the fourth subpixel.

As a manufacturing method for a display device according to Aspect 38 of the disclosure, in Aspect 37, in the separation layer formation step, the separation layer may be formed from a plurality of materials having different carrier transport properties.

As a manufacturing method for a display device according to Aspect 39 of the disclosure, in Aspect 37, the separation layer may be a layered body including a first separation layer (the first separation layer 35a) and a second separation layer (the second separation layer 35b); the separation layer formation step may include: a first separation layer formation step of forming the first separation layer; and a second separation layer formation step of forming the second separation layer, and in the first separation layer formation step and the second separation layer formation step, the first separation layer and the second separation layer may be formed using bipolar transporting materials containing a hole transporting material and an electron transporting material at mutually-different combination ratios, and a total thickness of the first separation layer and the second separation layer may be greater than the Förster radius.

As a manufacturing method for a display device according to Aspect 40 of the disclosure, in any of Aspects 30 to 36, wherein the intermediate layer formation step may include a separation layer formation step of forming a separation layer having a thickness exceeding the Förster radius as the function layer; and in the separation layer formation step, the separation layer may be formed selectively in the third subpixel.

As a manufacturing method for a display device according to Aspect 41 of the disclosure, in any of Aspects 30 to 40, in the first light-emitting layer formation step, the first light-emitting layer may be formed so that the thickness of the first light-emitting layer is less than or equal to 10 nm.

As a manufacturing method for a display device according to Aspect 42 of the disclosure, in any of Aspects 30 to 41, in the first light-emitting layer formation step, a thermally activated delayed fluorescence material having an energy difference of less than or equal to 0.3 eV between a minimum excited singlet state and a minimum excited triplet state may be used for the first fluorescent luminescent material.

As a manufacturing method for a display device according to Aspect 43 of the disclosure, in any of Aspects 30 to 42, in the second light-emitting layer formation step, a thermally activated delayed fluorescence material having an energy difference of less than or equal to 0.3 eV between a minimum excited singlet state and a minimum excited triplet state may be used for the second fluorescent luminescent material.

As a manufacturing method for a display device according to Aspect 44 of the disclosure, in any of Aspects 30 to 43, the function layer formation step may include a blocking layer formation step of forming, as the function layer, a blocking layer (the blocking layer 38) that does not contain a luminescent material and that has a thickness less than or equal to the Förster radius; and in the blocking layer formation step, the blocking layer may be formed so that in the second subpixel, the first light-emitting layer and the second light-emitting layer are layered with the blocking layer interposed therebetween.

As a manufacturing method for a display device according to Aspect 45 of the disclosure, in Aspect 44, in the blocking layer formation step, the blocking layer may be formed so that the thickness of the blocking layer is less than or equal to 10 nm.

As a manufacturing method for a display device according to Aspect 46 of the disclosure, in Aspect 44 or 45, in the blocking layer formation step, the blocking layer may be formed in common for at least the first subpixel and the second subpixel.

As a manufacturing method for a display device according to Aspect 47 of the disclosure, in Aspect 44 or 45, in the blocking layer formation step, the blocking layer may be formed in common for at least the second subpixel and the third subpixel.

As a manufacturing method for a display device according to Aspect 48 of the disclosure, in Aspect 44 or 45, wherein in the blocking layer formation step, the blocking layer may be formed in common for all of the subpixels.

As a manufacturing method for a display device according to Aspect 49 of the disclosure, in any one of Aspects 30 to 48, the first subpixel may be a blue subpixel; the second subpixel may be a first green subpixel; the third subpixel may be a second green subpixel; the fourth subpixel may be a red subpixel; a fluorescent luminescent material that emits blue light may be used for the first fluorescent luminescent material; a fluorescent luminescent material that emits green light may be used for the second fluorescent luminescent material; and a luminescent material that emits red light may be used for the third luminescent material.

The disclosure is not limited to the embodiments described above, and various modifications can be made within a scope not departing from the scope of the claims. Embodiments obtained by appropriately combining the technical approaches described in each of the different embodiments also fall within the technical scope of the disclosure. Moreover, novel technical features may be formed by combining the technical approaches disclosed in each of the embodiments.

REFERENCE SIGNS LIST

1 Organic EL display device (display device)
2 Pixel
3, 3B, 3G1, 3G2, 3R Subpixel
4, 4B, 4G1, 4G2, 4R Light emitting region
10 TFT substrate
11 Insulating substrate
12 TFT
13 Interlayer insulating film
13a Contact hole
14 Wiring line
15 Bank
15a Opening
20, 20B, 20G1, 20G2, 20R Organic EL element
21 First electrode (anode electrode)
21a Reflective electrode
21b Light-transmissive electrode
22 Organic EL layer
23 Second electrode (cathode electrode)
24 Protection layer
31 Hole injection layer (function layer)
32 Hole transport layer (function layer)
33 Light-emitting layer unit
34 Light-emitting layer (function layer)
34B Blue fluorescent light-emitting layer (function layer)
34G Green fluorescent light-emitting layer (function layer)
34R Red light-emitting layer (function layer)
35 Separation layer (function layer)
35a First separation layer (function layer)
35b Second separation layer (function layer)
36 Electron transport layer (function layer)
37 Electron injection layer (function layer)
38 Blocking layer (function layer)
40 Sealing substrate
70B, 70R, 70G Vapor deposition mask
71B, 71R, 71G Opening
$D_{BG}$, $D_{GR}$, $D_{BR}$ Opposing surface distance

The invention claimed is:
1. A display device comprising:
a plurality of pixels, each pixel including a first subpixel, a second subpixel, a third subpixel, and a fourth subpixel,
wherein a first light-emitting layer containing a first fluorescent luminescent material is provided in common for the first subpixel and the second subpixel, a second light-emitting layer containing a second fluorescent luminescent material is provided in common for the second subpixel and the third subpixel, and a third light-emitting layer containing a third luminescent material is provided in common for the second subpixel and the fourth subpixel;
an energy level of the second fluorescent luminescent material in a minimum excited singlet state is lower than an energy level of the first fluorescent luminescent material in a minimum excited singlet state and higher than an energy level of the third luminescent material in a minimum excited singlet state;
in the second subpixel, a distance between opposing surfaces of the first light-emitting layer and the second light-emitting layer is less than or equal to a Forster radius, and a separation layer that inhibits Forster-type energy transfer is layered between the third light-emitting layer and the light-emitting layer, of the first light-emitting layer and the second light-emitting layer, that is located closer to the third light-emitting layer;
in the first subpixel, the first fluorescent luminescent material emits light, and the light emitted from the first fluorescent luminescent material is emitted to the exterior;
in the second subpixel and the third subpixel, the second fluorescent luminescent material emits light, and the light emitted from the second fluorescent luminescent material is emitted to the exterior;
in the fourth subpixel, the third luminescent material emits light, and the light emitted from the third luminescent material is emitted to the exterior;
the first fluorescent luminescent material emits light having a first peak wavelength;
the second fluorescent luminescent material emits light having a second peak wavelength longer than the first peak wavelength; and
the third luminescent material emits light having a third peak wavelength longer than the second peak wavelength;
further comprising:
an anode electrode and a cathode electrode,
wherein one of the anode electrode and the cathode electrode includes a reflective electrode, and the other includes a light-transmissive electrode;
in each pixel, a plurality of function layers including the first light-emitting layer, the second light-emitting layer, the third light-emitting layer, and the separation layer are provided between the anode electrode and the cathode electrode;
in the first subpixel, the light emitted from the first fluorescent luminescent material is emitted through the light-transmissive electrode to the exterior, directly or having been reflected in multiple between the reflective electrode and the light-transmissive electrode in the first subpixel;
in the second subpixel, the light emitted from the second fluorescent luminescent material is emitted through the light-transmissive electrode to the exterior, directly or having been reflected in multiple between the reflective electrode and the light-transmissive electrode in the second subpixel;
in the third subpixel, the light emitted from the second fluorescent luminescent material is emitted through the light-transmissive electrode to the exterior, directly or having been reflected in multiple between the reflective electrode and the light-transmissive electrode in the third subpixel; and
in the fourth subpixel, the light emitted from the third luminescent material is emitted through the light-transmissive electrode to the exterior, directly or having been reflected in multiple between the reflective electrode and the light-transmissive electrode in the fourth subpixel.
2. The display device according to claim 1,
wherein in the second subpixel, a distance between the third light-emitting layer and the light-emitting layer adjacent to the third light-emitting layer in a layering direction is greater than the Forster radius.

3. The display device according to claim 1,
wherein the separation layer is provided in common for the second subpixel and the fourth subpixel.

4. The display device according to claim 3,
wherein the separation layer contains a plurality of materials having different carrier transport properties.

5. The display device according to claim 3,
wherein the separation layer is a layered body including a first separation layer and a second separation layer;
the first separation layer and the second separation layer are bipolar transporting materials containing a hole transporting material and an electron transporting material at mutually-different combination ratios; and
a total thickness of the first separation layer and the second separation layer is greater than the Forster radius.

6. The display device according to claim 1,
wherein the separation layer is provided only in the second subpixel.

7. The display device according to claim 1,
wherein part of a light emission spectrum of the first fluorescent luminescent material and part of an absorption spectrum of the second fluorescent luminescent material overlap.

8. The display device according to claim 1,
wherein there is no overlap between an absorption spectrum of all materials contained in the separation layer, and the light emission spectrum of at least the fluorescent luminescent material in the light-emitting layer, of the first light-emitting layer and the second light-emitting layer, that is adjacent to the separation layer.

9. The display device according to claim 1,
wherein the first fluorescent luminescent material is a thermally activated delayed fluorescence material having an energy difference of less than or equal to 0.3 eV between a minimum excited singlet state and a minimum excited triplet state.

10. The display device according to claim 1,
wherein the second fluorescent luminescent material is a thermally activated delayed fluorescence material having an energy difference of less than or equal to 0.3 eV between a minimum excited singlet state and a minimum excited triplet state.

11. The display device according to claim 1,
wherein the first subpixel is a blue subpixel, the second subpixel is a first green subpixel, the third subpixel is a second green subpixel, and the fourth subpixel is a red subpixel.

12. The display device according to claim 11,
wherein the display device has a S-Stripe pixel arrangement, in which the blue subpixel is adjacent to the first green subpixel and the red subpixel is adjacent to the second green subpixel in a row direction, and the blue subpixel is adjacent to the red subpixel and the first green subpixel is adjacent to the second green subpixel in a column direction orthogonal to the row direction.

13. The display device according to claim 11,
wherein the display device has a PenTile type pixel arrangement, in which the first green subpixel is adjacent to the blue subpixel in a row direction and is adjacent to the red subpixel in a column direction, the second green subpixel is adjacent to the red subpixel in the row direction and is adjacent to the blue subpixel in the column direction orthogonal to the row direction, and the blue subpixel is adjacent to the red subpixel and the first green subpixel is adjacent to the second green subpixel in an oblique direction intersecting with the row direction and the column direction.

14. The display device according to claim 1,
wherein the second subpixel includes a blocking layer that does not contain a luminescent material and has a thickness less than or equal to the Forster radius; and
in the second subpixel, the first light-emitting layer and the second light-emitting layer are layered with the blocking layer interposed therebetween.

* * * * *